(12) United States Patent
Shinkai

(10) Patent No.: US 11,587,877 B2
(45) Date of Patent: Feb. 21, 2023

(54) SEMICONDUCTOR DEVICE IN WHICH PEELING OFF OF SEALING RESIN FROM THE WIRE IS SUPPRESSED

(71) Applicant: Hiroyuki Shinkai, Kyoto (JP)

(72) Inventor: Hiroyuki Shinkai, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 0 days.

(21) Appl. No.: 17/065,733

(22) Filed: Oct. 8, 2020

(65) Prior Publication Data

US 2021/0111123 A1 Apr. 15, 2021

(30) Foreign Application Priority Data

Oct. 9, 2019 (JP) .............................. JP2019-185870

(51) Int. Cl.
  *H01L 23/538* (2006.01)
  *H01L 23/495* (2006.01)
  *H01L 23/31* (2006.01)

(52) U.S. Cl.
  CPC .......... *H01L 23/5384* (2013.01); *H01L 23/31* (2013.01); *H01L 23/49541* (2013.01); *H01L 23/5385* (2013.01); *H01L 23/5386* (2013.01)

(58) Field of Classification Search
  CPC .......... H01L 23/49541; H01L 23/5385; H01L 23/5386; H01L 23/5384
  USPC ......................................................... 257/676
  See application file for complete search history.

(56) References Cited

U.S. PATENT DOCUMENTS

2018/0197755 A1* 7/2018 Hsu ....................... H01L 21/568

* cited by examiner

*Primary Examiner* — Quoc D Hoang
(74) *Attorney, Agent, or Firm* — Chip Law Group

(57) ABSTRACT

A semiconductor device and a manufacturing method of the semiconductor device by which peeling off of a sealing resin and a wire from each other can be practically suppressed are disclosed. The semiconductor device includes a substrate, a main face wire, a semiconductor element that is conductive to the main face wire, a sealing resin having resin side faces directed in a direction crossing a thickness direction, the sealing resin sealing the main face wire and the semiconductor element, a through-wire that is conductive to the main face wire and having an exposed rear face exposed from the substrate, and a column conductor that is conductive to the main face wire and having an exposed side face exposed from the resin side faces. The column conductor is supported from the opposite sides thereof in the thickness direction by the substrate and the sealing resin.

18 Claims, 54 Drawing Sheets

SEMICONDUCTOR DEVICE IN WHICH PEELING OFF OF SEALING RESIN FROM THE WIRE IS SUPPRESSED

CROSS REFERENCE TO RELATED APPLICATIONS

This application claims priority benefit of Japanese Patent Application No. JP 2019-185870 filed in the Japan Patent Office on Oct. 9, 2019. Each of the above-referenced applications is hereby incorporated herein by reference in its entirety.

FIELD

The present disclosure relates to a semiconductor device and a manufacturing method of the semiconductor device.

BACKGROUND

Together with downsizing of electronic equipment in recent years, downsizing of semiconductor devices used in electronic equipment is in progress. Therefore, a semiconductor device of what is generally called a Fan-Out type has been proposed. The semiconductor device of the type mentioned above includes a semiconductor element having a plurality of electrodes, an insulating layer that covers a rear face of the semiconductor element on which the plurality of electrodes are formed, and a plurality of wires formed on the insulating layer such that they are electrically connected to the plurality of electrodes and positioned outside the semiconductor element. The proposed semiconductor device can achieve downsizing of a semiconductor device and can flexibly cope with a shape of a wiring pattern of a wiring board on which the semiconductor device is mounted.

Japanese Patent Laid-Open No. 2013-239740 discloses a semiconductor device as an example of such a Fan-Out type semiconductor device as described above. The semiconductor device includes a rectangular die pad, a plurality of leads arranged around the die pad, a semiconductor chip mounted on the die pad, and a sealing resin that seals the semiconductor chip. The plurality of leads are wires that electrically connect the semiconductor chip and the outside of the semiconductor device. In a manufacturing method of the semiconductor device, a semiconductor chip is mounted on each of a plurality of die pads in a lead frame on which the die pads and a plurality of leads arranged around each of the die pads are formed. Then, all of the semiconductor chips on the lead frame are collectively sealed with resin. Then, a dicing saw cuts the resin and the lead frame along dicing lines set in advance, to separate the leads from the lead frame and thereby obtain individual semiconductor devices. In such semiconductor devices, a lower face of the leads and a cut face of the leads cut by the dicing saw are exposed from the sealing resin.

SUMMARY

Incidentally, when a lead and a resin are cut by dicing, there is a possibility that the lead and the resin are peeled off from each other.

It is desirable to provide a semiconductor device and a manufacturing method of the semiconductor device by which peeling off of a sealing resin and a wire from each other can be practically suppressed.

According to a mode of the present disclosure, there is provided a semiconductor device including an insulating member having an electrical insulating property and having an insulating main face and an insulating rear face that are directed to the sides opposite to each other in a thickness direction, a main face wire having a wire main face and a wire rear face that are directed to the sides opposite to each other in the thickness direction and stacked on the insulating main face such that the wire rear face is opposed to the insulating main face, a semiconductor element that is conductive to the main face wire and arranged on the side opposite of the insulating member with respect to the main face wire in the thickness direction, a sealing resin having a resin side face directed in a direction crossing the thickness direction and sealing the main face wire and the semiconductor element, a through-wire that is conductive to the main face wire and extending in the thickness direction from the wire rear face, the through-wire having an exposed rear face that is exposed from the insulating rear face, and a column conductor that is conductive to the main face wire and extending to the side opposite to the through-wire in the thickness direction from the wire main face, the column conductor having an exposed side face that is exposed from the resin side face. In the semiconductor device, the column conductor is supported from the opposite sides thereof in the thickness direction by the insulating member and the sealing resin.

With the configuration described, since the column conductor exposed from the resin side face of the sealing resin is supported in the thickness direction by the insulating member and the sealing resin, in the case where the sealing resin and the column conductor are cut by dicing, the column conductor can be practically suppressed from being peeled off from the sealing resin.

According to another mode of the present disclosure, there is provided a semiconductor device including an insulating member having an electrical insulating property and having an insulating main face and an insulating rear face that are directed to the sides opposite to each other in a thickness direction, a main face wire having a wire main face and a wire rear face that are directed to the sides opposite to each other in the thickness direction and stacked on the insulating main face such that the wire rear face is opposed to the insulating main face, a semiconductor element that is conductive to the main face wire and arranged on the side opposite of the insulating member with respect to the main face wire in the thickness direction, a sealing resin having a resin side face directed in a direction crossing the thickness direction and sealing the main face wire and the semiconductor element, and a through-wire that is conductive to the main face wire and extending in the thickness direction from the wire rear face, the through-wire having an exposed rear face that is exposed from the insulating rear face. In the semiconductor device, the main face wire has a side face side protrusion extending to the resin side face side farther than the through-wire; the side face side protrusion has a wire end face exposed from the resin side face; and the main face wire is supported from the opposite sides thereof in the thickness direction by the insulating member and the sealing member.

With the configuration described, since the main face wire exposed from the resin side face of the sealing resin is supported in the thickness direction by the insulating member and the sealing resin, in the case where the sealing resin and the main face wire are cut by dicing, the main face wire can be practically suppressed from being peeled off from the sealing resin.

According to a further mode of the present disclosure, there is provided a manufacturing method of a semiconductor device, the manufacturing method including a through-wire formation step of forming a through-wire having a main face and a rear face directed to the sides opposite to each other in a thickness direction and side faces provided between the main face and the rear face in the thickness direction and directed to a direction crossing the thickness direction, an insulating member formation step of forming an insulating member so as to cover all of the side faces of the through-wire and expose the through-wire from both an insulating main face and an insulating rear face of the insulating member that are directed to the sides opposite to each other in the thickness direction, a main face wire formation step of forming, on the insulating main face, a main face wire so as to have a wire main face and a wire rear face that are directed to the sides opposite to each other in the thickness direction and have the wire rear face conduct with the through-wire, a conductor formation step of forming a column conductor on the wire main face so as to overlap with the insulating member as viewed from the thickness direction, an element mounting step of mounting a semiconductor element on the wire main face, a resin layer formation step of forming a resin layer that covers an overall area of the main face wire, the column electrode, and the semiconductor element, and a cutting step of cutting the resin layer and the column conductor in the thickness direction to form a sealing resin that covers the main face wire, the column conductor, and the semiconductor element and expose the column conductor from a resin side face of the sealing resin.

With the configuration described above, since the column conductor exposed from the resin side face of the sealing resin is supported in the thickness direction by the insulating member and the sealing resin, in the case where the sealing resin and the column conductor are cut by dicing, the column conductor can be practically suppressed from being peeled off from the sealing resin.

According to a still further mode of the present disclosure, there is provided a manufacturing method of a semiconductor device, the manufacturing method including a through-wire formation step of forming a through-wire having a main face and a rear face directed to the sides opposite to each other in a thickness direction and side faces provided between the main face and the rear face in the thickness direction and directed to a direction crossing the thickness direction, an insulating member formation step of forming an insulating member so as to cover all of the side faces of the through-wire and expose the through-wire from both an insulating main face and an insulating rear face of the insulating member that are directed to the sides to opposite each other in the thickness direction, a main face wire formation step of forming, on the insulating main face, a main face wire so as to have a wire main face and a wire rear face that are directed to the sides opposite to each other in the thickness direction and have the wire rear face conduct with the through-wire, an element mounting step of mounting a semiconductor element on the wire main face, a resin layer formation step of forming a resin layer that covers an overall area of each of the main face wire and the semiconductor element, and a cutting step of cutting the resin layer and the main face wire in the thickness direction to form a sealing resin that covers the main wire and the semiconductor element and expose the main face wire from a resin side face of the sealing resin.

With the configuration described, since the main face wire exposed from the resin side face of the sealing resin is supported in the thickness direction by the insulating member and the sealing resin, in the case where the sealing resin and the main face wire are cut by dicing, the main face wire can be practically suppressed from being peeled off from the sealing resin.

According to a yet further mode of the present disclosure, there is provided a manufacturing method of a semiconductor device, the manufacturing method including an insulating member formation step of forming an insulating member having an insulating main face and an insulating rear face that are directed to the sides opposite to each other in a thickness direction, a first internal electrode formation step of forming a through-wire exposed from the insulating rear face and a main face wire having a wire main face and a wire rear face directed to the sides opposite to each other in the thickness direction and stacked on the insulating main face so as to conduct with the through-wire on the wire rear face, a second internal electrode formation step of forming a column conductor stacked on the wire main face, an element mounting step of mounting a semiconductor element on the wire main face, a resin layer formation step of forming a resin layer that covers an overall area of each of the main face wire, the column conductor, and the semiconductor element, and a cutting step of cutting the resin layer and the column conductor in the thickness direction to form a sealing resin that covers the main face wire, the column conductor, and the semiconductor element and expose the column conductor from a resin side face of the sealing resin.

With the configuration described, since the column conductor exposed from the resin side face of the sealing resin is supported in the thickness direction by the insulating member and the sealing resin, in the case where the sealing resin and the column conductor are cut by dicing, the column conductor can be practically suppressed from being peeled off from the sealing resin.

According to an additional mode of the present disclosure, there is provided a manufacturing method of a semiconductor device, the manufacturing method including an insulating member formation step of forming an insulating member having an insulating main face and an insulating rear face that are directed to the sides opposite to each other in a thickness direction, an internal electrode formation step of forming a through-wire exposed from the insulating rear face and a main face wire having a wire main face and a wire rear face directed to the sides opposite to each other in the thickness direction and stacked on the insulating main face so as to conduct with the through-wire on the wire rear face, an element mounting step of mounting a semiconductor element on the wire main face, a resin layer formation step of forming a resin layer that covers an overall area of each of the main face wire and the semiconductor element, and a cutting step of cutting the resin layer and the main face wire in the thickness direction to form a sealing resin that covers the main face wire and the semiconductor element and expose the main face wire from a resin side face of the sealing resin.

With the configuration described above, since the main face wire exposed from the resin side face of the sealing resin is supported in the thickness direction by the insulating member and the sealing resin, in the case where the sealing resin and the main face wire are cut by dicing, the main face wire can be practically suppressed from being peeled off from the sealing resin.

The improved semiconductor devices and the manufacturing methods of the improved semiconductor device described in this specification can practically suppress peeling off of the sealing resin and the wire from each other.

DETAILED DESCRIPTION OF THE PREFERRED EMBODIMENTS

In the following description, embodiments of an improved semiconductor device and a manufacturing method of the improved semiconductor device are described with reference to the drawings. The embodiments described below exemplify a configuration and a method for embodying the technical idea, and the material, shape, structure, arrangement, dimension and so forth of components of them are not limited to those described herein. The embodiments described below can be changed in various manners. Further, the drawings are partially represented schematically for the convenience of illustration. Further, in the present disclosure, the expression "A and B overlap with each other as viewed from a certain direction" includes, unless otherwise specified, both a configuration in which the entirety of A overlaps with B and another configuration in which part of A overlaps with B.

First Embodiment (Configuration of Semiconductor Device)

The configuration of a semiconductor device 1A according to a first embodiment of the present disclosure is described with reference to FIGS. 1 to 8. It is to be noted that, for the convenience of understanding, in FIGS. 1 and 3, members that are internally provided in a substrate 10 and a sealing resin 40 hereinafter described are indicated by broken lines such that the positional relation of them can be recognized through the substrate 10 and the sealing resin 40.

Figure 1:
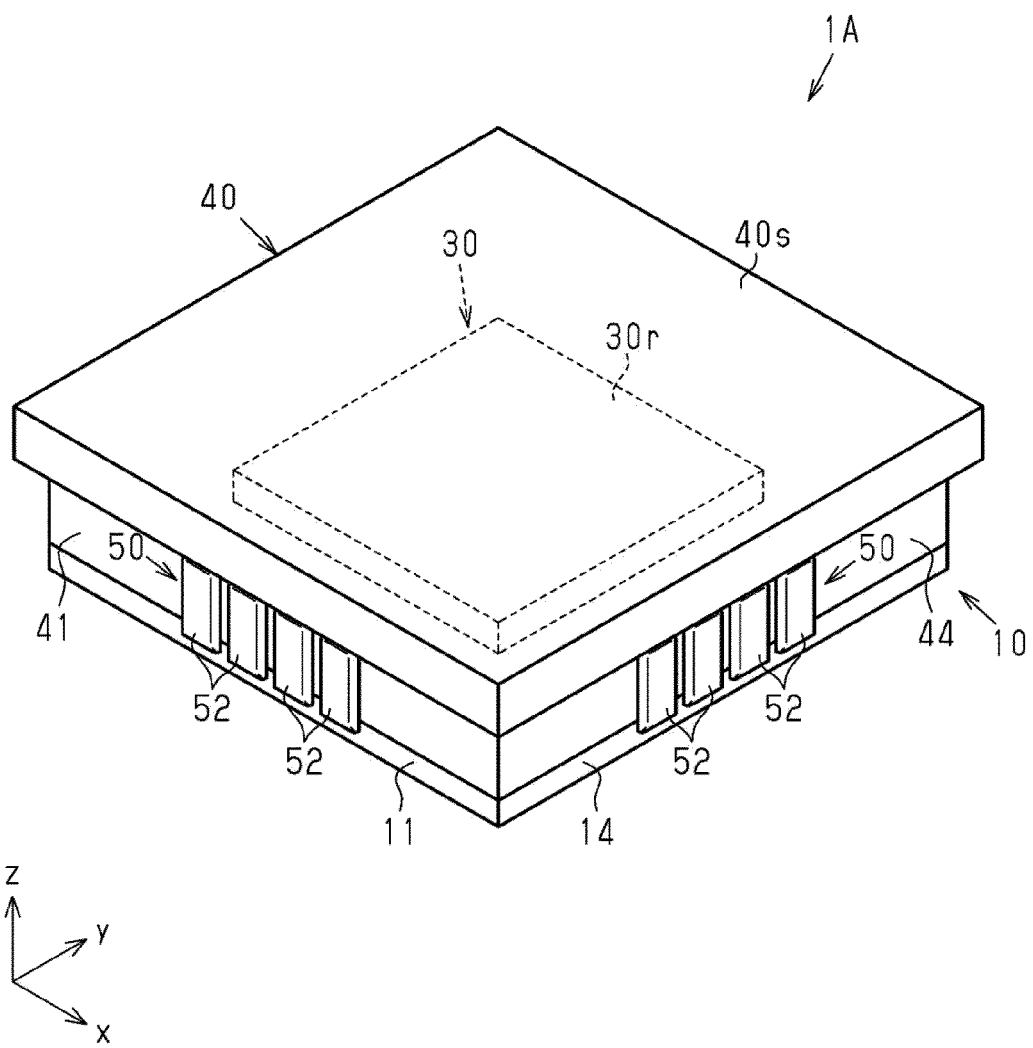
FIG. 1 is a perspective view of a semiconductor device of a first embodiment.
Figure 2:
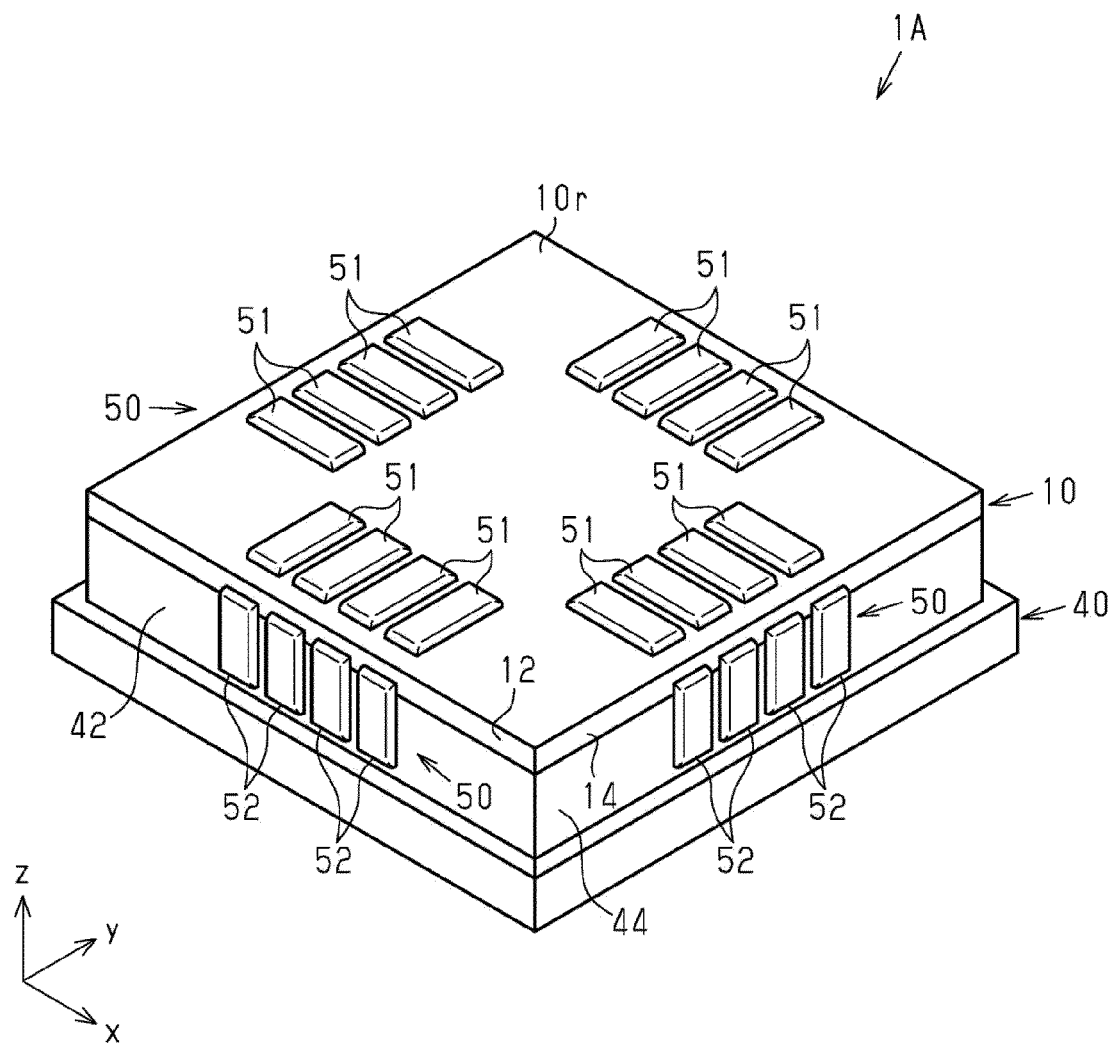
FIG. 2 is a perspective view of the semiconductor device of FIG. 1 as viewed from a different direction.
Figure 3:
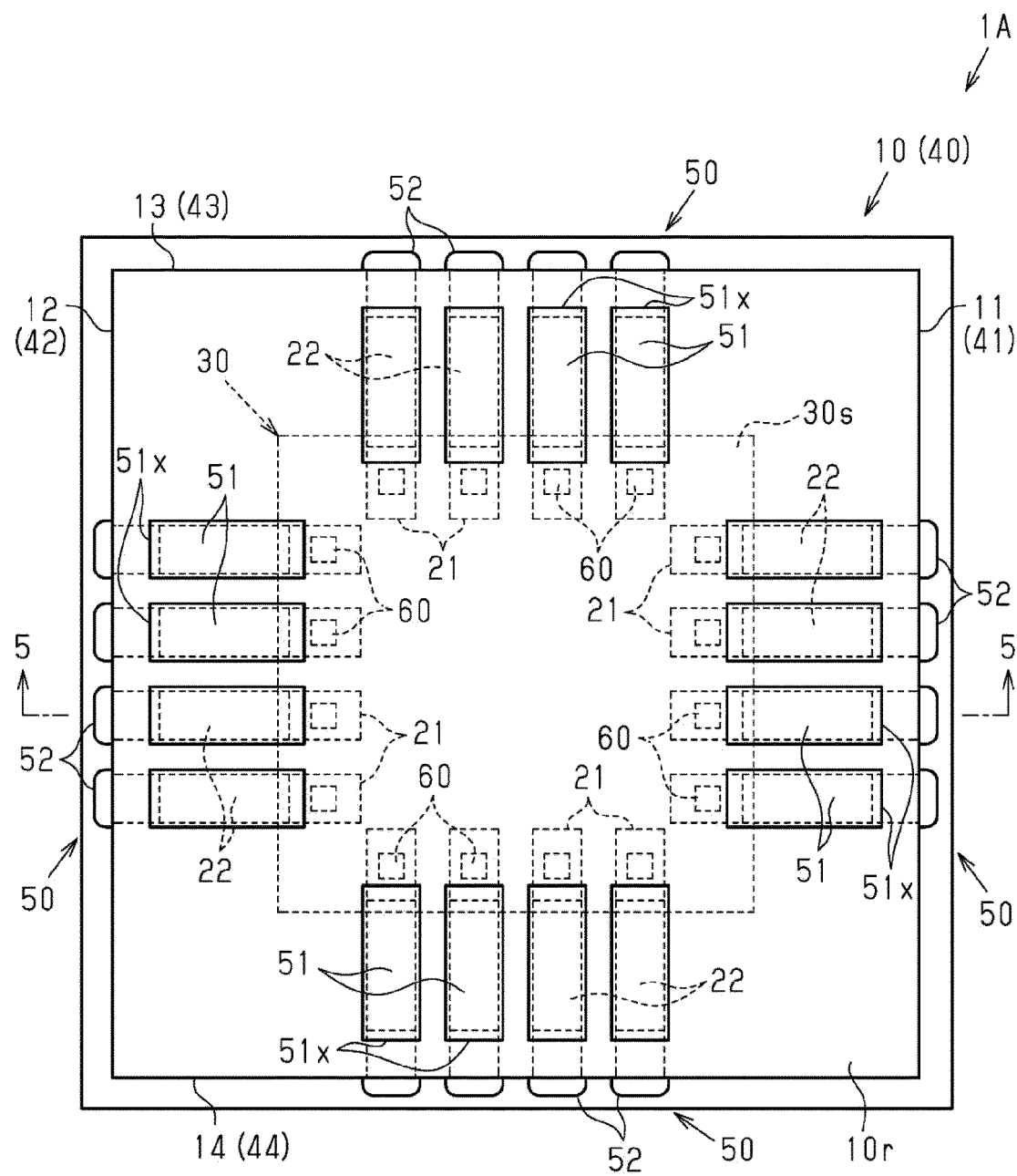
FIG. 3 is a bottom plan view of the semiconductor device of FIG. 1.

Referring first to FIGS. 1 to 3, the semiconductor device 1A includes the substrate 10 that is an example of an insulating member, an internal electrode 20, a semiconductor element 30, a sealing resin 40, and an external electrode 50. The semiconductor device 1A depicted in FIGS. 1 to 3 is a device mounted on the surface of a circuit board CB (refer to FIG. 8) of diverse electronic equipment. As depicted in FIG. 3, the semiconductor device 1A of the present embodiment is a Fan-Out type semiconductor device in which the internal electrode 20 is led out to the outer side than the semiconductor element 30 such that the external electrode 50 is positioned outside the semiconductor element 30.

Here, for the convenience of description, the thickness direction of the substrate 10 is referred to as a thickness direction z. Further, a direction along one side of the semiconductor device 1A extending orthogonally to the thickness direction z is referred to as a first direction x. Further, a direction orthogonal to both the thickness direction z and the first direction x of the substrate 10 is referred to as a second direction y.

As depicted in FIG. 3, the semiconductor device 1A has a substantially square shape as viewed from the thickness direction z. It is to be noted that the shape of the semiconductor device 1A as viewed from the thickness direction z is not limited to a square shape and can be changed optionally. In an example, the shape of the semiconductor device 1A as viewed from the thickness direction z may be a rectangular shape in which one of the first direction x and the second direction y is a long-side direction and the other of them is a short-side direction.

The substrate 10 is a support member that carries the semiconductor element 30 and serves as a base for the semiconductor device 1A. As depicted in FIG. 3, in the present embodiment, the substrate 10 as viewed from the thickness direction z has a substantially square shape. It is to be noted that the shape of the substrate 10 as viewed from the thickness direction z is not limited to a square shape and can be changed optionally. In an example, the shape of the substrate 10 as viewed from the thickness direction z may be a rectangular shape in which one of the first direction x and the second direction y is a long-side direction and the other of them is a short-side direction.

Figure 4:
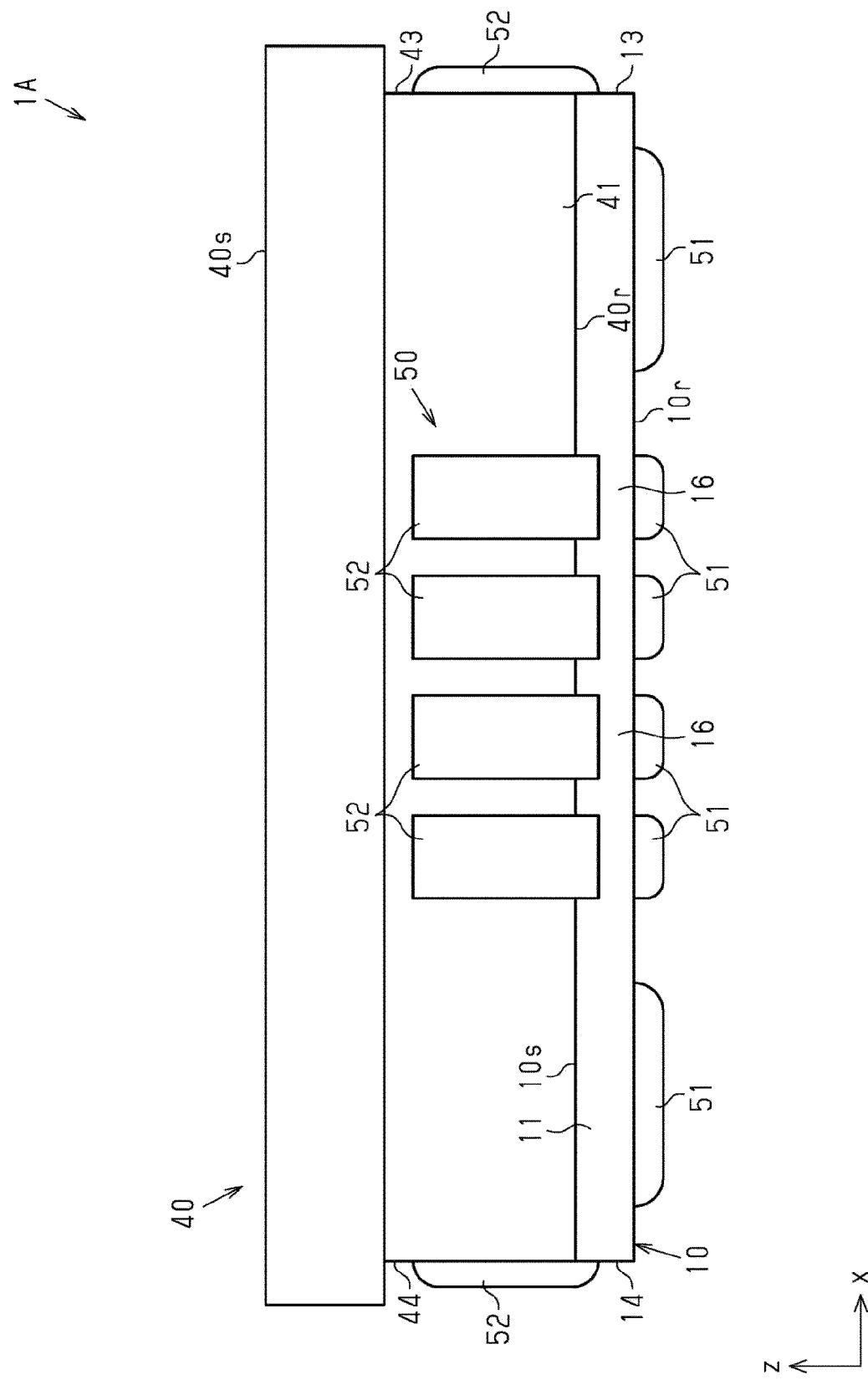
FIG. 4 is a side elevational view of the semiconductor device of FIG. 1.

The substrate 10 has a substrate main face 10s that is an example of an insulating main face, a substrate rear face 10r that is an example of an insulating rear face, and a plurality of (in the present embodiment, four) substrate side faces 11 to 14 that are an example of insulating side faces. As depicted in FIG. 4, the substrate main face 10s and the substrate rear face 10r are directed to the sides opposite to each other in the thickness direction z. The substrate main face 10s is flat, and the substrate rear face 10r is flat. The substrate side faces 11 to 14 are sandwiched between the substrate main face 10s and the substrate rear face 10r in the thickness direction z. In the present embodiment, the substrate side faces 11 to 14 are each flat. As depicted in FIGS. 3 and 4, the substrate side faces 11 to 14 each cross, in the present embodiment, orthogonally, the substrate main face 10s and the substrate rear face 10r. The substrate side faces 11 and 12 are faces extending along the first direction x, and the substrate side faces 13 and 14 are faces extending along the second direction y. The substrate side face 11 and the substrate side face 12 are arranged in a spaced relation from each other in the first direction x and are directed to the sides opposite to each other in the first direction x. The substrate side face 13 and the substrate side face 14 are arranged in a spaced relation from each other in the second direction y and are directed to the sides opposite to each other in the second direction y. It is to be noted that, in the following description, the direction from the substrate rear face 10r toward the substrate main face 10s in the thickness direction z is referred to as "upper" and the direction from the substrate main face 10s toward the substrate rear face 10r is referred to as "lower" for the convenience of description. Accordingly, the substrate main face 10s can also be regarded as an upper face of the substrate 10, and the substrate rear face 10r can also be regarded as a lower face of the substrate 10.

The substrate 10 is made of a material, for example, having an electrical insulating property. For the material, for example, a synthetic resin containing an epoxy resin or the like as a main ingredient, ceramics, glass and so forth can be used. In the present embodiment, for the substrate 10, a synthetic resin containing epoxy resin as a main ingredient is used. The substrate 10 has a plurality of through-holes 15 extending therethrough from the substrate main face 10s to the substrate rear face 10r in the thickness direction z. Four such through-holes 15 are provided for each side of the substrate 10. The shape of each through-hole 15 as viewed from the thickness direction z is, for example, a rectangular shape. In the present embodiment, the shape of the through-hole 15 as viewed from the thickness direction z is a rectangular shape in which one of the first direction x and the second direction y is the long-side direction and the other of the first direction x and the second direction y is the short-side direction. It is to be noted that the shape of the through-hole 15 as viewed from the thickness direction z may be a circular shape, an elliptical shape, or a polygonal shape.

The sealing resin 40 overlaps with the substrate 10 as viewed from the thickness direction z. The sealing resin 40 is formed on the substrate 10. The sealing resin 40 seals the internal electrode 20 and the semiconductor element 30.

As depicted in FIGS. 1 to 4, the sealing resin 40 has a resin main face 40s, a resin rear face 40r, and a plurality of (in the present embodiment, four) resin side faces 41 to 44. The resin main face 40s and the resin rear face 40r are directed to the sides opposite to each other in the thickness direction z. The resin main face 40s is flat, and the resin rear face 40r is flat. The resin side faces 41 to 44 are sandwiched between the resin main face 40s and the resin rear face 40r in the thickness direction z. In the present embodiment, the resin side faces 41 to 44 are each flat. The resin side faces 41 to 44 each cross, in the present embodiment, orthogonally, the resin main face 40s and the resin rear face 40r. The resin side faces 41 and 42 are faces extending along the first direction x, and the resin side faces 43 and 44 are faces extending along the second direction y. The resin side face 41 and the resin side face 42 are arranged spaced from each other in the first direction x and besides are directed to the sides opposite to each other in the first direction x. The resin side face 43 and the resin side face 44 are arranged spaced from each other in the second direction y and besides are directed to the sides opposite to each other in the second direction y. In the present embodiment, the resin side face 41 and the substrate side face 11 are flush with each other; the resin side face 42 and the substrate side face 12 are flush with each other; the resin side face 43 and the substrate side face 13 are flush with each other; and the resin side face 44 and the substrate side face 14 are flush with each other.

The sealing resin 40 has an inwardly depressed stepped portion 47 on the resin side faces 41 to 44. The stepped portion 47 partitions the sealing resin 40 into a first resin portion 48 and a second resin portion 49. The first resin portion 48 is a portion of the sealing resin 40 ranging from the stepped portion 47 to the resin main face 40s, and the second resin portion 49 is a portion of the sealing resin 40 ranging from the stepped portion 47 to the resin rear face 40r. The second resin portion 49 is a portion depressed to the inner side from the first resin portion 48.

The sealing resin 40 is made of a resin, for example, having an electrical insulating property. For this resin, for example, a synthetic resin containing epoxy resin as a main ingredient can be used. In the present embodiment, the material configuring the substrate 10 is the same as the material configuring the sealing resin 40. Further, the sealing resin 40 is colored, for example, in black. The sealing resin 40 is formed on the substrate main face 10s by molding such that it covers the substrate main face 10s of the substrate 10. Therefore, the resin rear face 40r is in contact with the substrate main face 10s. More particularly, the resin rear face 40r and the substrate main face 10s contact closely with each other in a melted state. In this manner, the resin rear face 40r and the substrate main face 10s form an interface between the substrate 10 and the sealing resin 40.

Figure 5:
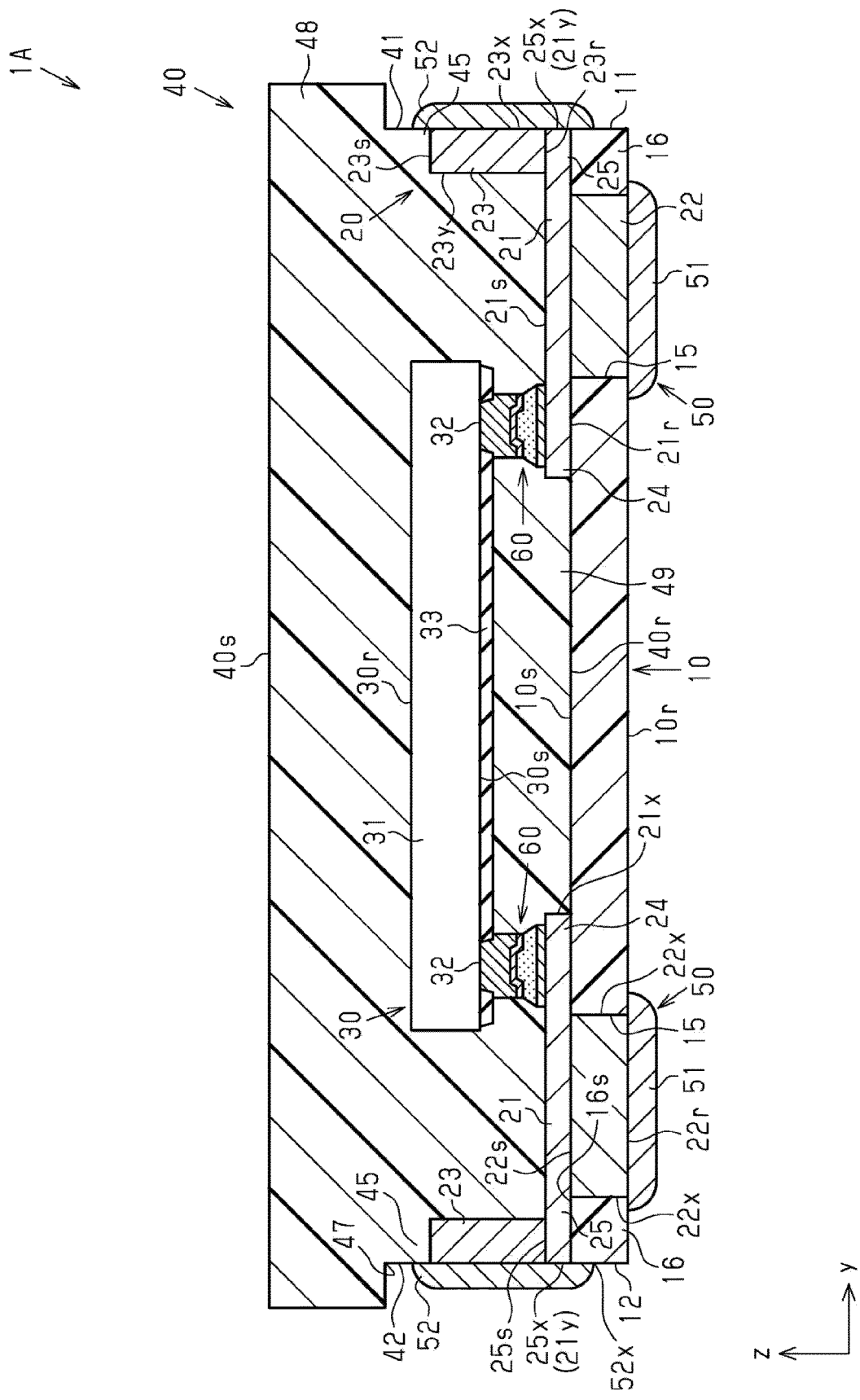
FIG. 5 is a sectional view taken along line 5-5 of FIG. 3.

As depicted in FIGS. 3 and 5, the internal electrode 20 includes a plurality of main face wires 21, a plurality of through-wires 22, and a plurality of column conductors 23.

The through-wires 22 are individually arranged in the through-holes 15. In the present embodiment, the through-wires 22 are provided as members separate from the main face wires 21. The shape of each of the through-wires 22 as viewed from the thickness direction z is determined according to the shape of each of the through-holes 15 as viewed from the thickness direction z. In the present embodiment, the shape of the through-wire 22 as viewed from the thickness direction z is a rectangular shape. Each through-wire 22 has an upper face 22s that is an example of a main surface, a lower face 22r that is an example of a rear face, and a plurality of side faces 22x. The upper face 22s and the lower face 22r are directed to the sides opposite to each other in the thickness direction z. The side faces 22x are provided between the upper face 22s and the lower face 22r. The side faces 22x are faces directed in directions crossing the thickness direction z. In the present embodiment, the side faces 22x are faces directed in directions orthogonal to the thickness direction z. More particularly, each through-wire 22 has four side faces 22x. Two side faces 22x among the four side faces 22x are arranged spaced from each other in the first direction x and are directed to the sides opposite to each other in the first direction x. The remaining two side faces 22x are arranged spaced from each other in the second direction y and are directed to the sides opposite to each other in the second direction y. In the present embodiment, the upper face 22s of the through-wire 22 is flush with the substrate main face 10s of the substrate 10. Further, in the present embodiment, the lower face 22r of the through-wire 22 is flush with the substrate rear face 10r of the substrate 10. The lower face 22r is an exposed rear face that is exposed from the substrate rear face 10r of the substrate 10. It is to be noted that at least one of the upper face 22s and the lower face 22r of the through-wire 22 may not be flush with any of the substrate main face 10s and the substrate rear face 10r of the substrate 10. Further, the side faces 22x of the through-wire 22 are in contact with inner wall faces of the through-hole 15. The through-wires 22 are made of a material having electrical conductivity. As the material of the through-wires 22, for example, copper (Cu), a Cu alloy and so forth can be used. In the present embodiment, the through-wire 22 includes a plating layer.

The through-wires 22 are arranged on the inner side of the substrate 10 than the substrate side faces 11 to 14. In particular, a substrate outer peripheral portion 16 that is part of the substrate 10 intervenes between the four through-wires 22, which are arrayed spaced from each other in the second direction y in the proximity of the substrate side face 11, and the substrate side face 11 in the first direction x, and another substrate outer peripheral portion 16 that is part of the substrate 10 intervenes between the four through-wires 22, which are arrayed spaced from each other in the second direction y in the proximity of the substrate side face 12, and the substrate side face 12 in the first direction x. Further, a further substrate outer peripheral portion 16 that is part of the substrate 10 intervenes between the four through-wires 22, which are arrayed spaced from each other in the first direction x in the proximity of the substrate side face 13, and the substrate side face 13 in the second direction y, and a still further substrate outer peripheral portion 16 that is part of the substrate 10 intervenes between the four through-wires 22, which are arrayed spaced from each other in the first direction x in the proximity of the substrate side face 14, and the substrate side face 14 in the second direction y.

The main face wires 21 are formed on the substrate main face 10s of the substrate 10. It can also be regarded that the main face wires 21 are provided at the second resin portion 49 of the sealing resin 40. The main face wires 21 are made of a material having electric conductivity and are electrically connected to the through-wires 22. Each of the main face wires 21 has an upper face 21s that is an example of a wire main face, a lower face 21r that is an example of a wire rear face, and side faces 21x. The upper face 21s of the main face wire 21 is directed in a direction same as that of the substrate main face 10s of the substrate 10. The lower face 21r of the main face wire 21 is directed in a direction same as that of the substrate rear face 10r of the substrate 10 and is opposed to the substrate main face 10s. The side faces 21x of the main face wire 21 are directed in directions same as those of the substrate side faces 11 to 14 of the substrate 10. Further, the side faces 21x of the main face wire 21 cross the upper face 21s and the lower face 21r of the main face wire 21.

As depicted in FIG. 5, the main face wires 21 arrayed spaced from each other in the first direction x extend longer in the second direction y than the through-wires 22 connected to the main face wires 21. In the present embodiment, the four main face wires 21 arrayed spaced from each other in the first direction x in the proximity of the resin side face 41 of the sealing resin 40 and the four main face wires 21 arrayed spaced from each other in the first direction x in the proximity of the resin side face 42 each extend longer than the through-wires 22 connected to the main face wires 21 in the second direction y. More particularly, each main face wire 21 has an inner side extension 24 extending longer toward the inner side than the through-wire 22 connected to the main face wire 21, in the second direction y, and an outer side extension 25 that is an example of a side face side protrusion extending toward the outer side farther than the through-wire 22 connected to the main face wire 21 in the second direction y. The inner side extension 24 overlaps with the semiconductor element 30 in the thickness direction z. The outer side extension 25 is formed on the substrate outer peripheral portion 16 of the substrate 10. In particular, the outer side extension 25 is in contact with an upper face 16s of the substrate outer peripheral portion 16 (upper face 10s of the substrate 10). Of the outer side extension 25, end faces 25x on the resin side faces 41 and 42 side of the sealing resin 40 (namely, end faces 21y of the main face wires 21) are exposed side faces exposed from the resin side faces 41 and 42. Here, each of the end faces 25x of the outer side extensions 25 (the end faces 21y of the main face wires 21) is an example of a wire end face of the main face wire 21.

Further, though not depicted, the main face wires 21 arrayed spaced from each other in the second direction y extend longer than the through-wires 22 connected to the main face wires 21 in the first direction x. In the present embodiment, the four main face wires 21 arrayed spaced from each other in the second direction y in the proximity of the resin side face 43 of the sealing resin 40 and the four main face wires 21 arrayed spaced from each other in the second direction y in the proximity of the resin side face 44 each extend longer than the through-wires 22 connected to the main face wires 21 in the first direction x. More particularly, each main face wire 21 has an inner side extension 24 extending longer toward the inner side than the through-wire 22 connected to the main face wire 21, in the first direction x, and an outer side extension 25 that extends toward the outer side farther than the through-wire 22 connected to the main face wire 21 in the first direction x. The inner side extension 24 overlaps with the semiconductor element 30 in the thickness direction z. Of the outer side extension 25, the end faces 25x on the resin side faces 43 and 44 side of the sealing resin 40 are exposed side faces exposed from the resin side faces 43 and 44. In this manner, the main face wires 21 are provided such that they protrude to the opposite sides of the through-wires 22 connected to the main face wires 21, in the directions in which the main face wires 21 extend.

Figure 6:
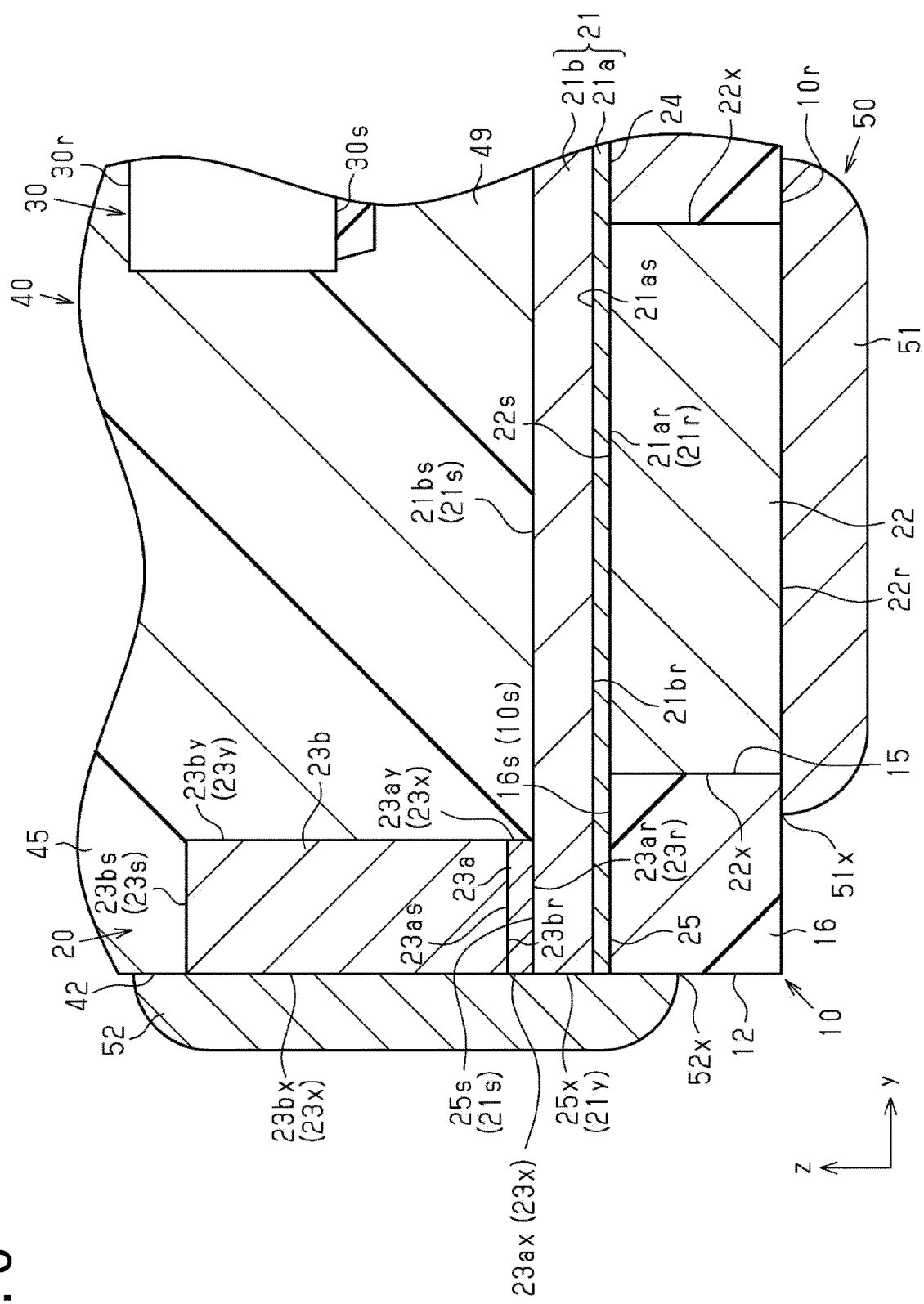
FIG. 6 is an enlarged view of a through-wire of FIG. 5 and peripheral portions of the same.
Figure 7:
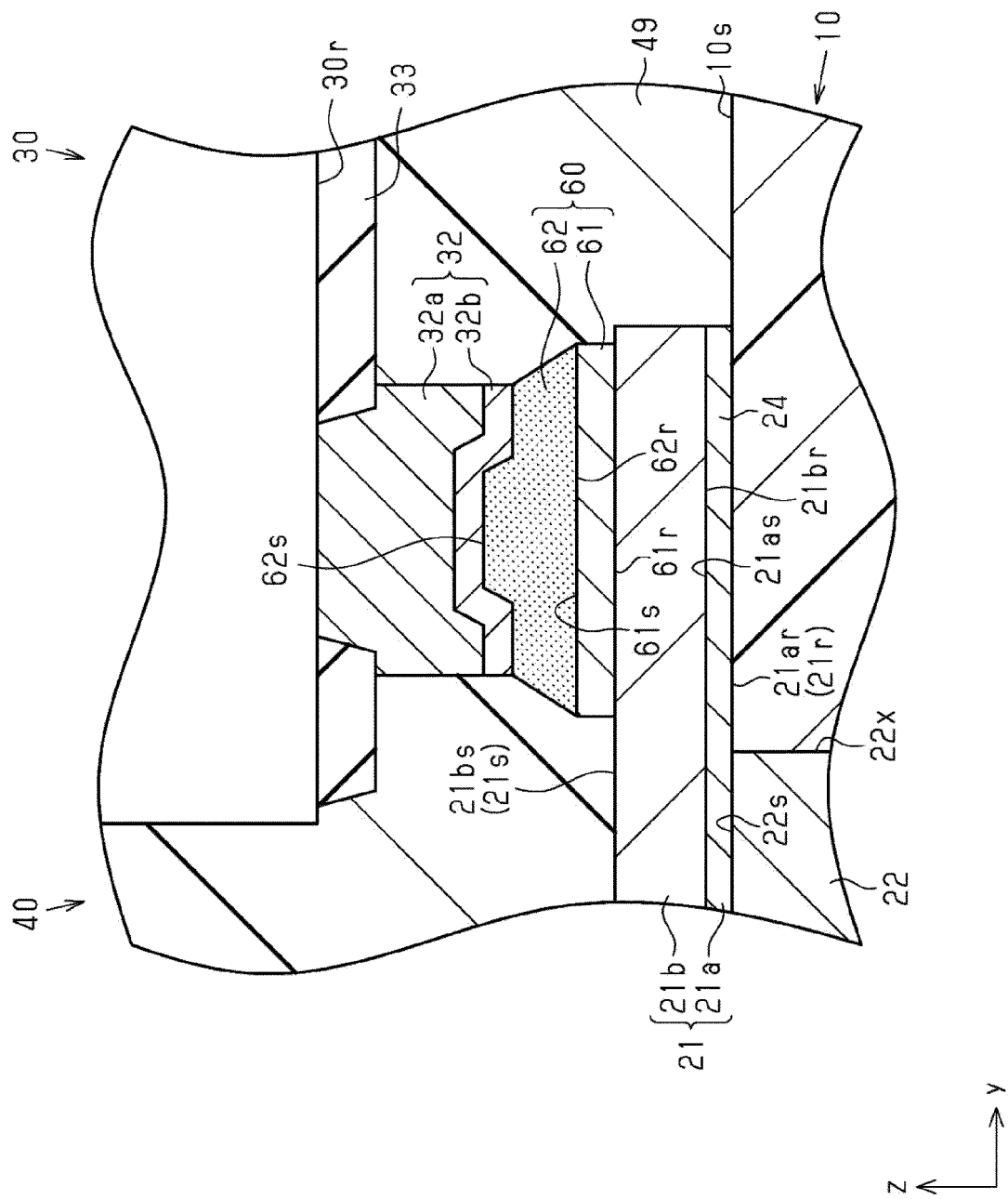
FIG. 7 is an enlarged view of a bonding portion of FIG. 5 and peripheral portions of the same.

As depicted in FIGS. 6 and 7, each main face wire 21 includes a metal layer 21a and a conductive layer 21b. The metal layer 21a and the conductive layer 21b are stacked in this order on the substrate main face 10s of the substrate 10.

The metal layer 21a is formed, for example, from a titanium (Ti) layer in contact with the substrate main face 10s of the substrate 10 and the upper face 22s of the through-wire 22 and a Cu layer in contact with the Ti layer. The metal layer 21a is formed as a seed layer for forming the conductive layer 21b. The main face wire 21 has an upper face 21as and a lower face 21ar directed to the sides opposite to each other in the thickness direction z. The lower face 21ar configures the lower face 21r of the main face wire 21.

The conductive layer 21b is formed on the upper face 21as of the metal layer 21a. The conductive layer 21b is made of Cu or a Cu alloy. The conductive layer 21b has an upper face 21bs and a lower face 21br directed to the sides opposite to each other in the thickness direction z. In the present embodiment, the lower face 21br of the conductive layer 21b is in contact with the upper face 21as of the metal layer 21a. The upper face 21bs of the conductive layer 21b is covered with the second resin portion 49 of the sealing resin 40. The upper face 21bs of the conductive layer 21b configures the upper face 21s of the main face wire 21.

As depicted in FIG. 5, each column conductor 23 protrudes from the upper face 21s of the main face wire 21 in the thickness direction z. More particularly, each column conductor 23 protrudes to the side opposite to the through-wire 22 in the thickness direction z from an upper face 25s (upper face 21s) of the outer side extension 25 of the main face wire 21. Each column conductor 23 has a rectangular shape as viewed from the thickness direction z. In other words, each column conductor 23 is preferably a prism. It is to be noted that the shape of each column conductor 23 is not limited to this and may be, for example, a cylindrical column, a polygonal prism or another shape. Each column conductor 23 has a dimension in the thickness direction z greater than the dimension of the main face wire 21 in the thickness direction z. Further, each column conductor 23 has an upper face 23s, a lower face 23r, an exposed side face 23x, and a resin contact side face 23y.

The lower face 23r of each column conductor 23 is a face in contact with the upper face 25s (upper face 21s) of the outer side extension 25. The lower face 23r is flat. The upper face 23s of the column conductor 23 is a face directed to the side opposite to the lower face 23r in the thickness direction z and is covered with the sealing resin 40. In the present embodiment, the upper face 23s of each column conductor 23 is flat. Further, in the present embodiment, the upper face 23s of each column conductor 23 is positioned on the resin rear face 40r side with respect to the stepped portion 47 of the sealing resin 40. Therefore, it can be regarded that the column conductors 23 are provided on the second resin portion 49 of the sealing resin 40. It is to be noted that the shape of the upper face 23s can be changed optionally. Further, the position of the upper face 23s in the thickness direction z (in other words, the length of the column conductor 23 in the thickness direction z) can be changed optionally. In an example, the upper face 23s may be positioned at a position same as that of the stepped portion 47 in the thickness direction z or at a position on the resin main face 40s side with respect to the stepped portion 47.

The exposed side face 23x and the resin contact side face 23y are formed between the upper face 23s and the lower face 23r in the thickness direction z and are directed in a direction crossing the upper face 23s and the lower face 23r.

The exposed side face 23x is a face of each column conductor 23 exposed from one of the resin side faces 41 to 44 of the sealing resin 40. In particular, each of the exposed side faces 23x of the four column conductors 23 provided neighboring with the resin side face 41 in the first direction x is exposed from and flush with the resin side face 41. Each of the exposed side faces 23x of the four column conductors 23 provided neighboring with the resin side face 42 in the first direction x is exposed from and flush with the resin side face 42. Each of the exposed side faces 23x of the four column conductors 23 provided neighboring with the resin side face 43 in the second direction y is exposed from and flush with the resin side face 43. Each of the exposed side faces 23x of the four column conductors 23 provided neighboring with the resin side face 44 in the second direction y is exposed from and flush with the resin side face 44. Further, each of the exposed side faces 23x is flush with the end face 25x of the outer side extension 25 of the main face wire 21. Further, the exposed side faces 23x are exposed from portions of the resin side faces 41 to 44 each corresponding to the second resin portions 49. In other words, the exposed side faces 23x are positioned on the inner side of the portions of the resin side faces 41 to 44 each corresponding to the first resin portions 48.

The resin contact side face 23y is a side face other than the exposed side face 23x among the side faces of each column conductor 23 and is in contact with the sealing resin 40. In other words, the resin contact side face 23y is covered with the sealing resin 40. In the present embodiment, the resin contact side face 23y is covered with the second resin portion 49 of the sealing resin 40.

As depicted in FIG. 5, the upper face 23s of the column conductor 23 in the thickness direction z is covered with the sealing resin 40. In other words, the sealing resin 40 has a conductor cover portion 45 that covers the upper face 23s of the column conductor 23. In the present embodiment, the conductor cover portion 45 includes a first resin portion 48 of the sealing resin 40 and a portion of the second resin portion 49 on the resin main face 40s side with respect to the upper face 23s of the column conductor 23. The conductor cover portion 45 is a portion that supports the column conductor 23 when force toward the resin main face 40s side in the thickness direction z is applied to the column conductor 23.

The substrate 10 and the sealing resin 40 are positioned on the opposite sides of the column conductor 23 in the thickness direction z. More particularly, since the upper face 23s of the column conductor 23 is covered with the sealing resin 40, the sealing resin 40 is positioned on one side of the column conductor 23 in the thickness direction z. Since a lower face 25r (lower face 21r) of the outer side extension 25 of the main face wire 21 with which the lower face 23r of the column conductor 23 is in contact is covered with the substrate 10, the substrate 10 is positioned on the other side of the column conductor 23 in the thickness direction z. In this manner, the column conductor 23 and the main face wire 21 are sandwiched by the substrate 10 and the sealing resin 40 in the thickness direction z. In other words, the column conductor 23 and the main face wire 21 are sandwiched by the conductor cover portion 45 and the substrate outer peripheral portion 16 in the thickness direction z. Therefore, it can also be regarded that the column conductor 23 is supported by the substrate 10 and the sealing resin 40 in the thickness direction z.

As depicted in FIG. 6, each column conductor 23 includes a seed layer 23a and a plating layer 23b stacked one on another. The seed layer 23a includes a first layer that contains Ti as a main ingredient and that is in contact with the upper face 21bs of the conductive layer 21b (upper face 21s of the main face wire 21), and a second layer that contains Cu as a main ingredient and that is in contact with the first layer. The thickness of the seed layer 23a (dimension of the seed layer 23a in the thickness direction z) is approximately 200 to 800 nm. The main ingredient of the plating layer 23b is preferably Cu. The thickness of the plating layer 23b (dimension of the plating layer 23b in the thickness direction z) is approximately 50 to 100 μm.

The seed layer 23a has an upper face 23as and a lower face 23ar directed to the sides opposite to each other in the thickness direction z, and an exposed side face 23ax and a resin contact side face 23ay provided between the upper face 23as and the lower face 23ar in the thickness direction z and directed in directions crossing the upper face 23as and the lower face 23ar. In the present embodiment, the exposed side face 23ax and the resin contact side face 23ay are each directed in directions orthogonal to those of the upper face 23as and the lower face 23ar. The exposed side face 23ax configures part of the exposed side face 23x of the column conductor 23, and the resin contact side face 23ay configures part of the resin contact side face 23y of the column conductor 23. The lower face 23ar of the seed layer 23a configures the lower face 23r of the column conductor 23.

The plating layer 23b has an upper face 23bs and a lower face 23br directed to the opposite sides in the thickness direction z, and an exposed side face 23bx and a resin contact side face 23by provided between the upper face 23bs and the lower face 23br in the thickness direction z and directed in directions crossing the upper face 23bs and the lower face 23br. In the present embodiment, the exposed side face 23bx and the resin contact side face 23by are each directed in directions orthogonal to the upper face 23bs and the lower face 23br. The exposed side face 23bx configures part of the exposed side face 23x of the column conductor 23, and the resin contact side face 23by configures part of the exposed side face 23y of the column conductor 23. The upper face 23bs of the plating layer 23b configures the upper face 23s of the column conductor 23. In particular, the upper face 23bs of the plating layer 23b is contact with the conductor cover portion 45 of the sealing resin 40.

As depicted in FIG. 3, the semiconductor element 30 is substantially square as viewed from the thickness direction z. As depicted in FIG. 5, the semiconductor element 30 has an element main face 30s and an element rear face 30r directed to the sides opposite to each other in the thickness direction z. The element main face 30s is a face on which a constituent member for a function of the semiconductor element 30 is formed. The element main face 30s is directed in a direction same as that of the substrate rear face 10r of the substrate 10. The element rear face 30r is directed in a direction same as that of the substrate main face 10s of the substrate 10.

The semiconductor element 30 is an integrated circuit (IC) such as large scale integration (LSI), for example. The semiconductor element 30 may otherwise be a voltage controlling element such as a low drop out (LDO), an amplifying element such as an operational amplifier, or a discrete semiconductor element such as a diode or various types of sensors.

The semiconductor element 30 has an element substrate 31, electrode pads 32, and an insulating film 33.

Each electrode pad 32 includes a conductive portion 32a and a barrier layer 32b. The conductive portion 32a is formed, for example, from Cu. The barrier layer 32b is formed from, for example, a nickel (Ni) layer. The barrier layer 32b is stacked such that it covers a distal end face of the conductive portion 32a. By providing the barrier layer 32b in the electrode pad 32, the conductive portion 32a made of Cu can be practically suppressed from penetrating into the bonding portion 60 (solder layer 62). It is to be noted that the barrier layer 32b may otherwise be configured from a Ni layer, a palladium (Pd) layer, and a gold (Au) layer stacked one on another.

The insulating film 33 covers the surface of the element substrate 31 and covers peripheral portions of the electrode pad 32. In the present embodiment, the insulating film 33 is made of, for example, a polyimide resin. The insulating film 33 covers part of the electrode pad 32 and exposes part of the surface of the electrode pad 32 as a connection terminal. It is to be noted that the insulating film 33 may otherwise be configured from silicon nitride (SiN).

As depicted in FIG. 7, the semiconductor element 30 is connected to the main face wire 21 through the bonding portion 60. The bonding portion 60 is formed on the main face wire 21. The bonding portion 60 conducts with the internal electrode 20. The bonding portion 60 bonds the semiconductor element 30 to the internal electrode 20. The bonding portion 60 includes a barrier layer 61 and a solder layer 62. The barrier layer 61 and the solder layer 62 are stacked in this order on the main face wire 21. The barrier layer 61 is made of Ni. The solder layer 62 is made of tin (Sn) or an alloy containing Sn. This alloy is, for example, a tin-silver (Sn—Ag) alloy, a tin-antimony (Sn—Sb) alloy or the like.

The barrier layer 61 is formed on the upper face 21s of the main face wire 21. The barrier layer 61 has an upper face 61s and a lower face 61r. The upper face 61s is directed in a direction same as that of the upper face 21s of the main face wire 21. The lower face 61r is opposed to the upper face 21s of the main face wire 21. The lower face 61r of the barrier layer 61 is in contact with the upper face 21s of the main face wire 21. The thickness of the barrier layer 61 (dimension of the barrier layer 61 in the thickness direction z) is, for example, equal to or greater than 3 to 5 µm.

The solder layer 62 is formed on the upper face 61s of the barrier layer 61. The solder layer 62 has an upper face 62s and a lower face 62r. The upper face 62s of the solder layer 62 is directed in a direction same as that of the upper face 61s of the barrier layer 61. The lower face 62r of the solder layer 62 is opposed to the upper face 61s of the barrier layer 61 and is in contact with the upper face 61s. The upper face 62s of the solder layer 62 is in contact with the barrier layer 32b of the semiconductor element 30. In this manner, the barrier layer 32b of the semiconductor element 30 is connected to the bonding portion 60. Consequently, the semiconductor element 30 is mounted on the substrate 10.

As depicted in FIGS. 1 to 6, the external electrode 50 incudes first external electrodes 51 and second external electrodes 52. The first external electrodes 51 and the second external electrodes 52 each serve as external connection terminals of the semiconductor device 1A. Each of the first external electrodes 51 and the second external electrodes 52 includes, for example, a plurality of metal layers stacked on each other. The metal layers may each be, for example, a Ni layer, a Pd layer, or an Au layer.

The first external electrodes 51 cover the lower faces 22r that are exposed rear faces of the through-wires 22. In the present embodiment, each of the first external electrodes 51 covers the overall lower face 22r of the through-wire 22. As depicted in FIG. 3, the first external electrodes 51 protrude in the first direction x and the second direction y from the lower faces 22r of the through-wires 22. In particular, as viewed from the thickness direction z, the area of the first external electrodes 51 is greater than that of the lower faces 22r of the through-wires 22.

The second external electrodes 52 cover the exposed side face 23x of the column conductors 23. Further, the second external electrodes 52 cover the end face 21y of the main face wires 21. In the present embodiment, each of the second external electrodes 52 covers the overall exposed side face 23x of each column conductor 23 and the overall end face 21y of each main face wire 21. Therefore, in the present embodiment, it can be regarded that the second external electrode 52 is provided at a portion of each of the resin side faces 41 to 44 corresponding to the second resin portion 49. As depicted in FIG. 5, the second external electrode 52 protrudes in the first direction x and the second direction y from the exposed side face 23x of each column conductor 23 on the side opposite to the main face wire 21 in the thickness direction z. Further, the second external electrode 52 protrudes in the first direction x and the second direction y from the end face 21y of each main face wire 21 on the side opposite to the column conductor 23 in the thickness direction z. In particular, the area of the second external electrodes 52 that cover the exposed side face 23x and the end face 21y exposed from the resin side faces 41 and 42, as viewed from the first direction x, is greater than the total area of the exposed side face 23x and the end face 21y. Further, the area of the second external electrodes 52 that cover the exposed side face 23x and the end face 21y exposed from the resin side faces 43 and 44, as viewed from the second direction y, is greater than the total area of the exposed side face 23x and the end face 21y. Further, as can be recognized from FIG. 3, in the present embodiment, the second external electrode 52 is positioned on the inner side with respect to a portion of each of the resin side faces 41 to 44 corresponding to the first resin portion 48.

The first external electrodes 51 are provided according to the through-wires 22. More particularly, as depicted in FIG. 3, a first external electrode 51 is provided on each of the four through-wires 22 provided in the proximity of the substrate side face 11 and arrayed spaced from each other in the first direction x. In this case, the four first external electrodes 51 are arrayed spaced from each other in the first direction x. Another first external electrode 51 is provided on each of the four through-wires 22 provided in the proximity of the substrate side face 12 and arrayed spaced from each other in the first direction x. In this case, the four first external electrodes 51 are arrayed spaced from each other in the first direction x. A further first external electrode 51 is provided on each of the four through-wires 22 provided in the proximity of the substrate side face 13 and arrayed spaced from each other in the second direction y. In this case, the four first external electrodes 51 are arrayed spaced from each other in the second direction y. A still further first external electrode 51 is provided on each of the four through-wires 22 provided in the proximity of the substrate side face 14 and arrayed spaced from each other in the second direction y. In this case, the four first external electrodes 51 are arrayed spaced from each other in the second direction y.

The second external electrodes 52 are provided according to the exposed side faces 23x of the column conductors 23. More particularly, a second external electrode 52 is provided on each of the four exposed side faces 23x exposed from the resin side face 41 of the sealing resin 40. In this case, for example, as depicted in FIG. 4, the four second external electrodes 52 are arrayed spaced from each other in the first direction x. Another second external electrode 52 is provided on each of the four exposed side faces 23x exposed from the resin side face 42 of the sealing resin 40. In this case, the four second external electrodes 52 are arrayed spaced from each other in the first direction x. A further second external electrode 52 is provided on each of the four exposed side faces 23x exposed from the resin side face 43 of the sealing resin 40. In this case, the four second external electrodes 52 are arrayed spaced from each other in the second direction y. A still further second external electrode 52 is provided on each of the four exposed side faces 23x exposed from the resin side face 44 of the sealing resin 40. In this case, the four second external electrodes 52 are arrayed spaced from each other in the second direction y.

As depicted in FIGS. 5 and 6, the first external electrodes 51 and the second external electrodes 52 are arranged spaced from each other. More particularly, the first external electrodes 51 and the second external electrodes 52 are arranged spaced from each other in the thickness direction z as viewed from a direction perpendicular to the resin side faces 41 to 44 of the sealing resin 40. In particular, a lower end edge 52x of each second external electrodes 52 is positioned higher than the substrate rear face 10r of the substrate 10. In other words, the substrate side faces 11 to 14 are exposed between the second external electrodes 52 and the substrate rear face 10r of the substrate 10 in the thickness direction z. End edges 51x of the first external electrodes 51 on the side nearer to the substrate side faces 11 to 14 of the substrate 10 are positioned on the inner side with respect to the substrate side faces 11 to 14 of the substrate 10. In other words, the substrate rear face 10r of the substrate 10 is exposed between the end edges 51x of the first external electrodes 51 and the substrate side faces 11 to 14 nearest to the end edges 51x.

Further, the lower end edge 52x of the second external electrodes 52 is positioned lower than the substrate main face 10s of the substrate 10. In other words, the second external electrodes 52 are provided so as to span the resin rear face 40r of the sealing resin 40 and the substrate main face 10s of the substrate 10 in the thickness direction z.

The first external electrodes 51 and the second external electrodes 52 provided on the through-wires 22 and the column conductors 23 connected to each other through the main face wires 21 are aligned with each other in a direction in which the main face wires 21 extend and a direction orthogonal to the thickness direction z as viewed from a direction in which the main face wires 21 extend. In particular, the second external electrodes 52 provided on the resin side face 41 or the resin side face 42 of the sealing resin 40 and the first external electrodes 51 electrically connected to the second external electrodes 52 through the column conductors 23, the main face wires 21, and the through-wires 22 are aligned with each other in the first direction x. Further, the second external electrodes 52 provided on the resin side face 43 or the resin side face 44 of the sealing resin 40 and the first external electrodes 51 electrically connected to the second external electrodes 52 through the column conductors 23, the main face wires 21, and the through-wires 22 are aligned with each other in the second direction y.

Figure 8:
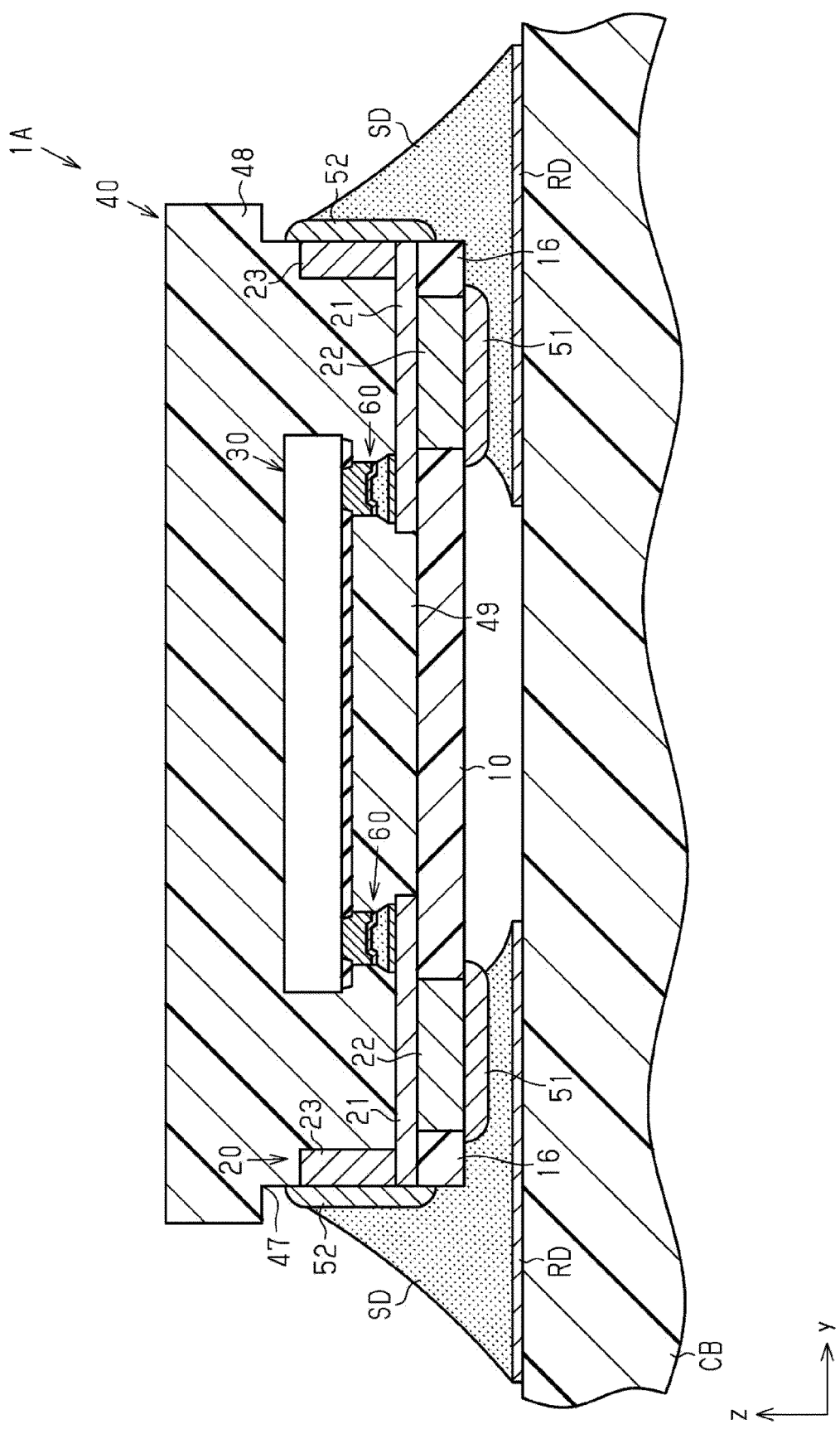
FIG. 8 is a sectional view of a state in which the semiconductor device of the first embodiment is mounted on a circuit board.

As depicted in FIG. 8, in the case where the semiconductor device 1A is mounted on a rand portion RD of a circuit board CB by conductive bonding agent SD such as solder, the conductive bonding agent SD is in contact with the first external electrodes 51 and the second external electrodes 52. Therefore, the conductive bonding agent SD has a fillet formed thereon. Consequently, the adhesion state of the conductive bonding agent SD can be viewed from the outside of the semiconductor device 1A.

(Manufacturing Method of Semiconductor Device)

A manufacturing method of the semiconductor device 1A according to the first embodiment of the present disclosure is described with reference to FIGS. 9 to 24. In FIGS. 9 to 12, 14, 15, 17, and 19 to 21, two broken lines neighboring with each other depict a range in which one semiconductor device 1A is formed. In the figures mentioned, the definitions of the directions are the same as the definitions of the directions depicted in FIGS. 1 to 5.

Figure 9:
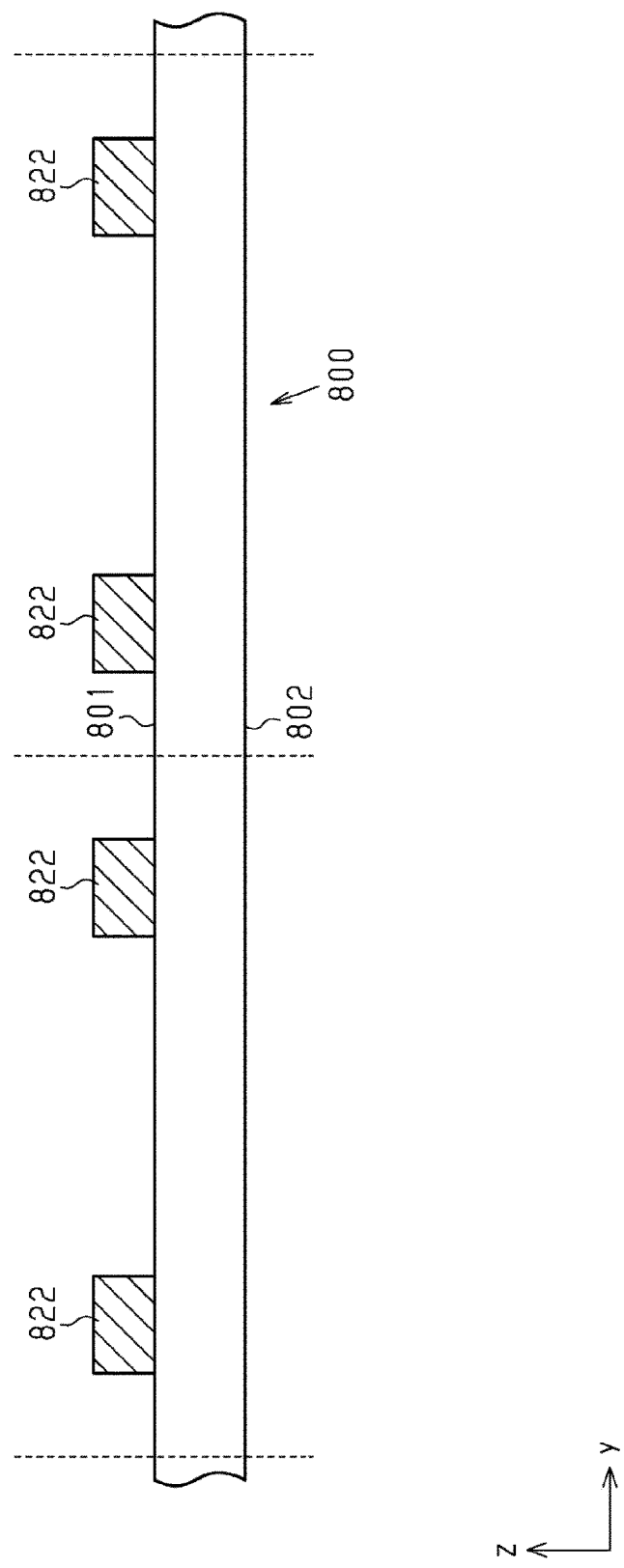
FIG. 9 is a view illustrating an example of a step of a manufacturing process according to a manufacturing method of the semiconductor device of the first embodiment.

A support substrate 800 is prepared as depicted in FIG. 9. The support substrate 800 is formed from a single crystal material, for example, of silicon (Si). The support substrate 800 has an upper face 801 and a lower face 802 directed to the sides opposite to each other in the thickness direction z. It is to be noted that, as the support substrate 800, a substrate made of a synthetic resin material such as an epoxy resin may be used. Then, terminal pillars 822 are formed on the upper face 801 of the support substrate 800. The terminal pillars 822 are formed, for example, of Cu or a Cu alloy by electroplating.

More particularly, the terminal pillars 822 are formed, for example, by a step of forming a seed layer, a step of forming a mask on the seed layer by photolithography, and a step of forming terminal pillars 822 in contact with the seed layer. For example, a sputtering method is used to form a seed layer on the upper face 801 of the support substrate 800. Then, the seed layer is covered with a resist layer, for example, having photosensitivity, and the resist layer is photosensitized and developed to form a mask having openings. Then, plating metal is deposited on the surface of the seed layer exposed from the mask by an electrolytic plating method using the seed layer as a conductive path, to form terminal pillars 822. After the formation of the terminal pillars 822, the mask is removed. It is to be noted that the terminal pillars 822 may be formed from column materials of Cu.

Figure 10:
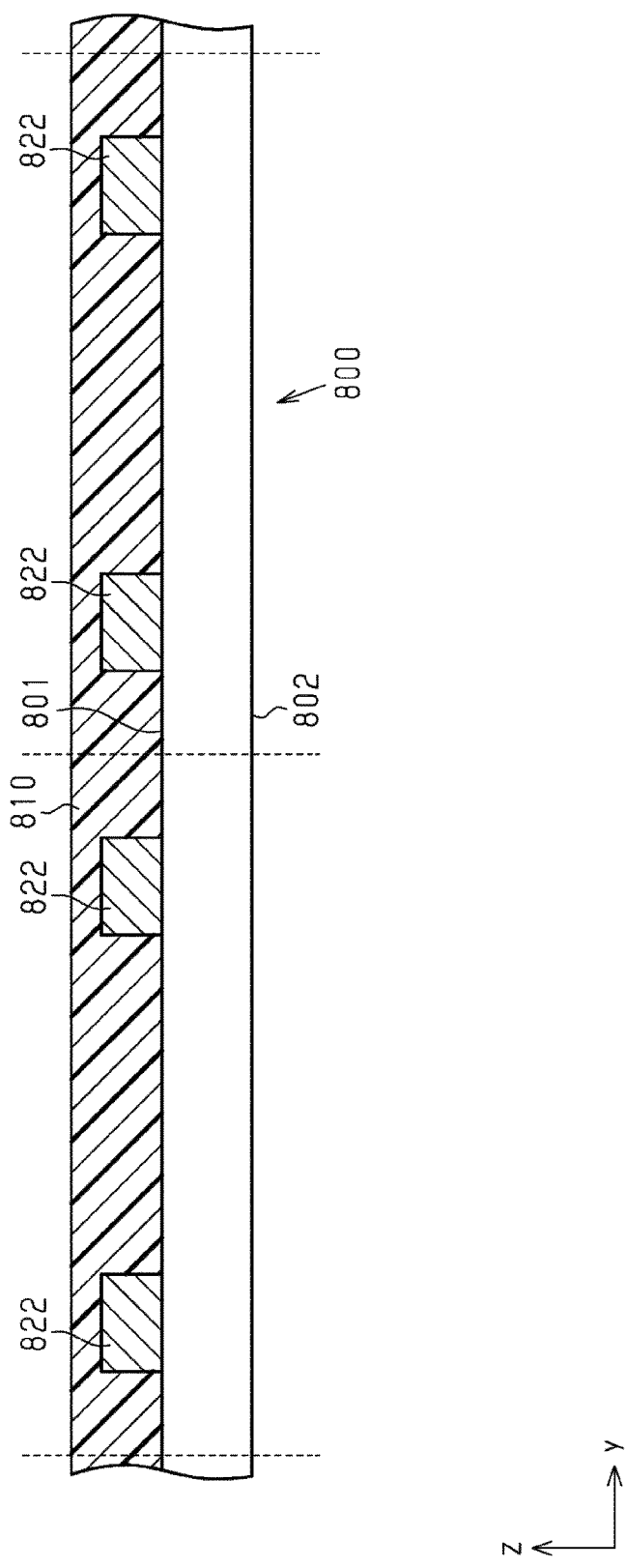
FIG. 10 is a view illustrating an example of a step of a manufacturing process according to a manufacturing method of the semiconductor device.

A substrate 810 is formed such that it is in contact with the upper face 801 of the support substrate 800 and covers the terminal pillars 822 as depicted in FIG. 10. The substrate 810 is formed so as to cover the upper face of the terminal pillars 822. As the material of the substrate 810, a material configuring the substrate 10 depicted in FIG. 1 can be used. In the present embodiment, as the material of the substrate 810, a synthetic resin containing epoxy resin or the like as a main ingredient can be used.

Figure 11:
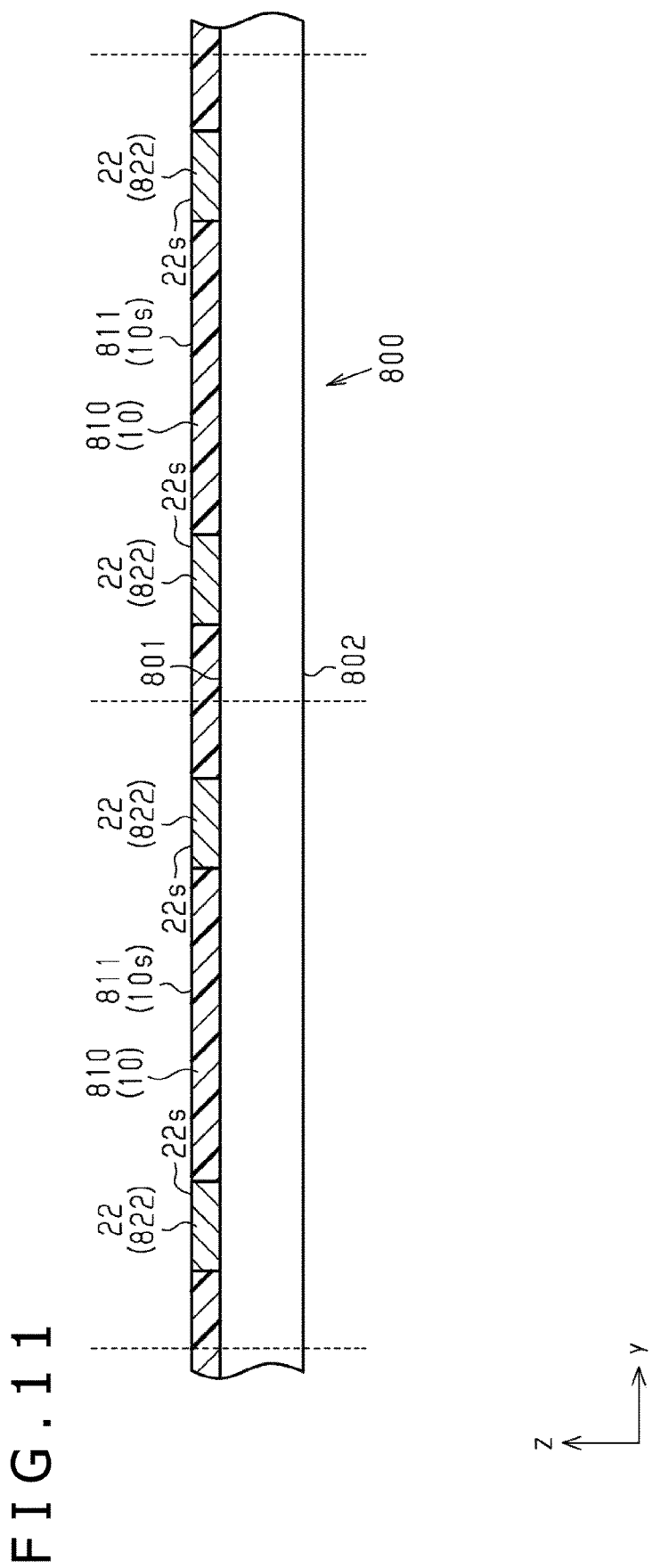
FIG. 11 is a view illustrating an example of a step of the manufacturing process according to the manufacturing method of the semiconductor device.

As depicted in FIG. 11, the substrate 810 and the terminal pillars 822 are partly ground to form through-wires 22 exposed at an upper face 811 of the substrate 810 and an upper face 22s of the through-wires 22. The substrate 810 becomes the substrate 10 depicted in FIG. 5. In the grinding of the substrate 810, the substrate 810 is ground so as to have a thickness same as that of the substrate 10. In this manner, the steps depicted in FIGS. 10 and 11 correspond to a through-wire formation step.

Figure 12:
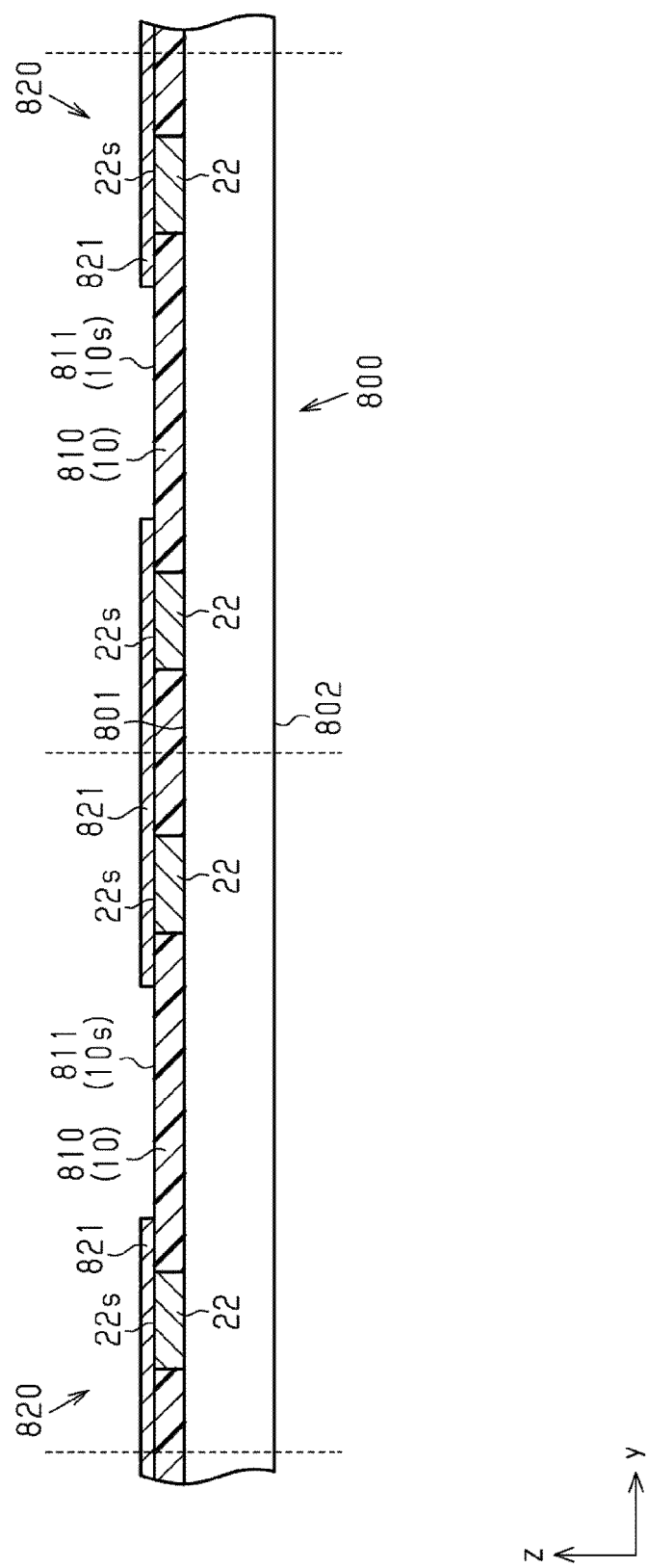
FIG. 12 is a view illustrating an example of a step of the manufacturing process according to the manufacturing method of the semiconductor device.

As depicted in FIG. 12, a main face wire 821 is formed on the upper face 811 of the substrate 810 and the upper face 22s of the through-wires 22.

Figure 13:
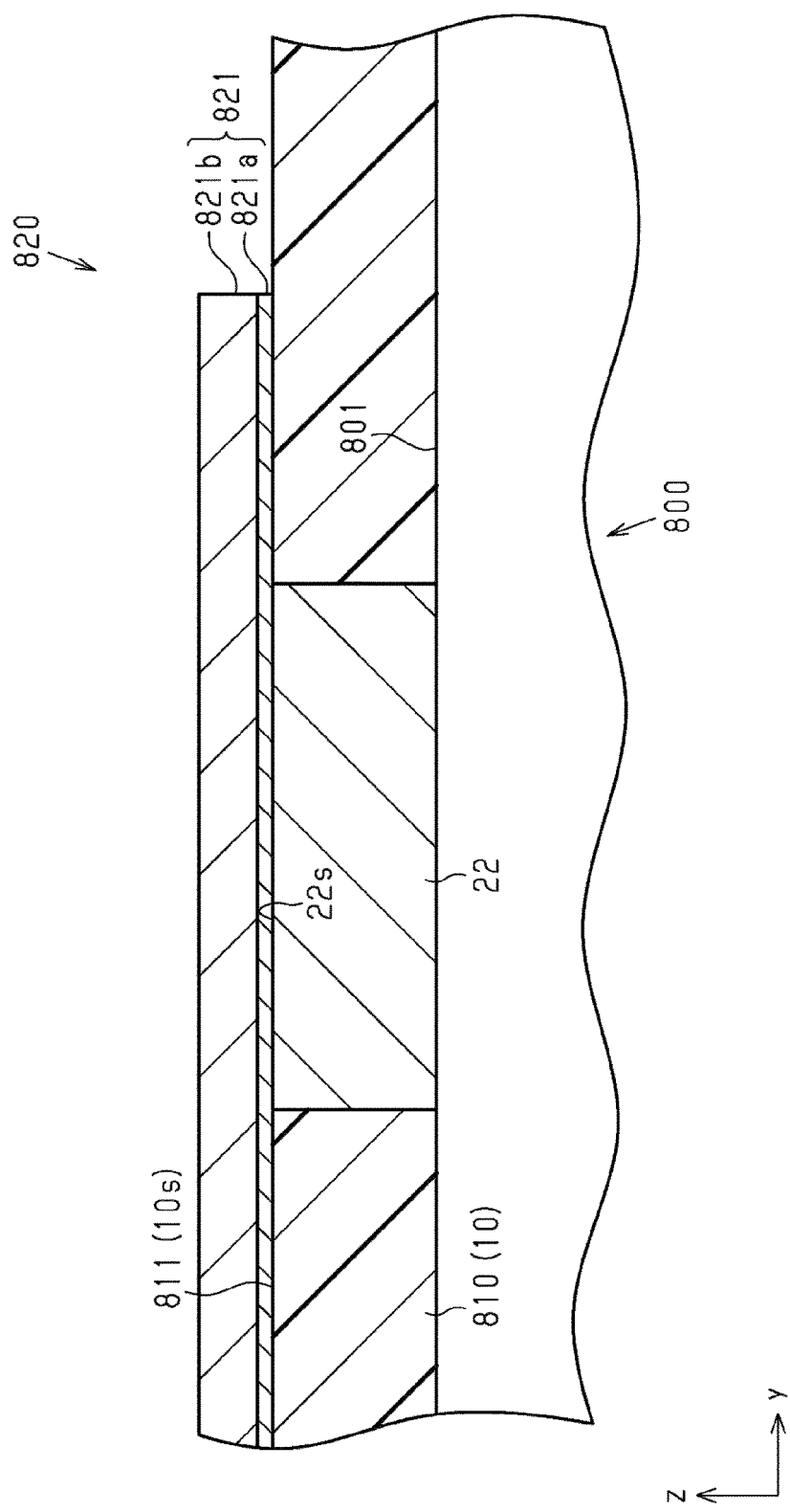
FIG. 13 is an enlarged view of part of a main face wire of FIG. 12 and peripheral portions of the same.

As depicted in FIG. 13, the main face wire 821 includes a metal layer 821a and a conductive layer 821b. The main face wire 821 is formed through a step of forming a metal layer 821a, a step of forming a mask on the metal layer 821a by photolithography, and a step of forming a conductive layer 821b in contact with the metal layer 821a.

First, the metal layer 821a is formed, for example, by a sputtering method. The metal layer 821a including, for example, a Ti layer and a Cu layer is formed by forming a Ti layer on the upper face 811 of the substrate 810 and the upper face 22s of the through-wires 22 and forming a Cu layer in contact with the Ti layer. Then, the metal layer 821a is covered with a resist layer, for example, having photosensitivity, and the resist layer is photosensitized and developed to form a mask having openings. Then, for example, by an electrolytic plating method using the metal layer 821a as a conductive path, plating metal is deposited on the surface of the metal layer 821a exposed from the mask, to form a conductive layer 821b. By the steps described, the main face wires 821 are formed. After the formation of the main face wires 821, the mask is removed. Part of the internal electrode 820 includes the main face wires 821 and the through-wires 22 formed in this manner. In this manner, the steps depicted in FIGS. 12 and 13 correspond to a main face wire formation step.

Figure 14:
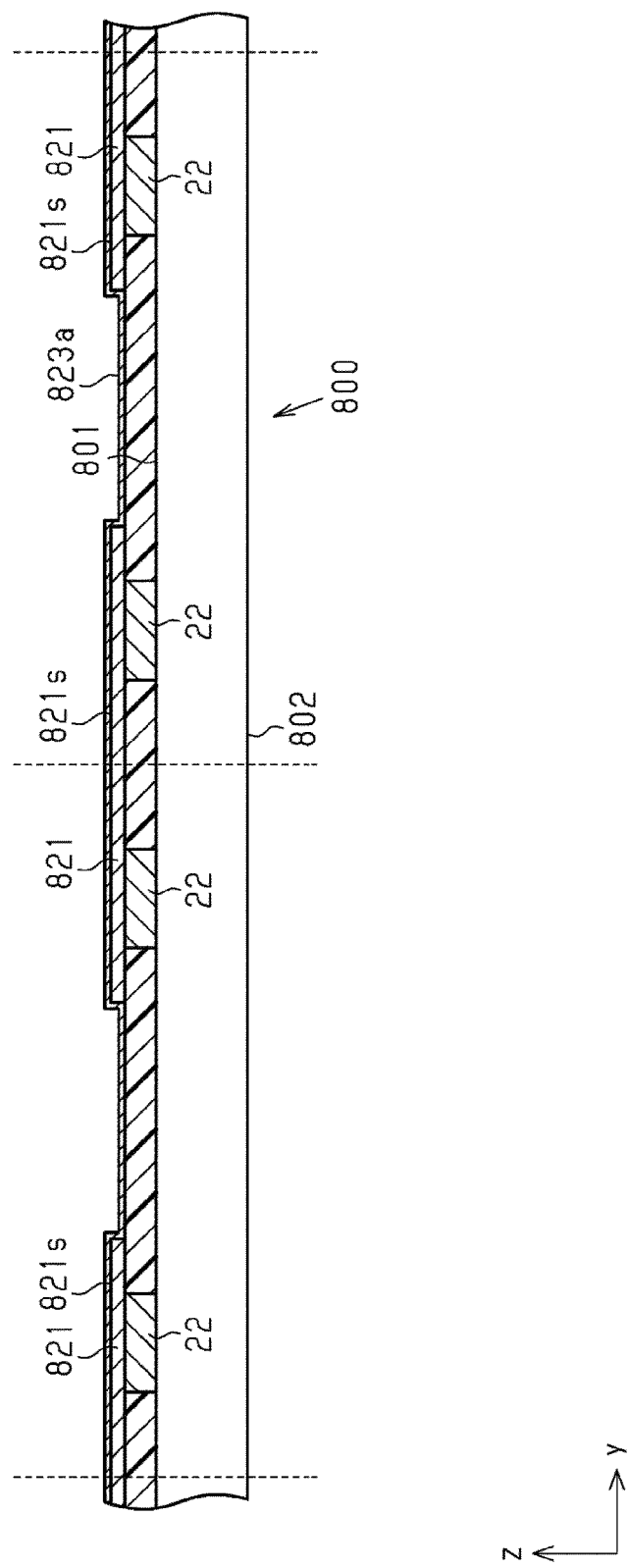
FIG. 14 is a view illustrating an example of a step of the manufacturing process according to the manufacturing method of the semiconductor device.
Figure 15:
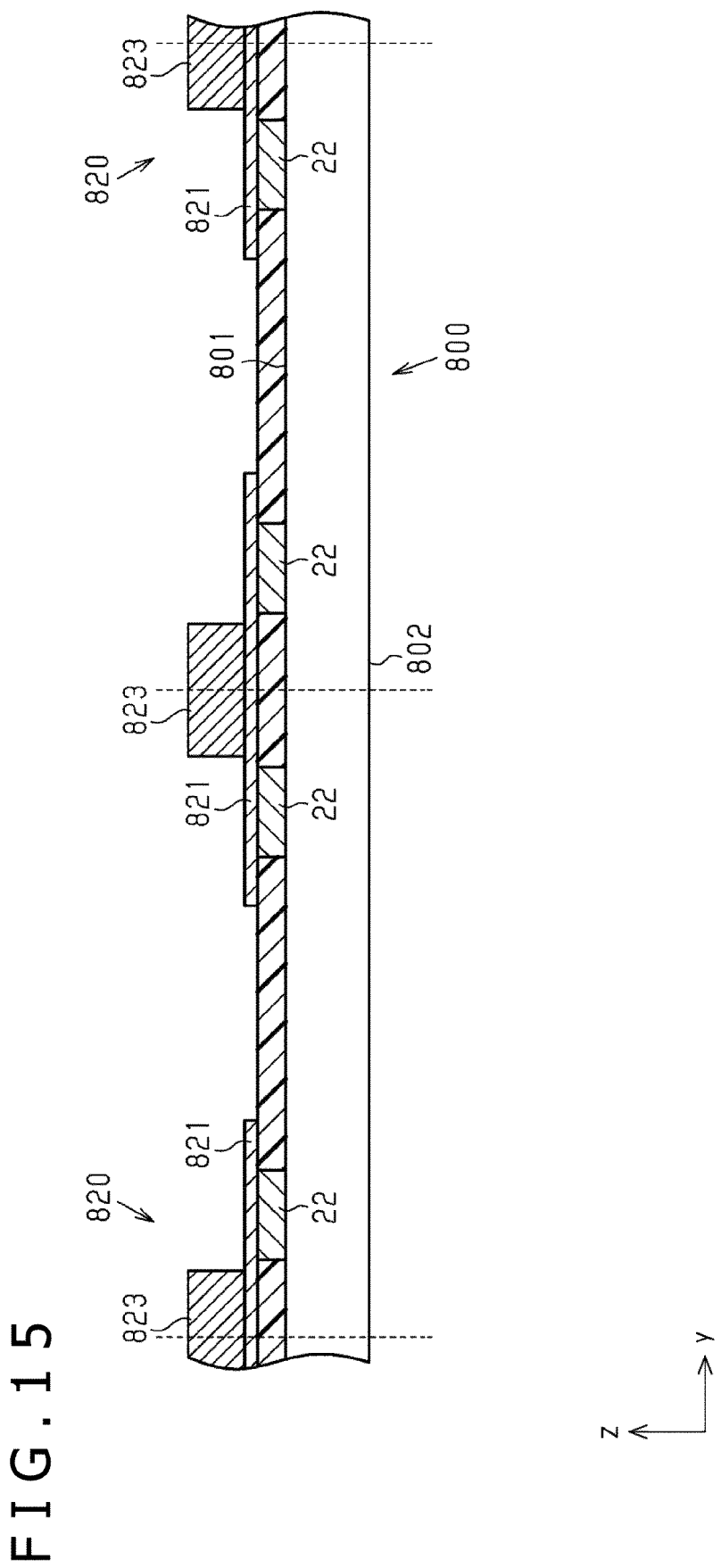
FIG. 15 is a view illustrating an example of a step of the manufacturing process according to the manufacturing method of the semiconductor device.

As depicted in FIGS. 14 and 15, column conductors 823 are formed on an upper face 821s of the main face wires 821.

Each column conductor 823 is formed, for example, through a step of forming a seed layer, a step of forming a mask on the seed layer by photolithography, and a step of forming a plating layer in contact with the seed layer. As depicted in FIG. 14, a seed layer 823a is formed on the upper face 821s of the main face wire 821, for example, by a sputtering method. Then, the seed layer 823a is covered with a resist layer, for example, having photosensitivity, and the resist layer is photosensitized and developed to form a mask having openings.

Figure 16:
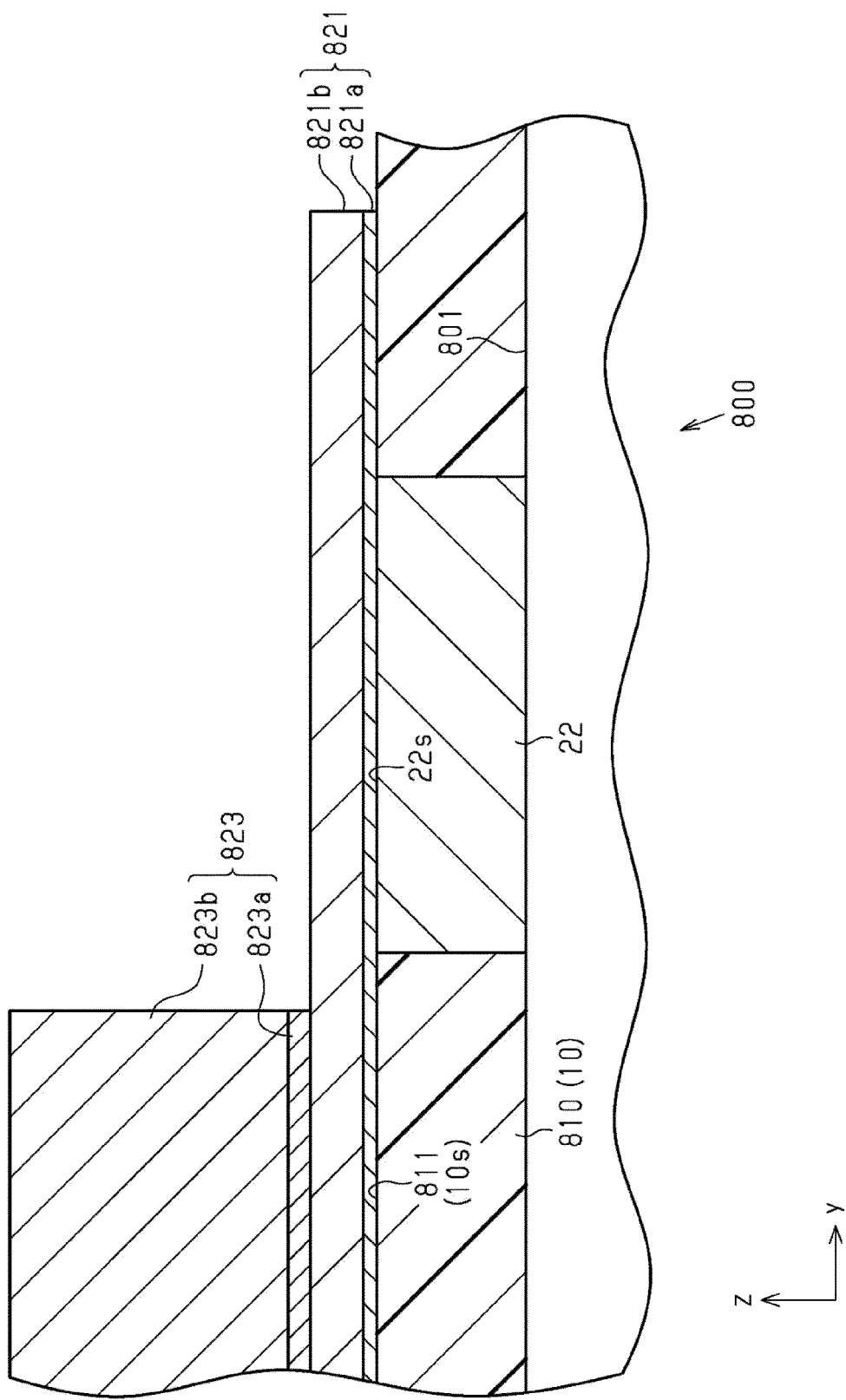
FIG. 16 is an enlarged view of a through-wire of FIG. 15 and peripheral portions of the same.

Then, as depicted in FIG. 16, plating metal is deposited on the surface of the seed layer 823a exposed from the mask by an electrolytic plating method using the seed layer 823a as a conductive path, to form a plating layer 823b. Consequently, the column conductors 823 including a stacked body of the seed layer 823a and the plating layer 823b are formed. Then, after the formation of the column conductors 823, the mask is removed. It is to be noted that the column conductors 823 may be formed from a column material of Cu.

Then, the unnecessary seed layer 823a is removed. The seed layer 823a other than that at a portion thereof covered with the plating layer 823b is removed. The removal of the unnecessary seed layer 823a is performed, for example, by wet etching using mixed solution of sulfuric acid ($H_2SO_4$) and hydrogen peroxide ($H_2O_2$). In this manner, the steps depicted in FIGS. 14 to 16 correspond to a column conductor formation step.

Figure 17:
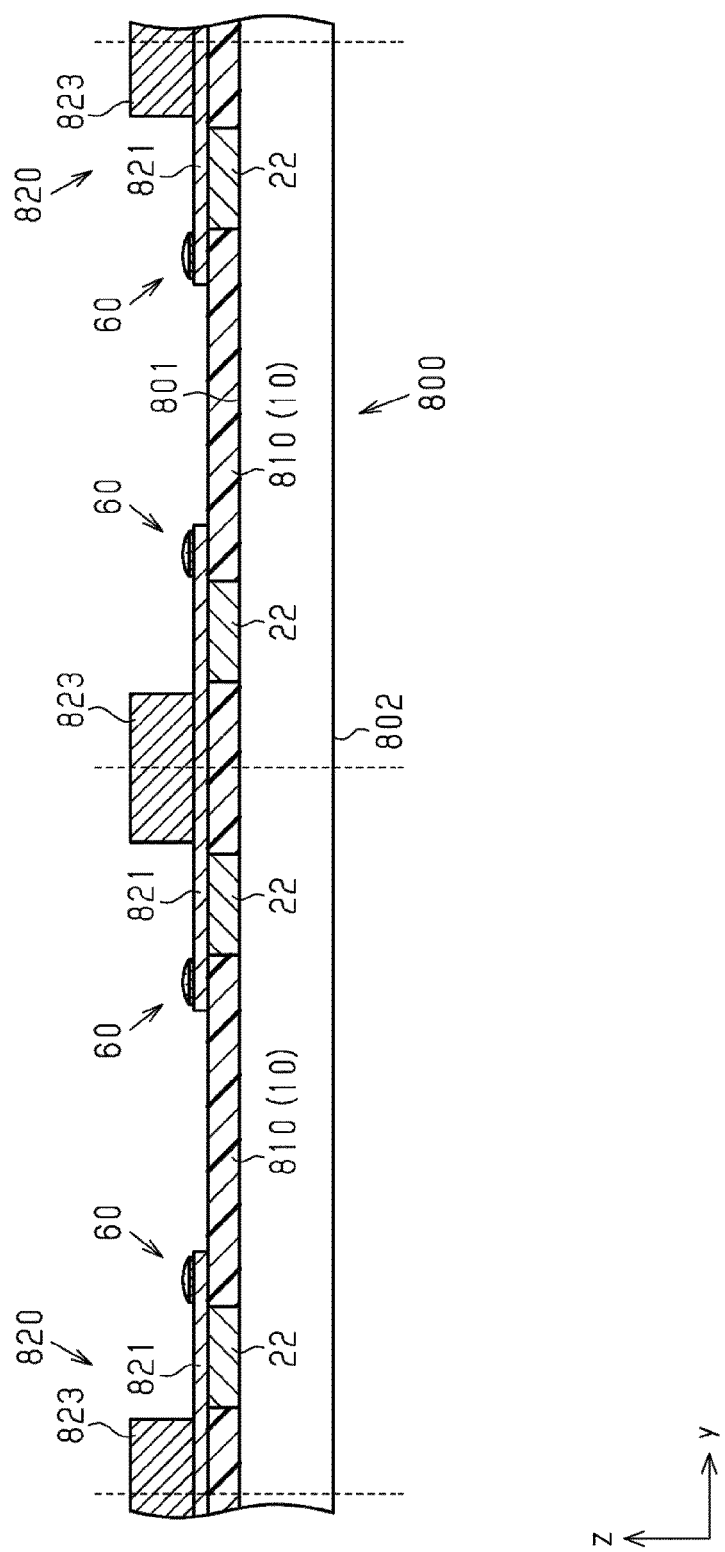
FIG. 17 is a view illustrating an example of a step of the manufacturing process according to the manufacturing method of the semiconductor device.
Figure 18:
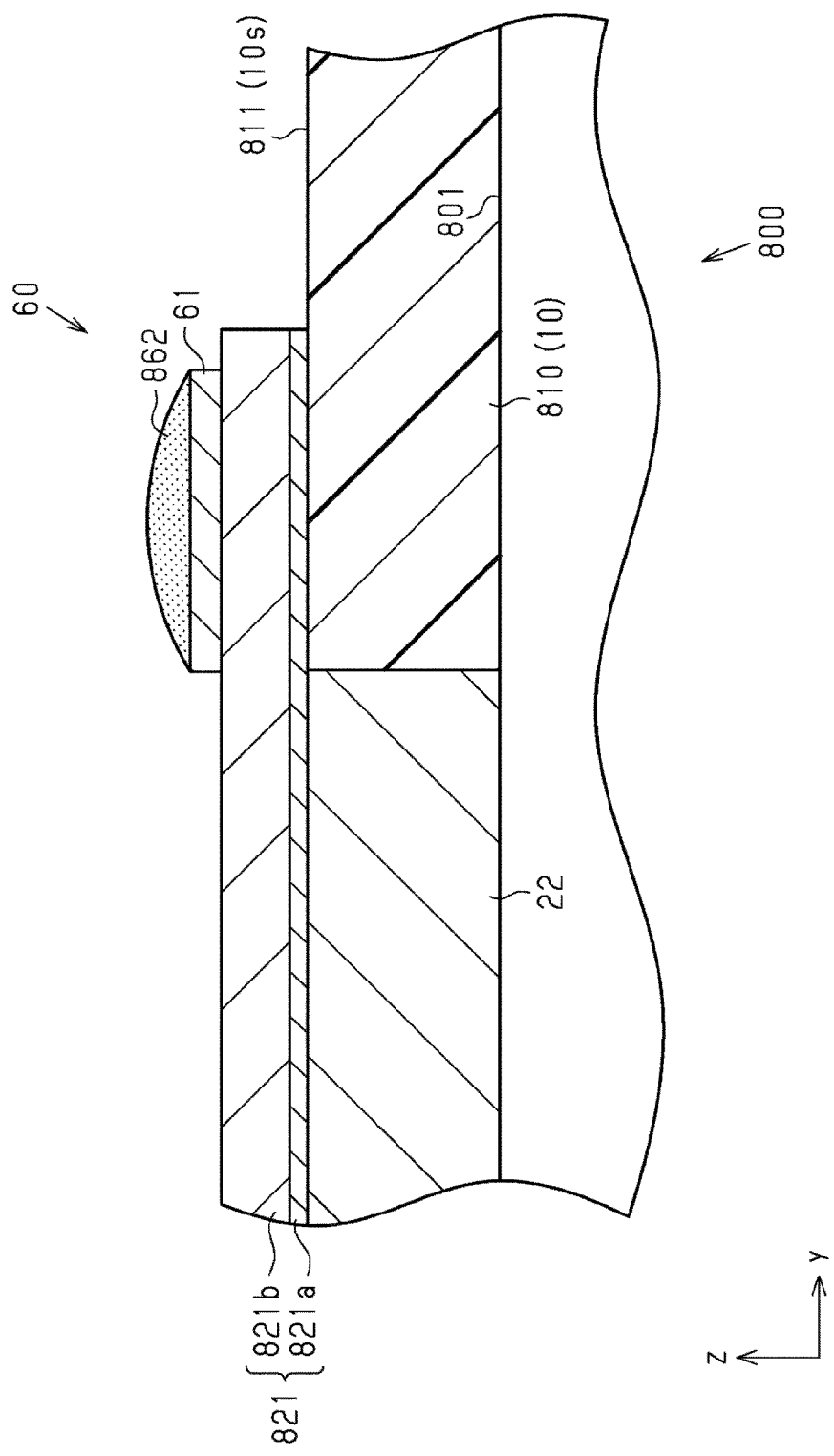
FIG. 18 is an enlarged view of a bonding portion of FIG. 17 and peripheral portions of the same.

As depicted in FIG. 17, bonding portions 60 are formed. As depicted in FIG. 18, each bonding portion 60 includes a barrier layer 61 and a solder layer 862. First, the barrier layer 61 is formed on an upper face 821s of the main face wire 821. The barrier layer 61 can be formed, for example, by an electrolytic plating method using the main face wire 821 as a conductive path. Then, an alloy containing Sn as the plating metal is deposited on the upper face 61s of the barrier layer 61 by an electrolytic plating method, to form the solder layer 862. Thereafter, the solder layer 862 is melted by a reflow process to smoothen the surface of the solder layer 862 having roughness. By this smoothing, appearance of voids when the solder layer 862 and the solder layer of the semiconductor element 30 are bonded can be practically suppressed. It is to be noted that the solder layer 862 depicted in FIGS. 17 and 18 indicates a state after the reflow.

Figure 19:
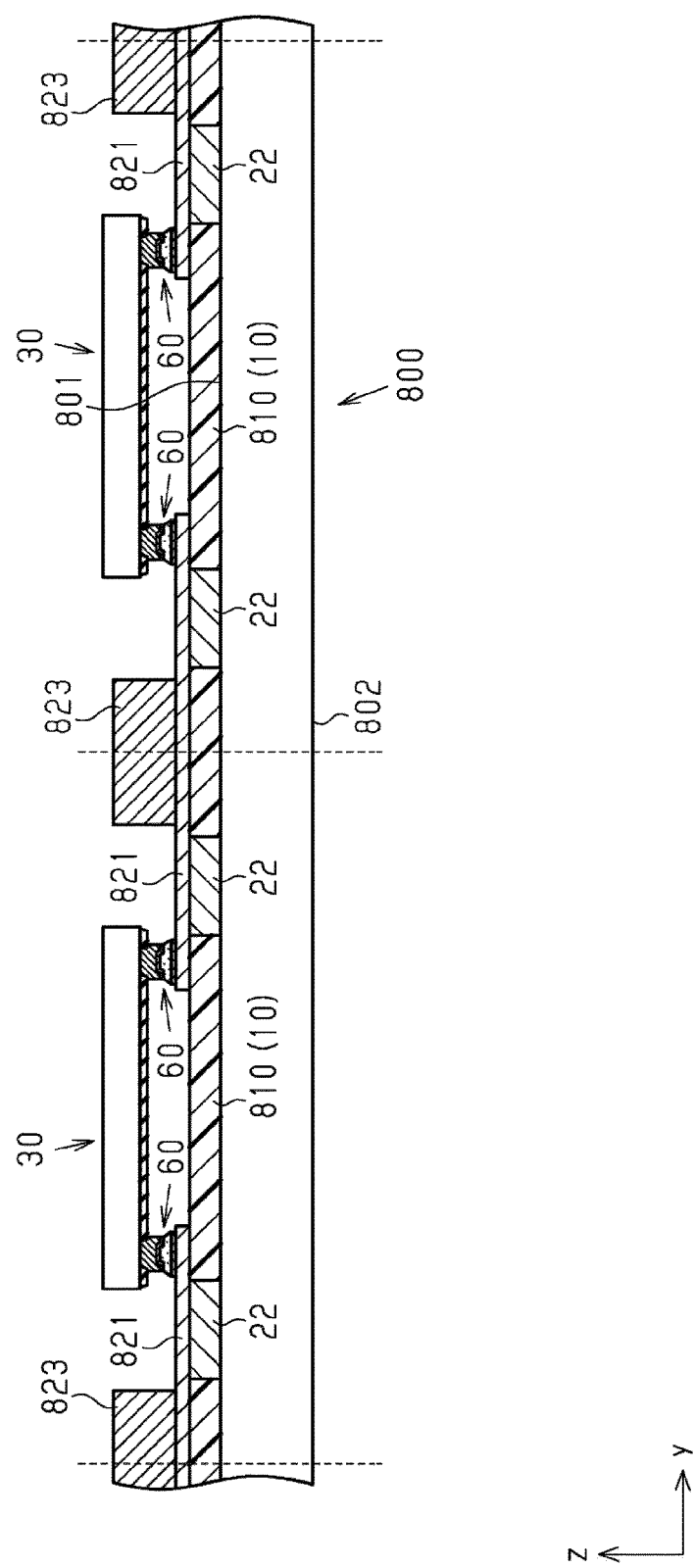
FIG. 19 is a view illustrating an example of a step of the manufacturing process according to the manufacturing method of the semiconductor device.

As depicted in FIG. 19, a semiconductor element 30 is placed on each main face wire 821. The placement of the semiconductor element 30 is performed by flip chip bonding (FCB). First, an alloy containing Sn as the plating metal is deposited on the barrier layer 32b of the electrode pads 32 of the semiconductor element 30, for example, by an electrolytic plating method, to form a solder layer (not depicted). This solder layer is made of a material same as that of the solder layer 862 of the bonding portion 60. The surface of the solder layer of the semiconductor element 30 is also smoothened by a reflow process similarly to the solder layer 862 described above.

Then, for example, after flux is applied to the portion of the bonding portion 60, the semiconductor element 30 is placed on the bonding portion 60, for example, by using flip chip bonding. Consequently, the semiconductor element 30 is temporarily attached to the bonding portion 60. Thereafter, the solder layer 862 of the bonding portion 60 and the solder layer of the semiconductor element 30 are placed into a liquid phase state by reflow and are then cooled such that the solder layer 862 and the solder layer of the semiconductor element 30 are solidified to thereby connect the semiconductor element 30 to the bonding portion 60. Therefore, the solder layer 62 of the bonding portion 60 includes the solder layer 862 and the solder layer of the semiconductor element 30. In this manner, the step depicted in FIG. 19 corresponds to an element placement step.

Figure 20:
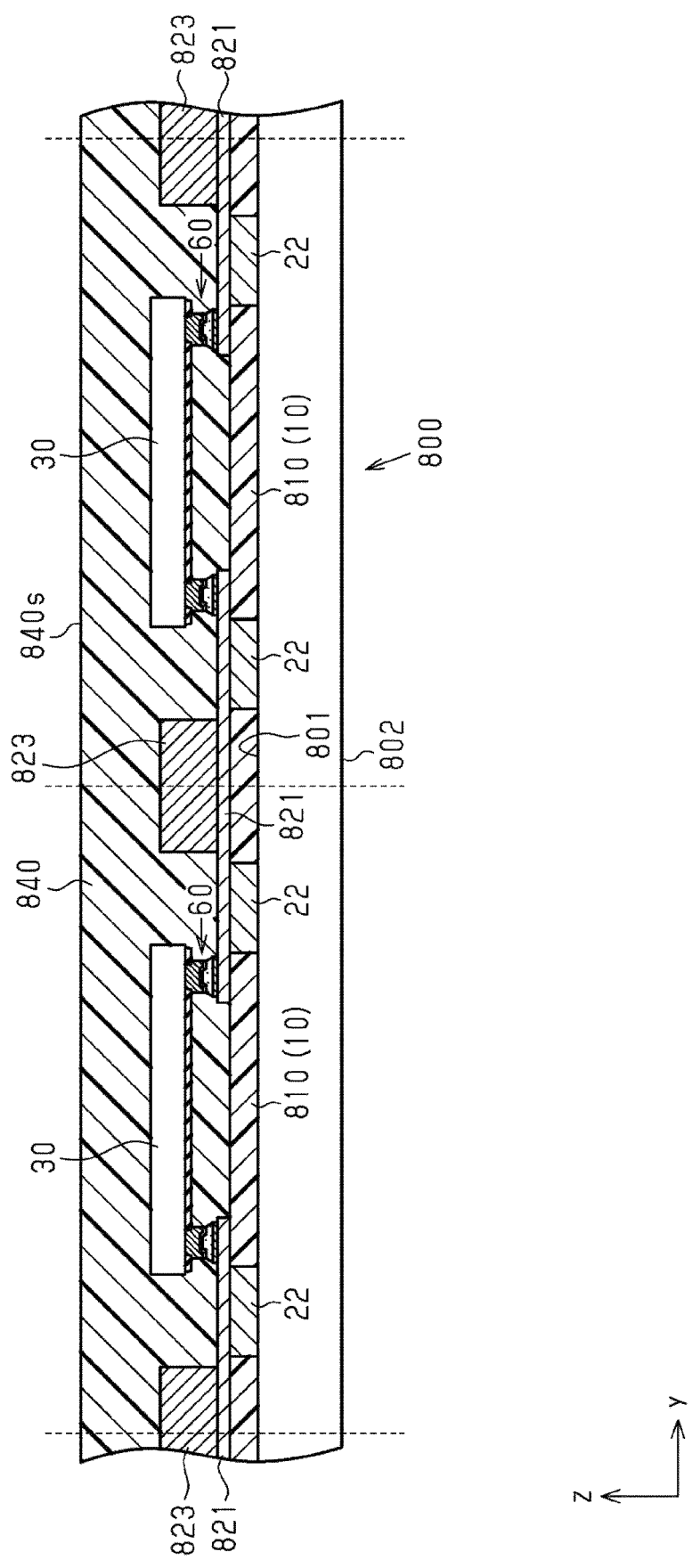
FIG. 20 is a view illustrating an example of a step of the manufacturing process according to the manufacturing method of the semiconductor device.

As depicted in FIG. 20, a resin layer 840 is formed so as to cover the upper face 811 of the substrate 810 and the semiconductor elements 30. The resin layer 840 is a member that becomes the sealing resin 40 depicted in FIG. 1. The resin layer 840 is made of, for example, a synthetic resin containing an epoxy resin as a main ingredient. For example, transfer molding is used to form the resin layer 840. It is to be noted that, although, in the present embodiment, one resin layer 840 is formed for one semiconductor element 30, this is not limitative, and otherwise, a resin layer 840 that covers all semiconductor elements 30 may be formed. In this manner, the step depicted in FIG. 20 corresponds to a resin layer formation step.

Figure 21:
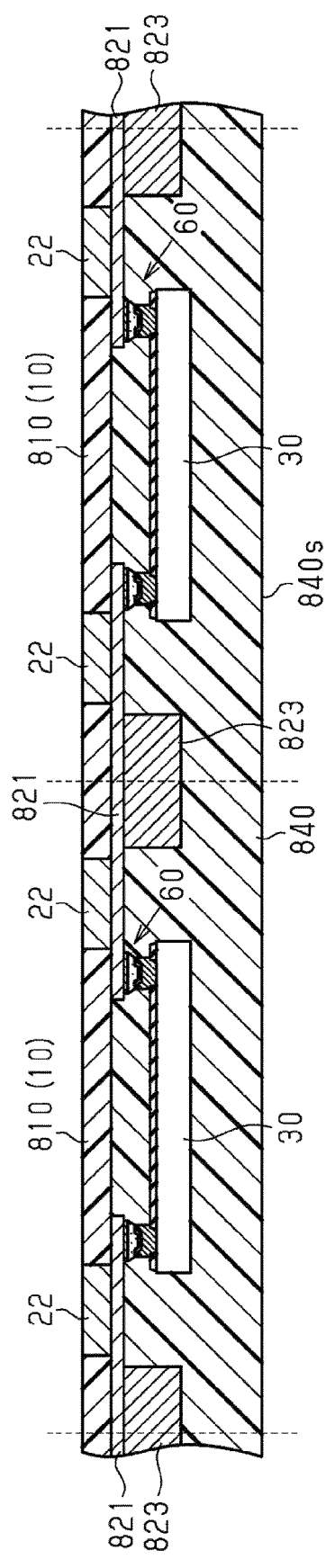
FIG. 21 is a view illustrating an example of a step of the manufacturing process according to the manufacturing method of the semiconductor device.

As depicted in FIG. 21, the support substrate 800 depicted in FIG. 20 is removed. It is to be noted that FIG. 21 depicts the structure of FIG. 20 upside down with respect to FIG. 20. For example, the support substrate 800 is removed by grinding. It is to be noted that the substrate 810 may otherwise be formed thicker than the substrate 10 depicted in FIG. 5 such that, in the grinding step of the support substrate 800, after the support substrate 800 is ground, the substrate 810 and the terminal pillars 822 are ground to make the thickness of the substrate 810 equal to the thickness of the substrate 10. As an alternative, it is also possible to use a method of forming a peeling film in advance and removing the support substrate 800 by a peeling method.

Figure 22:
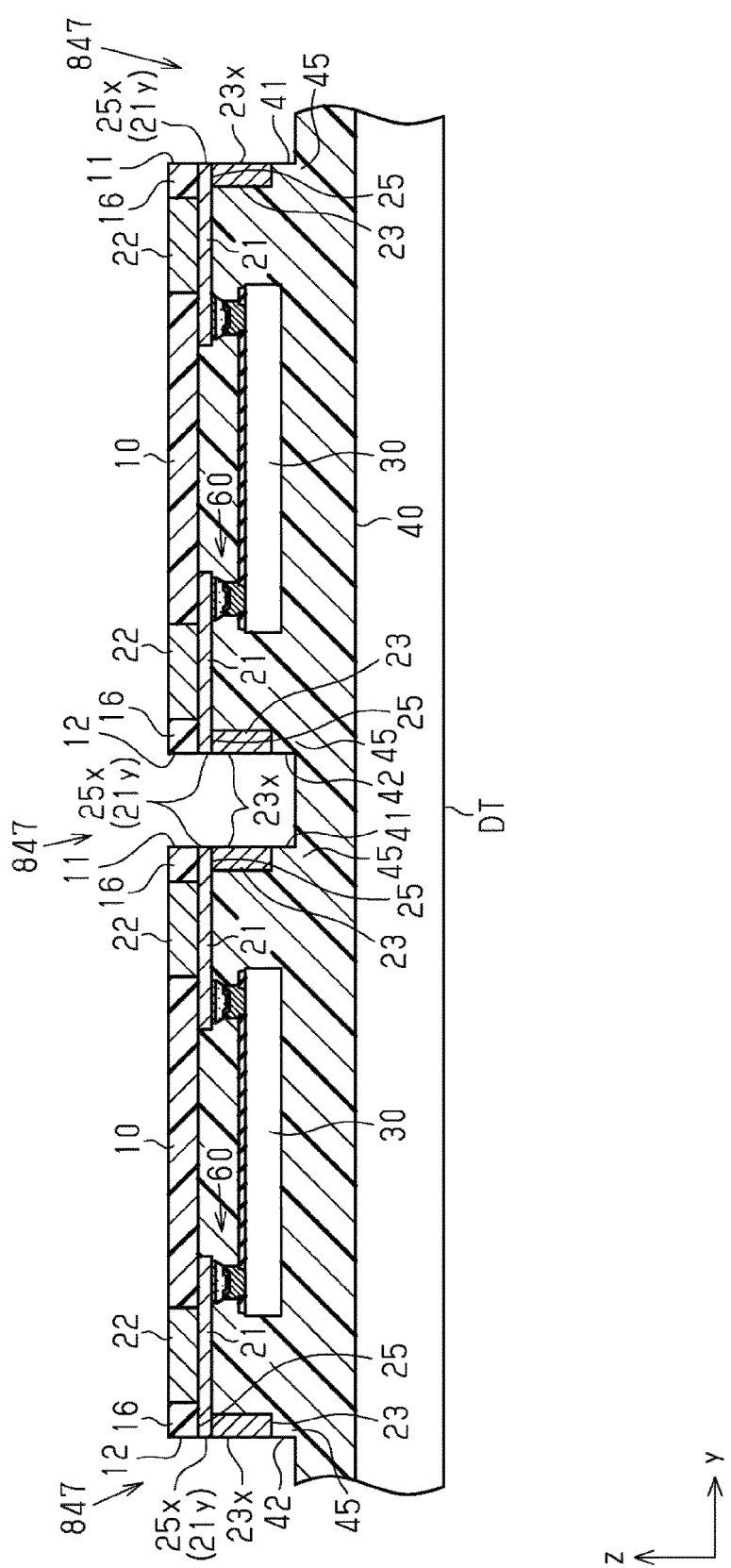
FIG. 22 is a view illustrating an example of a step of the manufacturing process according to the manufacturing method of the semiconductor device.

As depicted in FIG. 22, a dicing tape DT is pasted to the lower face of the resin layer 840, and the substrate 810 is cut and part of the resin layer 840 in the thickness direction z is ground (half cut). Upon such cutting of the substrate 810 and half cutting of the resin layer 840 as just described, for example, the dicing blade is operated to cut in toward the dicing tape DT from the substrate 810 side along a cutting line (broken line) depicted in FIG. 21. By half cutting the resin layer 840 in this manner, a separation groove 847 is formed in the resin layer 840.

By cutting the substrate 810 and half cutting the resin layer 840 by using the dicing blade as depicted in FIG. 22, the main face wires 821 and the column conductors 823 (for both of them, refer to FIG. 21) are cut. As a result, the substrate 10 is formed from the substrate 810, the main face wires 21 are formed from the main face wires 821, and then, the column conductors 23 are formed from the column conductors 823. More particularly, as the substrate 10, the substrate side faces 11 to 14 and the substrate outer peripheral portion 16 are formed. As the main face wires 21, the outer side extensions 25 and the end faces 25x (end faces 21y of the main face wires 21) exposed from the resin side faces 41 to 44 of the sealing resin 40 are formed. As the column conductors 23, the exposed side faces 23x exposed from the resin side faces 41 to 44 are formed. In other words, the end faces 25x of the outer side extensions 25 and the exposed side faces 23x of the column conductors 23 are exposed from the separation grooves 847. In this manner, the step depicted in FIG. 22 corresponds to a first cutting step.

Figure 23:
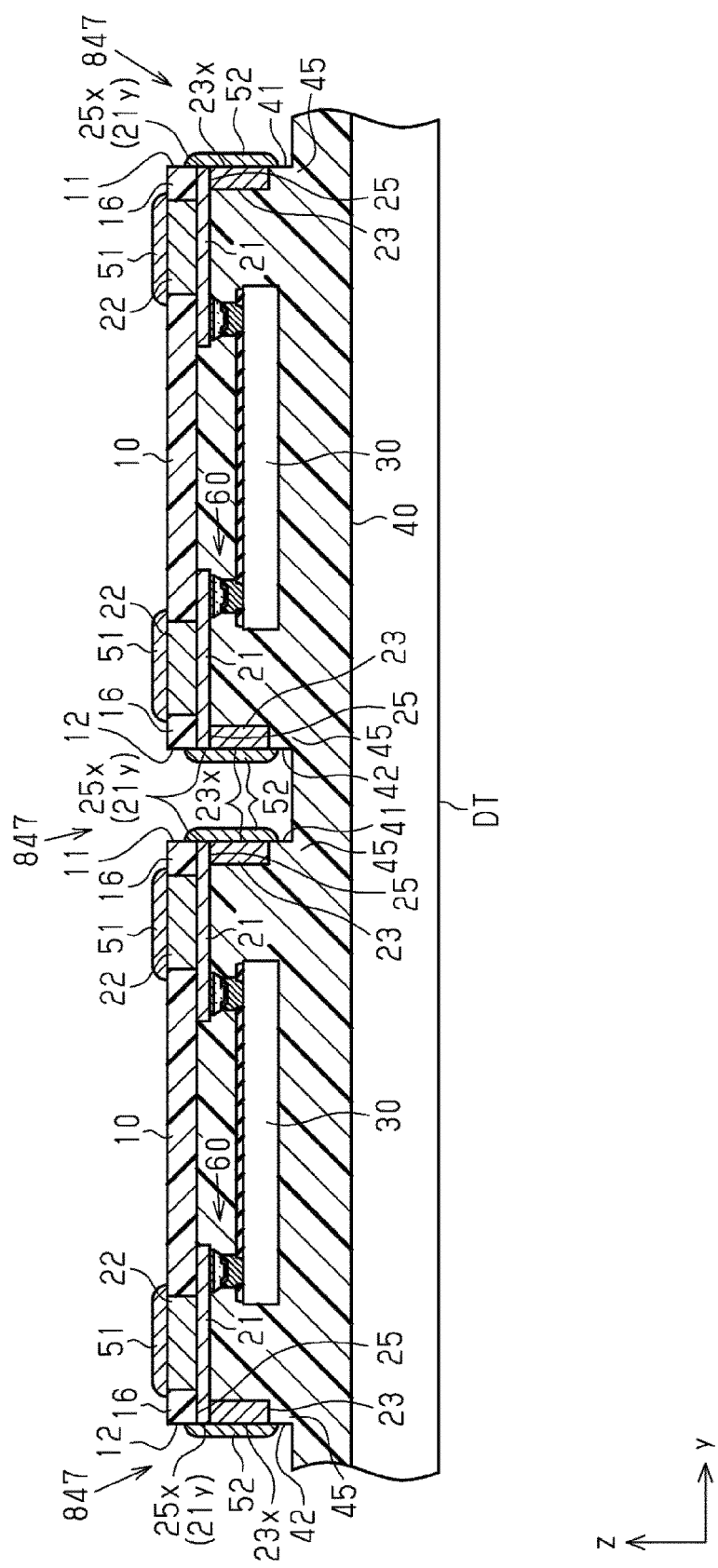
FIG. 23 is a view illustrating an example of a step of the manufacturing process according to the manufacturing method of the semiconductor device.

As depicted in FIG. 23, a first external electrode 51 is formed on the lower face 22r of the through-wires 22 exposed from the substrate 810 and a second external electrode 52 is formed on the exposed side faces 23x of the column conductors 23 and the end faces 21y of the main face wires 21 exposed from the resin layer 840. The second external electrodes 52 are formed in the separation grooves 847. The first external electrodes 51 and the second external electrodes 52 are each formed from a plating metal. For example, the first external electrodes 51 and the second external electrodes 52 are each formed by depositing plating metals, for example, Ni, Pd, and Au in this order, by electroless plating. In this manner, the step depicted in FIG. 23 corresponds to an external electrode formation step. It is to be noted that the structure and the formation method of the first external electrodes 51 and the second external electrodes 52 are not limitative.

Figure 24:
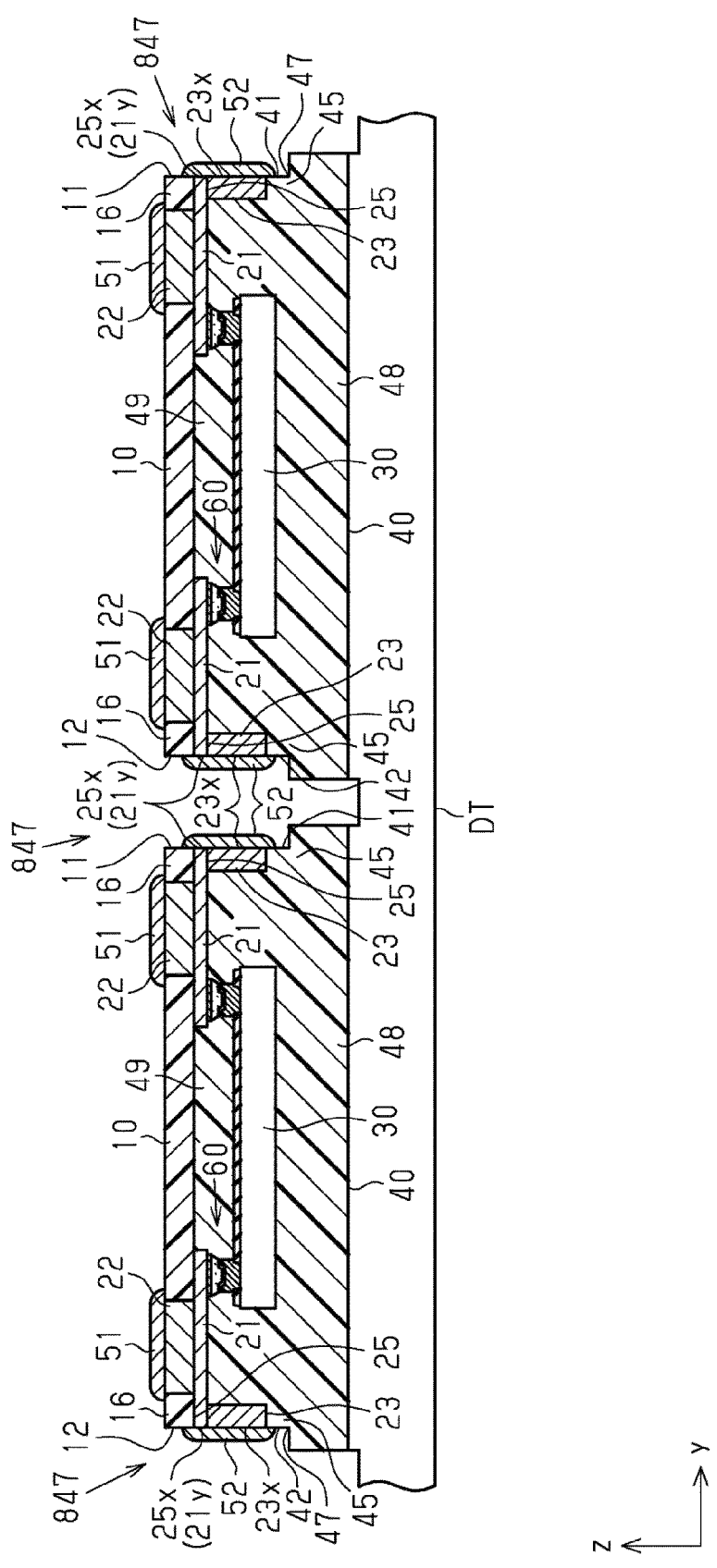
FIG. 24 is a view illustrating an example of a step of the manufacturing process according to the manufacturing method of the semiconductor device.

As depicted in FIG. 24, the resin layer 840 is divided into pieces in which a semiconductor element 30 is one unit. Upon the division, for example, a dicing blade having a width smaller than that of the dicing blade used for half cutting of the resin layer 840 is operated to cut in from the separation groove 847 of the resin layer 840 to the dicing tape DT along the cutting line (broken line) depicted in FIG. 21, to cut the resin layer 840. The piece formed by cutting is a semiconductor device including the substrate 10 and the sealing resin 40. In other words, the stepped portion 47 of the resin layer 840 is formed by cutting in from the resin layer 840 to the dicing tape DT with use of the dicing blade having a width smaller than that of the dicing blade used to half cut the resin layer 840. The sealing resin 40 is formed by this. More particularly, as the sealing resin 40, the resin side faces 41 to 44, the conductor cover portion 45, the first resin portion 48, and the second resin portion 49 are formed. In this manner, the steps depicted in FIGS. 21 and 22 correspond to a second cutting state. The semiconductor device 1A can be manufactured by the steps described above.

(Action)

Now, action of the present embodiment is described.

Figure 25:
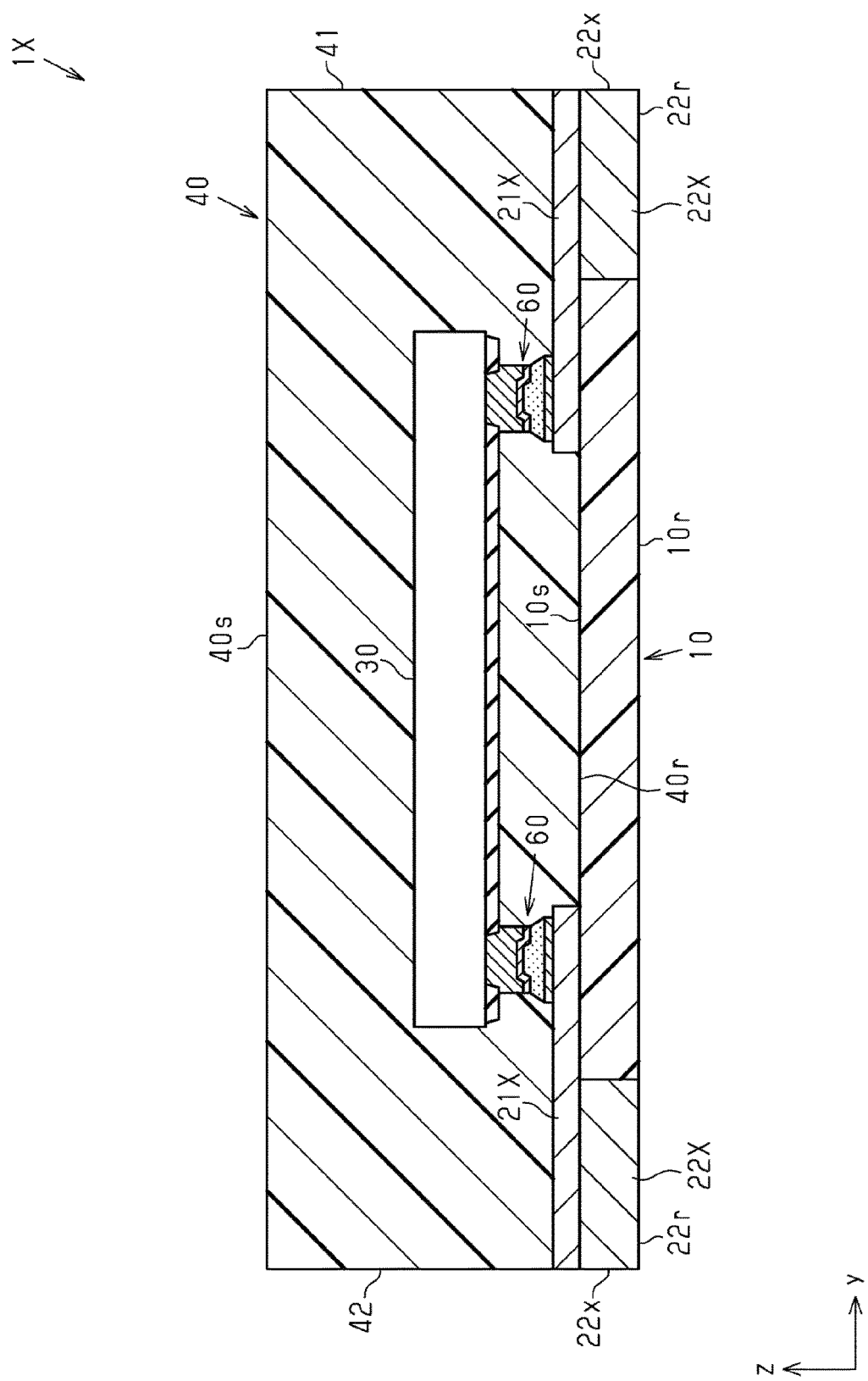
FIG. 25 is a schematic sectional view of a semiconductor device of a comparative example.
Figure 26:
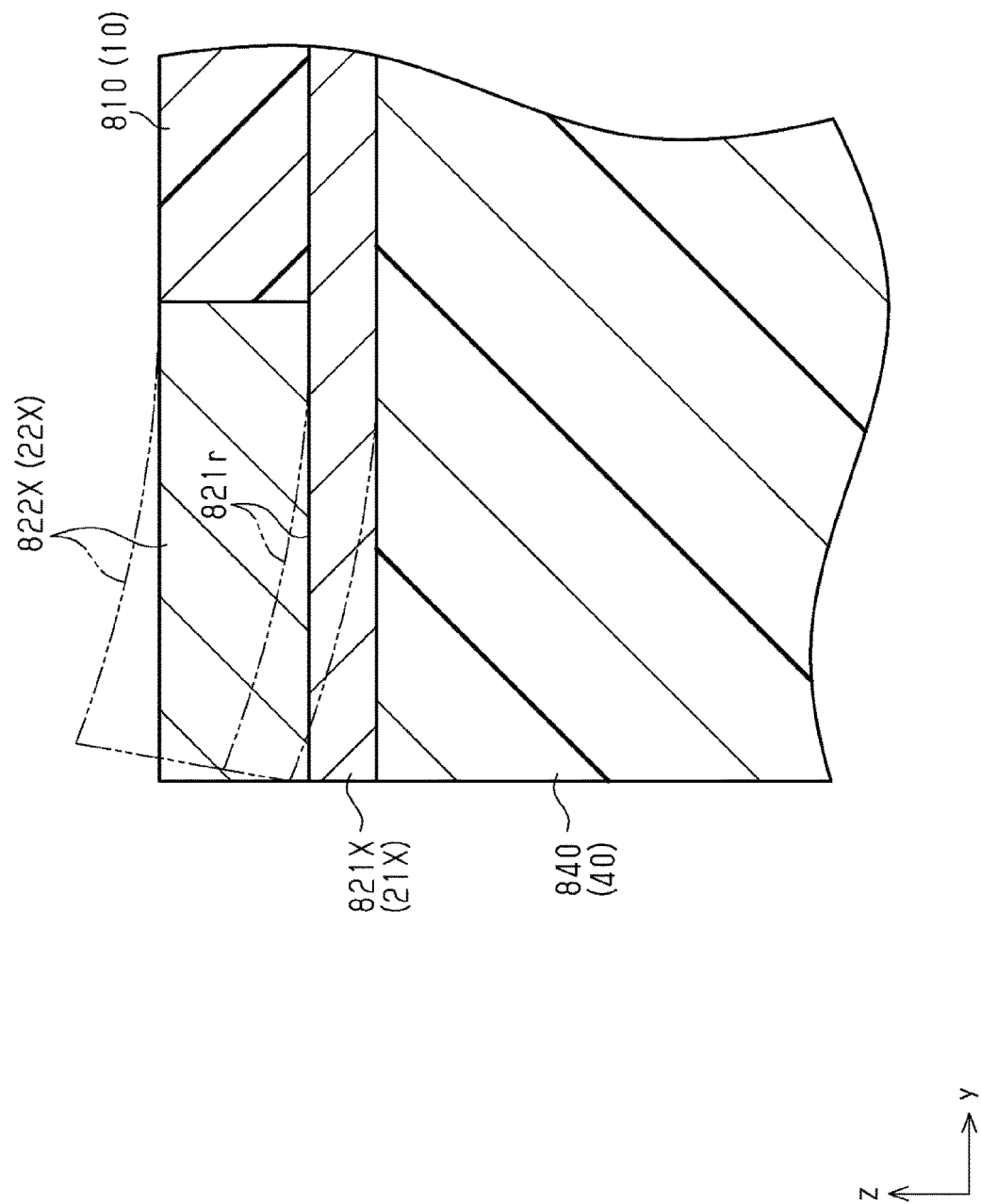
FIG. 26 is an enlarged view of a through-wire of FIG. 25 and peripheral portions of the same.
Figure 27:
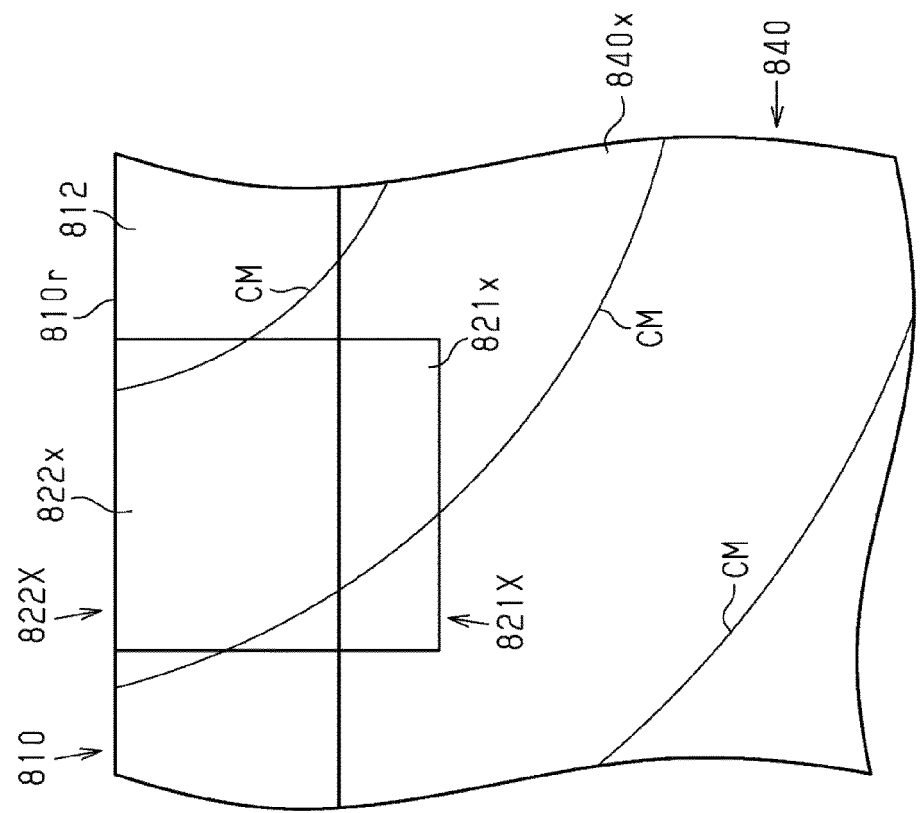
FIG. 27 is an enlarged view of a main face wire of the semiconductor device of the comparative example and peripheral portions of the same as viewed from a resin side face of a sealing resin.

FIGS. 25 to 27 depict a semiconductor device 1X of a comparative example to described the action. FIG. 25 is a sectional view of the semiconductor device 1X of the comparative example. Further, FIG. 26 is an enlarged view of a through-wire 22X and peripheral portions when the semiconductor device 1X is divided into pieces by dicing. Further, FIG. 27 is a side elevational view of part of the semiconductor device 1X after the semiconductor device 1X is divided into pieces by dicing.

Figure 28:
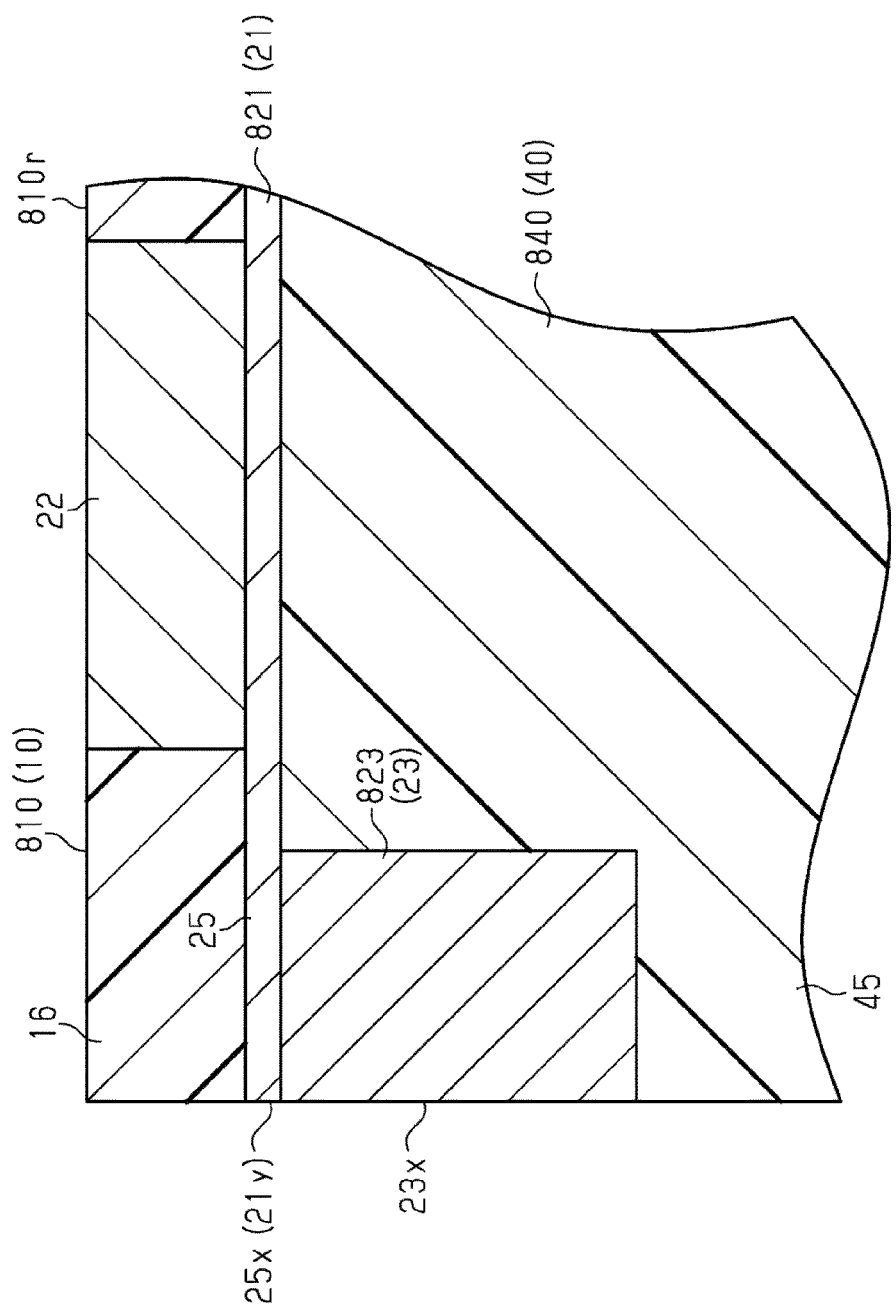
FIG. 28 is an enlarged view of a through-wire of the semiconductor device of the first embodiment and peripheral portions of the same.
Figure 29:
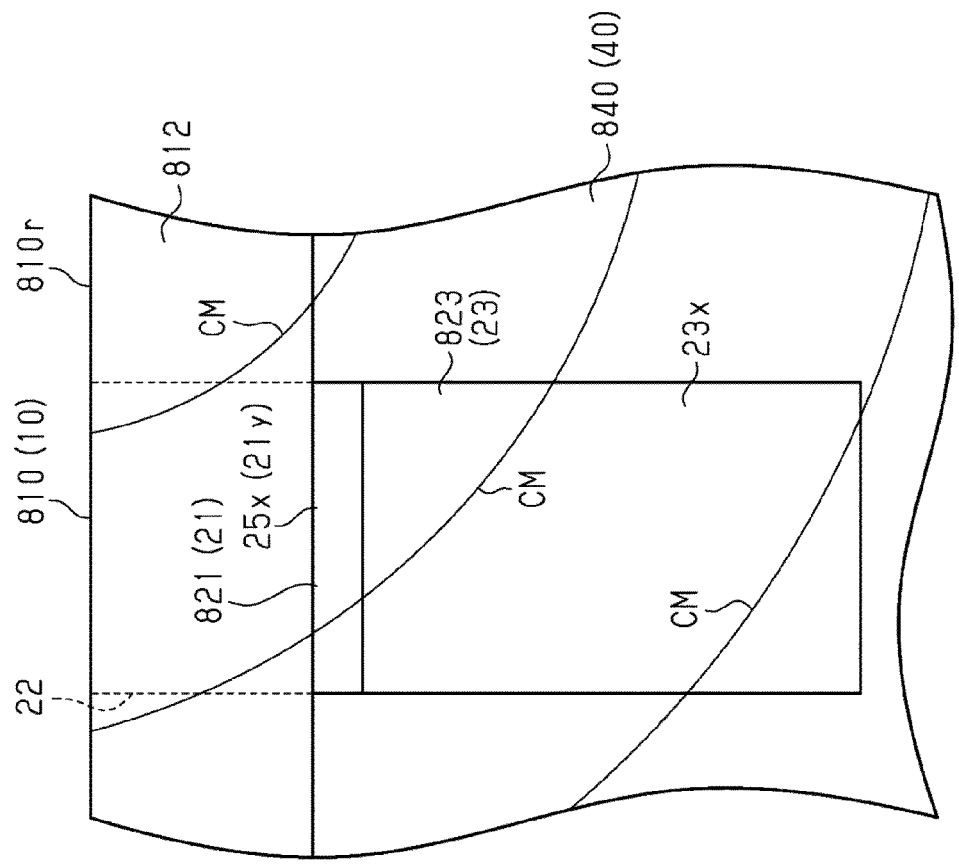
FIG. 29 is an enlarged view of a main face wire of the semiconductor device of the first embodiment and peripheral portions of the same as viewed from a resin side face of a sealing resin.
Figure 30:
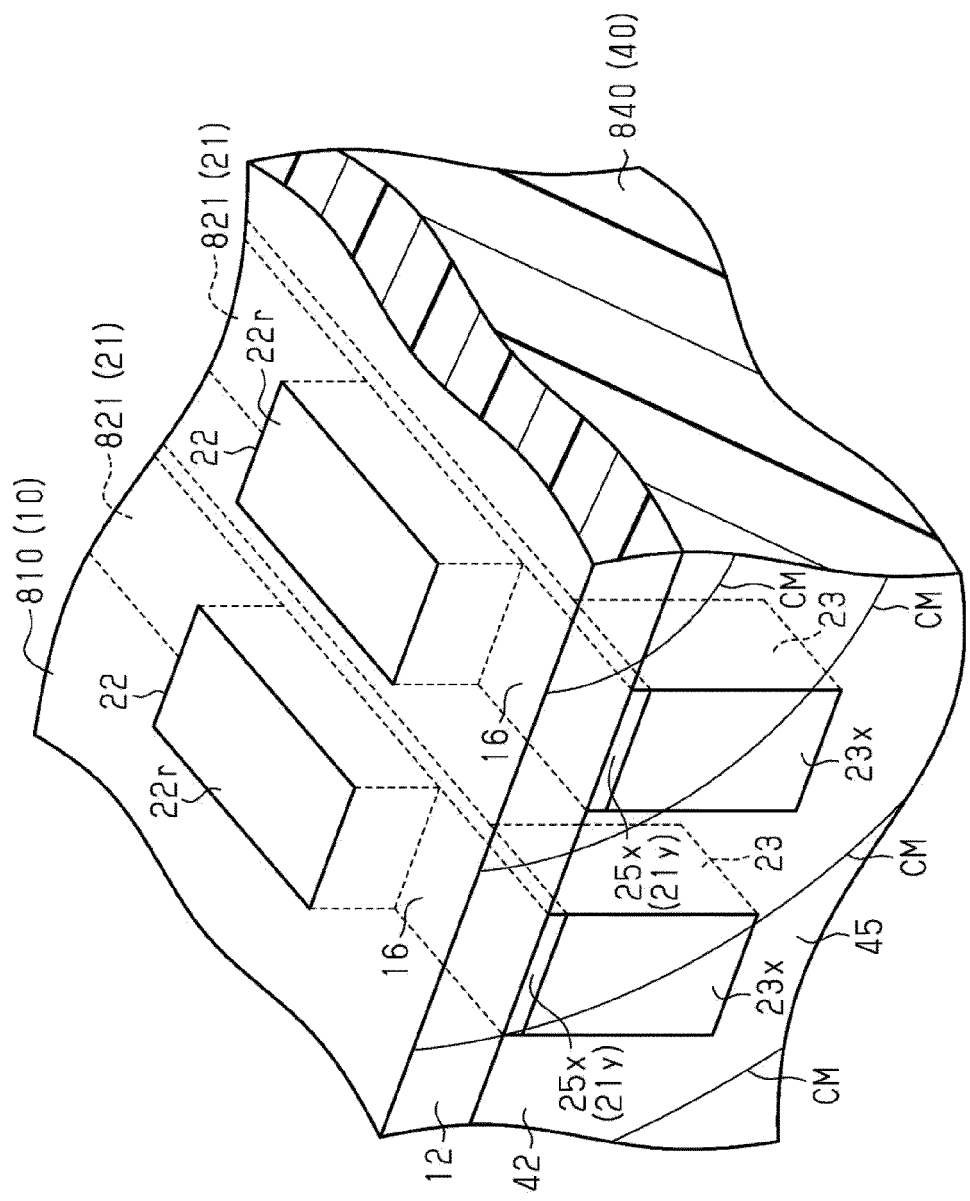
FIG. 30 is a perspective view depicting part of the semiconductor device of the first embodiment.

FIGS. 28 to 30 depict the semiconductor device 1A of the present embodiment. FIG. 28 is an enlarged view of a through-wire of the semiconductor device 1A of the present embodiment and peripheral portions of the same. FIG. 29 is a side elevational view of part of the semiconductor device 1A after the semiconductor device 1A is divided into pieces by dicing, and FIG. 30 is a perspective view of part of the semiconductor device 1A after the semiconductor device 1A is divided into pieces by dicing.

As depicted in FIG. 25, the semiconductor device 1X is different from the semiconductor device 1A of the present embodiment in that through-wires 22X are formed in a neighboring relation with the substrate side faces 11 to 14 (not depicted in FIG. 25) of the substrate 10 and that the column conductors 23 are omitted. Further, the semiconductor device 1X is different from the semiconductor device 1A of the present embodiment in that the main face wires 21X of the semiconductor device 1X do not protrude to the outer side farther than the through-wires 22X.

In the case where the semiconductor device 1X is mounted on the circuit board CB (refer to FIG. 8), the conductive bonding agent SD (refer to FIG. 8) is brought into contact with the lower face 22r of the through-wires 22X and the side faces 22x of the through-wires 22X exposed to the outside of the semiconductor device 1X, to form a fillet. Consequently, the mounted condition of the semiconductor device 1X on the circuit board CB by the conductive bonding agent SD can be viewed.

In the case where the semiconductor device 1X is divided into pieces by dicing, the sealing resin 40 of the semiconductor device 1X is fixed to a support base of the dicing apparatus by the dicing tape DT depicted in FIG. 21. In this state, the dicing blade is operated to cut in from the substrate 810 toward the resin layer 840 in the thickness direction z in a state in which the dicing blade is rotated. Consequently, arcuate cutting marks CM are formed individually on a substrate side face 812 of the substrate 810, an end face 821x of a main face wire 821X, an end face 822x of a through-wire 822X, and a resin side face 840x of the resin layer 840, which are cut faces of the semiconductor device 1X, for example, as depicted in FIG. 27. In the case where the semiconductor device 1X is cut by the dicing blade in this manner, there exist a location that is acted upon by force directed from a substrate rear face 810r of the substrate 810 toward a resin main face 840s of the resin layer 840 by the dicing blade and another location that is acted upon by force directed from the resin main face 840s of the resin layer 840 toward the substrate rear face 810r of the substrate 810 by the dicing blade.

In the case where the main face wire 821X and the resin layer 840 of the semiconductor device 1X are cut by the dicing blade, the force directed from the substrate rear face 810r of the substrate 810 toward the resin main face 840s of the resin layer 840 by the dicing blade is supported by the support base of the dicing apparatus. On the other hand, as depicted in FIG. 26, the substrate rear face 810r of the substrate 810 and the wire rear face 821r of the main face wire 821X are held down in the thickness direction z by no part. In this manner, in the case where the semiconductor device 1X is divided into pieces by the dicing blade, it is not supported against force directed from the resin main face 840s of the resin layer 840 toward the substrate rear face 810r of the substrate 810 by the dicing blade. Therefore, as depicted in FIG. 26, at the time of cutting of the main face wire 821X and the resin layer 840 by the dicing blade, the main face wire 821X is sometimes lifted by the dicing blade and peeled off from the resin layer 840.

Further, in the case where a metal layer and a resin layer are bonded to each other, generally, the bonding force is smaller than the bonding force by bonding of a metal layer and another metal layer. In other words, a metal layer and a resin layer are liable to be peeled off from each other by external force. Therefore, in the case where the semiconductor device 1X is divided into pieces by dicing as depicted in FIG. 26, the main face wire 821X and the through-wire 822X are sometimes peeled off from the resin layer 840 due to the force in the thickness direction z that is applied when the dicing blade cuts the main face wire 821X, the through-wire 822X, and the resin layer 840.

Also in regard to bonding between a metal layer and another metal layer, in the case where the semiconductor device 1X is divided into pieces by dicing, peeling off sometimes occurs at the interface between the metal layer and the other metal layer bonded together. Especially, since a metal layer closer to the substrate rear face 810r of the substrate 810 is not supported by a different metal layer, the metal layer closer to the substrate rear face 810r side of the substrate 810 is more liable to be peeled off. In the semiconductor device 1X, peeling off is liable to occur between the metal layer 821a and the conductive layer 821b of the main face wire 821X.

Taking this into consideration, in the present embodiment, the side face 22x of the through-wires 22 is provided in the inside of the substrate 10 such that it is not exposed from the substrate side faces 11 to 14 of the substrate 10 (for example, refer to FIG. 28). In addition, the column conductor 23 is provided on the upper face 21s of the main face wire 21. The column conductors 23 have the exposed side face 23x that is exposed from the resin side faces 41 to 44 of the sealing resin 40. The upper face 23s of the column conductors 23 is covered with the sealing resin 40. Further, the main face wires 21 and the column conductors 23 are sandwiched by the substrate 10 and the sealing resin 40 in the thickness direction z. In other words, the main face wires 21 and the column conductors 23 are sandwiched in the thickness direction z by the substrate outer peripheral portion 16 of the substrate 10 and the conductor cover portion 45 of the sealing resin 40, which are in close contact with each other.

In such a configuration as described above, in the case where the semiconductor device 1A is divided into pieces by dicing, when the dicing blade cuts the substrate 810, the main face wire 821, the column conductor 823, and the resin layer 840, arcuate cutting marks CM are formed on the cut faces of the substrate 810, the main face wire 821, the column conductor 823, and the resin layer 840 as depicted in FIGS. 29 and 30. Therefore, similarly as in the dividing into pieces of the semiconductor device 1X, there exist a location that is acted upon by force directed from the substrate rear face 810r of the substrate 810 toward the resin main face 840s of the resin layer 840 by the dicing blade and another location that is acted upon by force directed from the resin main face 840s of the resin layer 840 toward the substrate rear face 810r of the substrate 810 by the dicing blade.

Here, the force directed from the substrate rear face 810r of the substrate 810 toward the resin main face 840s of the resin layer 840 by the dicing blade is supported by the support base of the dicing apparatus similarly as in the dividing into pieces of the semiconductor device 1X by dicing.

On the other hand, in the case where force directed from the resin main face 840s of the resin layer 840 toward the substrate rear face 810r of the substrate 810 by the dicing blade is applied to the main face wire 821 and the column conductor 823, the main face wire 821 and the column conductor 823 are supported by the substrate outer peripheral portion 16 of the substrate 10 that is in close contact with the sealing resin 40. More particularly, since the substrate 10 is in close contact with the sealing resin 40, in the case where force directed from the sealing resin 40 toward the substrate 10 is applied to the substrate outer peripheral portion 16, the substrate outer peripheral portion 16 is practically suppressed from being spaced from the resin rear face 40r of the sealing resin 40. Therefore, as depicted in FIG. 28, in the case where the semiconductor device 1A is divided into pieces by dicing, when the dicing blade cuts the substrate 810, main face wire 821, column conductor 823 and resin layer 840, the substrate 10 (substrate outer peripheral portion 16) and the sealing resin 40 (conductor cover portion 45) support the main face wire 21 and the column conductor 23 so as not to be moved in the thickness direction z by force that is applied to the main face wire 821 and the column conductor 823 and is directed from the substrate rear face 810r of the substrate 810 toward the resin main face 840s of the resin layer 840. Consequently, the main face wire 21 and the column conductor 23 are practically suppressed from being peeled off from the substrate 10 or the sealing resin 40.

Further, as depicted in FIG. 8, in the case where the semiconductor device 1A is mounted on the circuit board CB, the conductive bonding agent SD is brought into contact with the second external electrode 52 that covers the exposed side face 23x of the column conductor 23, to form a fillet. Accordingly, the mounted state of the semiconductor device 1A on the circuit board CB by the conductive bonding agent SD can be viewed.

Advantageous Effect

According to the present embodiment, the following advantageous effects are achieved.

The column conductor 23 is supported from the opposite sides thereof in the thickness direction z by the substrate 10 and the sealing resin 40. According to this structure, in the case where the sealing resin 40 and the column conductor 23 are cut by dicing, the column conductor 23 can be practically suppressed from being peeled off from the sealing resin 40. In addition, the seed layer 23a and the plating layer 23b of the column conductor 23 can be practically suppressed from being peeled off.

(1-2) The end face 21y of the main face wires 21 is exposed from the resin side faces 41 to 44 of the sealing resin 40. According to the present configuration, since the length of the second external electrodes 52 in the thickness direction z can be increased, in the case where the semiconductor device 1A is mounted on the circuit board CB by the conductive bonding agent SD, the fillet by the conductive bonding agent SD becomes great. Accordingly, the reliability of mounting the semiconductor device 1A on the circuit board CB can be enhanced, and the mounted state of the semiconductor device 1A on the circuit board CB by the conductive bonding agent SD can be viewed easily.

(1-3) The lower end edge 52x of the second external electrode 52 is positioned lower than the substrate main face 10s of the substrate 10. According to this configuration, since the length of the second external electrode 52 in the thickness direction z can be increased, the reliability of mounting the semiconductor device 1A on the circuit board CB can be enhanced further, and the mounted state of the semiconductor device 1A on the circuit board CB by the conductive bonding agent SD can be viewed easily.

(1-4) Since the first external electrode 51 and second external electrode 52 and the rand portion RD of the circuit board CB are electrically connected by the conductive bonding agent SD, as the total area of the first external electrodes 51 and the second external electrodes 52 increases, the reliability of the electric connection between the first external electrodes 51 and second external electrodes 52 and the rand portion RD increases.

On the other hand, as the second external electrode 52 increases in the thickness direction z, it is necessary to make the height (thickness) of the conductive bonding agent SD to be applied to the rand portion RD of the circuit board CB greater in the thickness direction z. If the conductive bonding agent SD is made thicker, then, at the time of mounting the semiconductor device 1A, there is a possibility that the conductive bonding agent SD expands in a direction orthogonal to the thickness direction z until it comes into contact with a neighboring first external electrode 51.

In this connection, in the present embodiment, as viewed from the thickness direction z, the length of the first external electrode 51 in a direction orthogonal to the direction in which the first external electrodes 51 are arrayed is greater than the length of the second external electrode 52 in the thickness direction z. According to this configuration, by reducing the length of the second external electrode 52 in the thickness direction z, the conductive bonding agent SD can be suppressed from coming into contact with a neighboring first external electrode 51. In addition, by increasing the length of the first external electrodes 51, the total area of the first external electrodes 51 and the second external electrodes 52 can be increased, and the reliability of electric connection between the first external electrodes 51 and second external electrodes 52 and the rand portion RD by the conductive bonding agent SD can be increased. It is to be noted that the thickness of the second external electrode 52 can be designed freely up to approximately 100 µm. In the case where the second external electrode 52 is made thick, there is a possibility that the mounting area is reduced. In this case, the design is advanced taking also warp, plating growth time, and the influence on implementation reliability into consideration.

(1-5) The main face wires 21, the through-wires 22, and the column conductors 23 are each formed by electrolytic plating. In other words, the internal electrode 20 is formed by electrolytic plating. Meanwhile, the first external electrodes 51 and the second external electrodes 52 are each formed by electroless plating. Accordingly, the semiconductor device 1A is formed using wiring by a plating process and does not use a lead frame formed from a metal plate. Wires by a plating process can be made thinner than those in the case where a lead frame structure is adopted. Accordingly, reduction in thickness of the semiconductor device 1A can be realized. In addition, although high integration of ICs and LSI increases the number of terminals and necessitates refinement of the internal electrode and so forth, in the case where a lead frame is used, since a metal plate is worked, there is a limitation to the refinement. In contrast, the semiconductor device 1A of the present embodiment can cope also with refinement because the internal electrode 20 is formed by a plating process. Accordingly, a semiconductor device having an increased number of terminals can be manufactured.

In the case where the main face wires 21 and the column conductors 23 are each formed by electrolytic plating in this manner, since the main face wires 21 and the column conductors 23 are soft in comparison with those of the configuration in which the main face wires and the column conductors are formed from a lead frame, when the main face wires 21 and the column conductors 23 are cut by the dicing blade, the main face wires 21 and the column conductors 23 are liable to be deformed. In other words, the main face wires 21 and the column conductors 23 formed by electrolytic plating are less liable to be peeled off from the sealing resin 40 by the dicing blade in comparison with those of the configuration in which the main face wires and the column conductors are formed from a lead frame.

However, since the present embodiment adopts the configuration in which the main face wires 21 and the column conductors 23 are sandwiched in the thickness direction z by the substrate outer peripheral portion 16 of the substrate 10 and conductor cover portion 45 of the sealing resin 40, the substrate 10 and the sealing resin 40 being in close contact with each other, the main face wires 21 and the column conductors 23 can be practically suppressed from being peeled off from the sealing resin 40.

Second Embodiment

A semiconductor device 1B according to the second embodiment of the present disclosure is described with reference to FIGS. 31 to 48. The semiconductor device 1B of the present embodiment is different from the semiconductor device 1A of the first embodiment principally in that the semiconductor device 1B includes an insulating layer 70 in place of the substrate 10 and also in the configuration of the internal electrode 20. In the following description, elements similar to those of the semiconductor device 1A of the first embodiment are denoted by the same reference signs, and description of them is suitably omitted.

(Configuration of Semiconductor Device)

Figure 31:
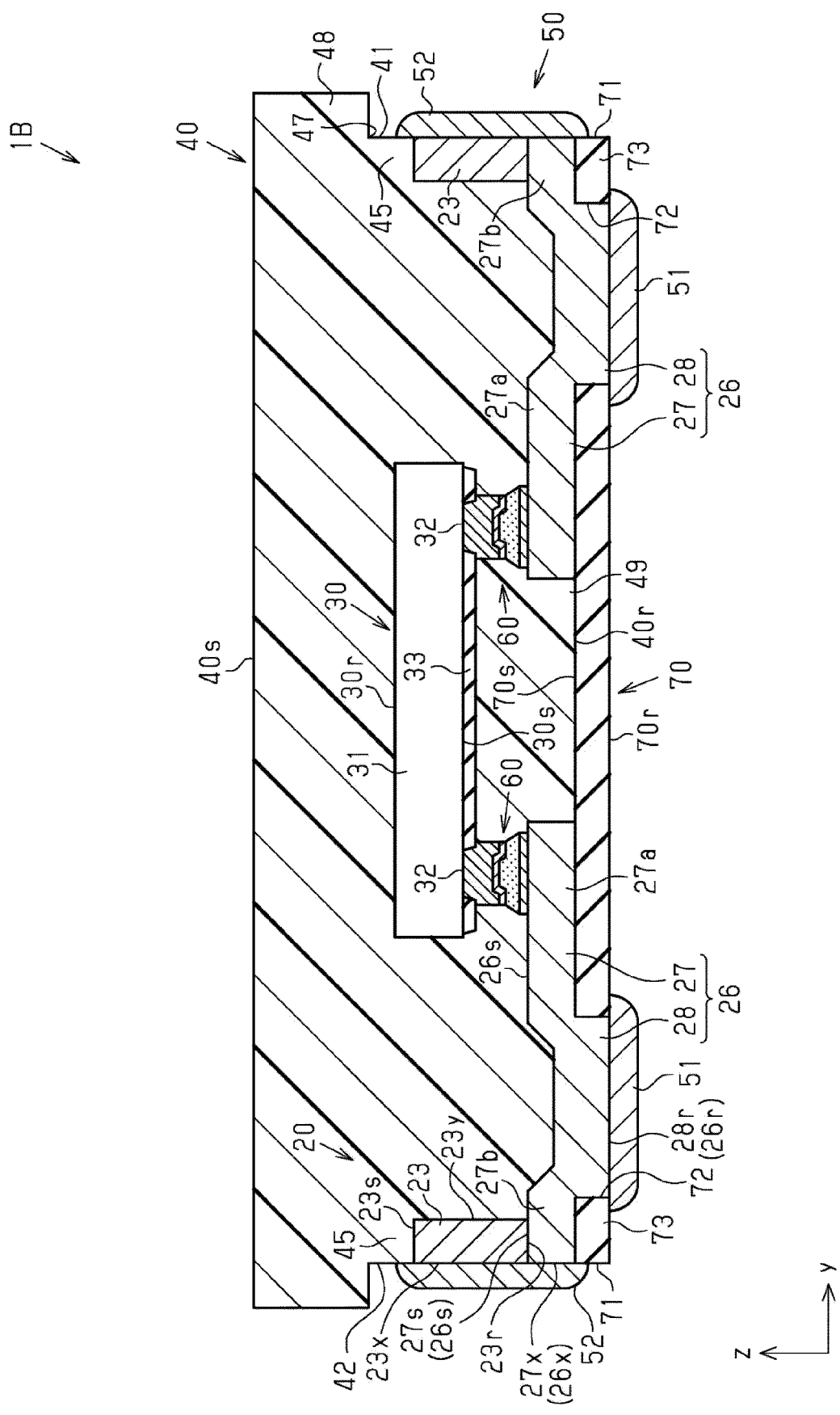
FIG. 31 is a schematic sectional view of a semiconductor device of a second embodiment.

As depicted in FIG. 31, an insulating layer 70 that is an example of an insulating member is formed from a material having an insulating property and is formed, for example, from a polyimide resin or a phenol resin. The insulating layer 70 is provided on a lower face side (bottom face side) of the semiconductor device 1B. In the present embodiment, the insulating layer 70 is arranged below the sealing resin 40 in the thickness direction z. Further, in the present embodiment, the shape of the insulating layer 70 as viewed from the thickness direction z is the same as the shape of the substrate 10 as viewed from the thickness direction z. The insulating layer 70 has an upper face 70s and a lower face 70r directed to the sides opposite to each other in the thickness direction z. Here, the upper face 70s is an example of an insulating main face, and the lower face 70r is an example of an insulating rear face. The upper face 70s of the insulating layer 70 corresponds to a main face of the insulating layer, and the lower face 70r of the insulating layer 70 corresponds to a rear face of the insulating layer. Further, the insulating layer 70 has side faces 71 provided between the upper face 70s and the lower face 70r in the thickness direction z and crossing the upper face 70s and the lower face 70r. In the present embodiment, the insulating layer 70 has four side faces 71 similar to the substrate side faces 11 to 14 of the substrate 10 of the first embodiment.

The upper face 70s of the insulating layer 70 is directed in a direction same as that of the element rear face 30r of the semiconductor element 30 in the thickness direction z and is opposed to the element main face 30s of the semiconductor element 30. The lower face 70r of the insulating layer 70 is directed in a direction same as that of the element main face 30s of the semiconductor element 30 in the thickness direction z. The insulating layer 70 has a plurality of through-holes 72 formed therein. The plurality of through-holes 72 extend through the insulating layer 70 in the thickness direction z. In the present embodiment, the plurality of through-holes 72 are provided such that four through-holes 72 are provided for each of the four side faces 71. The four through-holes 72 are arrayed in a direction in which the side faces 71 extend as viewed from the thickness direction z. The shape of the through-holes 72 as viewed from the thickness direction z is, for example, a rectangular shape. In the present embodiment, the shape of the through-holes 72 as viewed from the thickness direction z is such a rectangular shape that one of the first direction x and the second direction y is the long-side direction and the other of the first direction x and the second direction y is the short-side direction. More particularly, the shape of the through-holes 72 as viewed from the thickness direction z is such a rectangular shape that a direction orthogonal to the array direction of the four through-holes 72 is the long-side direction and the array direction of the four through-holes 72 is the short-side direction. It is to be noted that the shape of the through-holes 72 as viewed from the thickness direction z may otherwise be a circular shape, an elliptical shape, or a polygonal shape.

The internal electrode 20 includes a plurality of wiring layers 26 and a plurality of column conductors 23.

As depicted in FIG. 31, each of the wiring layers 26 has an upper face 26s and a lower face 26r directed to the sides opposite to each other in the thickness direction z. Here, the upper face 26s is an example of a wire main face, and the lower face 26r is an example of a wire rear face. The upper face 26s is directed in a direction same as that of the element rear face 30r of the semiconductor element 30, and the lower face 26r is directed to a direction same as that of the element main face 30s of the semiconductor element 30.

Each wiring layer 26 includes a main face wire 27 and a through-wire 28. In the present embodiment, the main face wire 27 and the through-wire 28 are formed integrally. The main face wire 27 is formed on the insulating layer 70. The through-wire 28 is formed in a through-hole 72 of the insulating layer 70.

The main face wires 27 arrayed spaced from each other in the second direction y extend longer than the through-wires 28 connected to the main face wires 27 in the first direction x. In the present embodiment, the four main face wires 27 arrayed spaced from each other in the first direction x in the proximity of the resin side face 41 of the sealing resin 40 and the four main face wires 27 arrayed spaced from each other in the first direction x in the proximity of the resin side face 42 each extend longer than the through-wires 28 connected to the main face wires 27 in the second direction y. More particularly, each of the main face wires 27 includes an inner side extension 27a extending toward the inner side than the through-wire 28 connected to the main face wire 27 in the second direction y and an outer side extension 27b that is an example of a side face side protrusion extending toward the outer side than the through-wire 28 connected to the main face wire 27 in the second direction y. The inner side extension 27a overlaps with the semiconductor element 30 in the thickness direction z. Of the outer side extension 27b, an end face 27x on the resin side faces 41 and 42 side of the sealing resin 40 (end face 26x of the wiring layer 26) is an exposed side face exposed from the resin side faces 41 and 42.

Further, though not depicted, the main face wires 27 arrayed spaced from each other in the second direction y extend longer than the through-wires 28 connected to the main face wires 27 in the first direction x. In the present embodiment, the four main face wires 27 arrayed spaced from each other in the second direction y in the proximity of the resin side face 43 of the sealing resin 40 and the four main face wires 27 arrayed spaced from each other in the second direction y in the proximity of the resin side face 44 each extend longer than the through-wires 28 connected to the main face wires 27 in the first direction x. More particularly, each of the main face wires 27 has an inner side extension 27a extending toward the inner side than the through-wire 28 connected to the main face wire 27 in the first direction x and an outer side extension 27b extending toward the outer side than the through-wire 28 connected to the main face wire 27 in the first direction x. The inner side extension 27a overlaps with the semiconductor element 30 in the thickness direction z. Of the outer side extension 27b, an end face 27x on the resin side faces 43 and 44 side of the sealing resin 40 (end face 26x of the wiring layer 26) is an exposed side face exposed from the resin side faces 43 and 44. In this manner, the main face wire 27 is provided such that it protrudes to the opposite sides of the through-wire 28 connected to the main face wire 27, in the direction in which the main face wire 27 extends.

The through-wires 28 are arranged on the inner side with respect to the four side faces 71 of the insulating layer 70. In particular, between the four through-wires 28 arrayed spaced from each other in the second direction y in the proximity of one of the two side faces 71 extending in the second direction y as viewed from the thickness direction z and the one side face 71 in the first direction x, an insulating outer peripheral portion 73 that is part of the insulating layer 70 intervenes, and between the four through-wires 28 arrayed spaced from each other in the second direction y in the proximity of the other side face 71 and the other side face 71 in the first direction x, another insulating outer peripheral portion 73 that is part of the insulating layer 70 intervenes. Further, between the four through-wires 28 arrayed spaced from each other in the first direction x in the proximity of one of the two side faces 71 extending in the first direction x as viewed from the thickness direction z and the one side face 71 in the second direction y, a further insulating outer peripheral portion 73 that is part of the insulating layer 70 intervenes, and between the four through-wires 28 arrayed spaced from each other in the first direction x in the proximity of the other side face 71 and the other side face 71 in the second direction y, a still further insulating outer peripheral portion 73 that is part of the insulating layer 70 intervenes.

Figure 32:
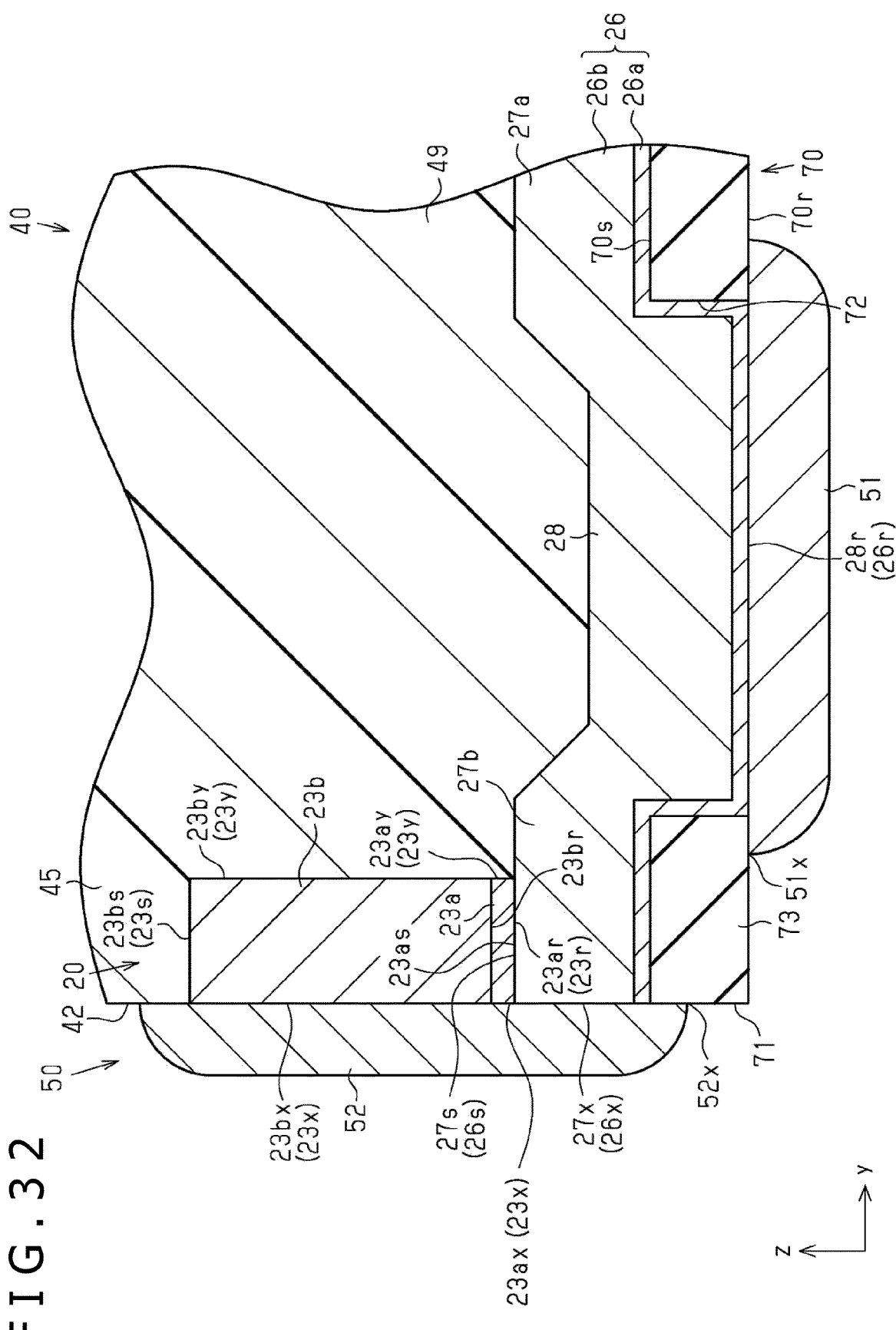
FIG. 32 is an enlarged view of an external electrode of FIG. 31 and peripheral portions of the same.

As depicted in FIG. 32, the wiring layer 26 includes a seed layer 26a and a plating layer 26b stacked one on another. The seed layer 26a is formed, for example, from a first layer containing Ti as a main ingredient and a second layer containing Cu as a main ingredient. The seed layer 26a has a thickness of substantially 200 to 800 nm. The plating layer 26b contains Cu as a main ingredient. The plating layer 26b has a thickness of approximately 20 to 50 μm. It is to be noted that the thickness of the seed layer 26a and the thickness of the plating layer 26b are not limited to those described above.

Each of the plurality of column conductors 23 protrudes in the thickness direction z from the upper face 26s of the wiring layer 26. More particularly, the column conductor 23 protrudes in the thickness direction z from an upper face 27s (upper face 26s) of the outer side extension 27b of the main face wire 27. The column conductor 23 has a configuration similar to that of the column conductor 23 of the first embodiment. Further, the plurality of column conductors 23 are covered at the upper face 23s thereof with the sealing resin 40, similarly as in the first embodiment. In other words, the sealing resin 40 has a conductor cover portion 45 that covers the upper face 23s of the column conductors 23.

The first external electrode 51 covers the overall area of a lower face 28r (lower face 26r) of the through-wire 28.

The second external electrode 52 covers the overall area of the exposed side face 23x of the column conductor 23 and the overall area of the end face 27x of the main face wire 27. The lower end edge 52x of the second external electrode 52 is positioned lower than the upper face 70s of the insulating layer 70. Further, the lower end edge 52x of the second external electrode 52 is positioned higher than the lower face 70r of the insulating layer 70.

(Manufacturing Method of Semiconductor Device)

A manufacturing method of the semiconductor device 1B according to the second embodiment of the present disclosure is described with reference to FIGS. 33 to 48. In the figures mentioned, the definitions of the directions are the same as the definitions of the directions depicted in FIGS. 1 to 5.

Figure 33:
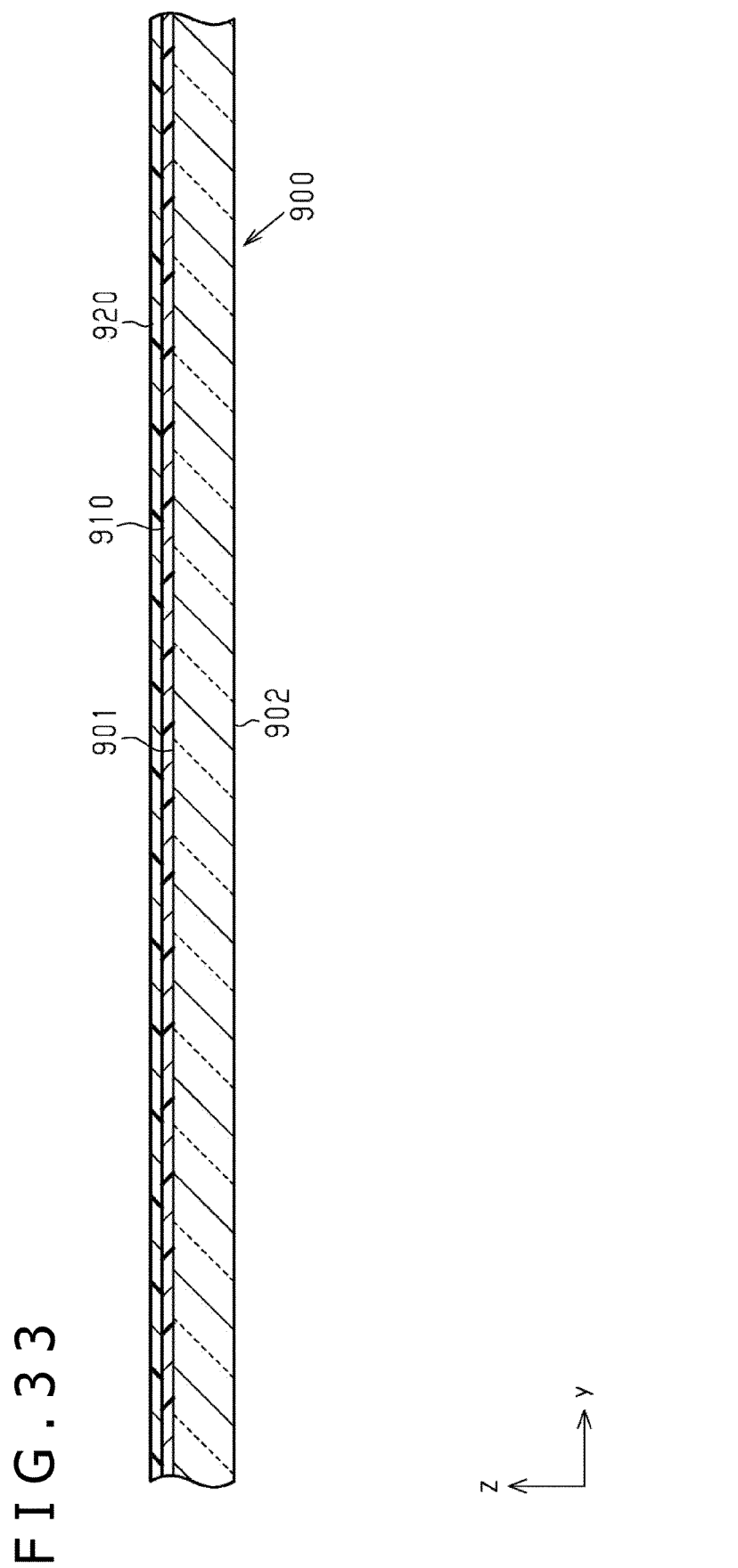
FIG. 33 is a view illustrating an example of a step of a manufacturing process according to a manufacturing method of the semiconductor device of the second embodiment.

First, a support substrate 900 having an upper face 901 and a lower face 902 directed to the sides opposite to each other in the thickness direction z is prepared as depicted in FIG. 33. The support substrate 900 is, for example, a glass substrate or a Si substrate. In the present embodiment, in the step of preparing a support substrate 900, a glass substrate having translucency is used as the support substrate 900. The thickness of the support substrate 900 is approximately 0.5 μm. Then, a temporary fixing material 910 is formed on an upper face 901 of the support substrate 900. In the process of forming the temporary fixing material 910, the temporary fixing material 910 is formed so as to cover the overall area of the upper face 901 of the support substrate 900. Then, a sputter film 920 is formed on the temporary fixing material 910. In the process of forming the sputter film 920, the sputter film 920 is formed so as to cover the overall area of the temporary fixing material 910. The sputter film 920 is a metal film in which the main ingredient is Ti.

Figure 34:
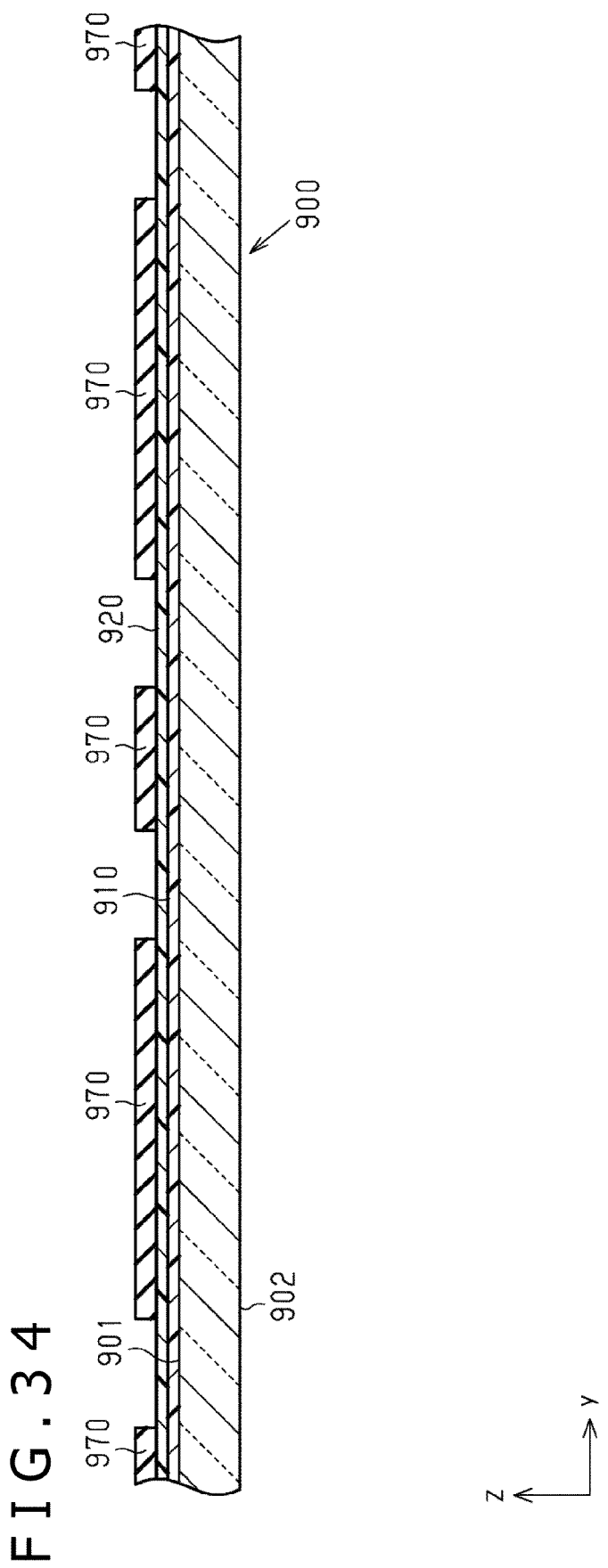
FIG. 34 is a view illustrating an example of a step of the manufacturing process according to the manufacturing method of the semiconductor device.

Then, an insulating layer 970 is formed as depicted in FIG. 34. The insulating layer 970 corresponds to the insulating layer 70 of the semiconductor device 1B (refer to FIG. 29). The insulating layer 970 is an insulating film made of a photosensitive resin material such as a polyimide resin or a phenol resin, for example. In the step of forming the insulating layer 970, for example, a spin coater (rotary coating apparatus) is used to apply the insulating layer 970 to the sputter film 920. It is to be noted that a photosensitive resin material in the form of a film may be pasted. Then, exposure and development are performed for the photosensitive resin material to perform patterning. The insulating layer 970 is thereby formed. In this manner, the step depicted in FIG. 32 corresponds to an insulating member formation step.

Figure 35:
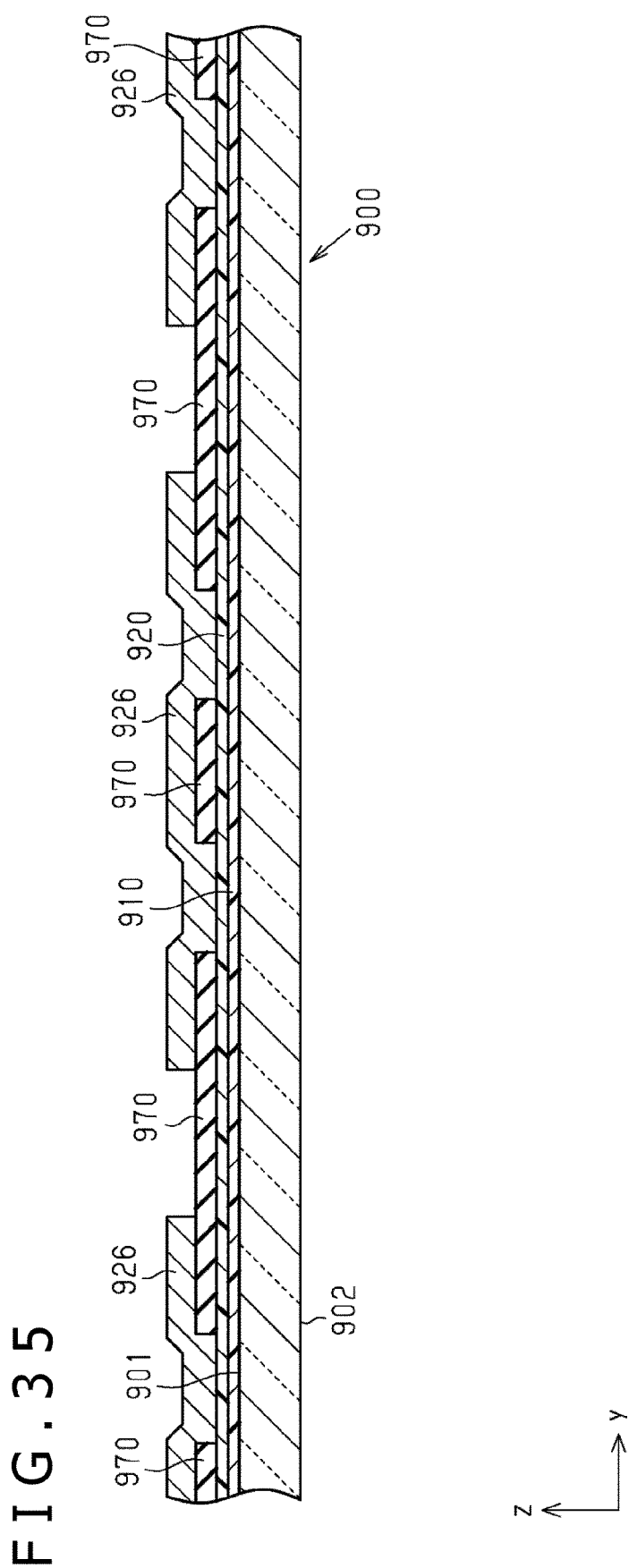
FIG. 35 is a view illustrating an example of a step of the manufacturing process according to the manufacturing method of the semiconductor device.

Then, a wiring layer 926 is formed as depicted in FIG. 35.

Figure 36:
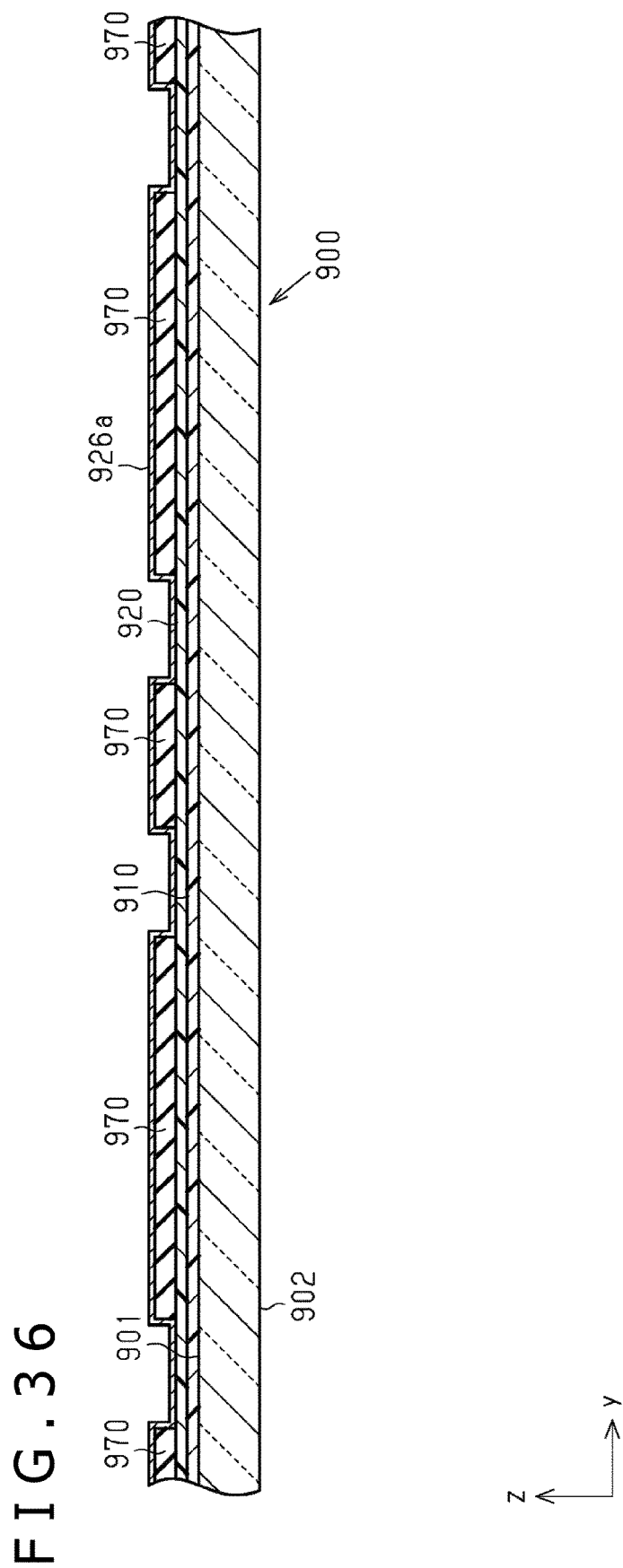
FIG. 36 is a view illustrating an example of a step of the manufacturing process according to the manufacturing method of the semiconductor device.

In particular, a seed layer 926a is formed first as depicted in FIG. 36. Part of the seed layer 926a later corresponds to part of the internal electrode 20 of the semiconductor device 1B (in particular, to the seed layer 26a of the wiring layer 26). The formation of the seed layer 926a is performed by a sputtering method. The seed layer 926a is formed over an overall area of the support substrate 900 on the upper face 901 side. The seed layer 926a of the present embodiment includes a Ti layer and a Cu layer stacked one on the other. In the step of forming the seed layer 926a, a Ti layer in contact with the insulating layer 970 and the sputter film 920 is formed first, and then, a Cu layer in contact with the Ti layer is formed.

Figure 37:
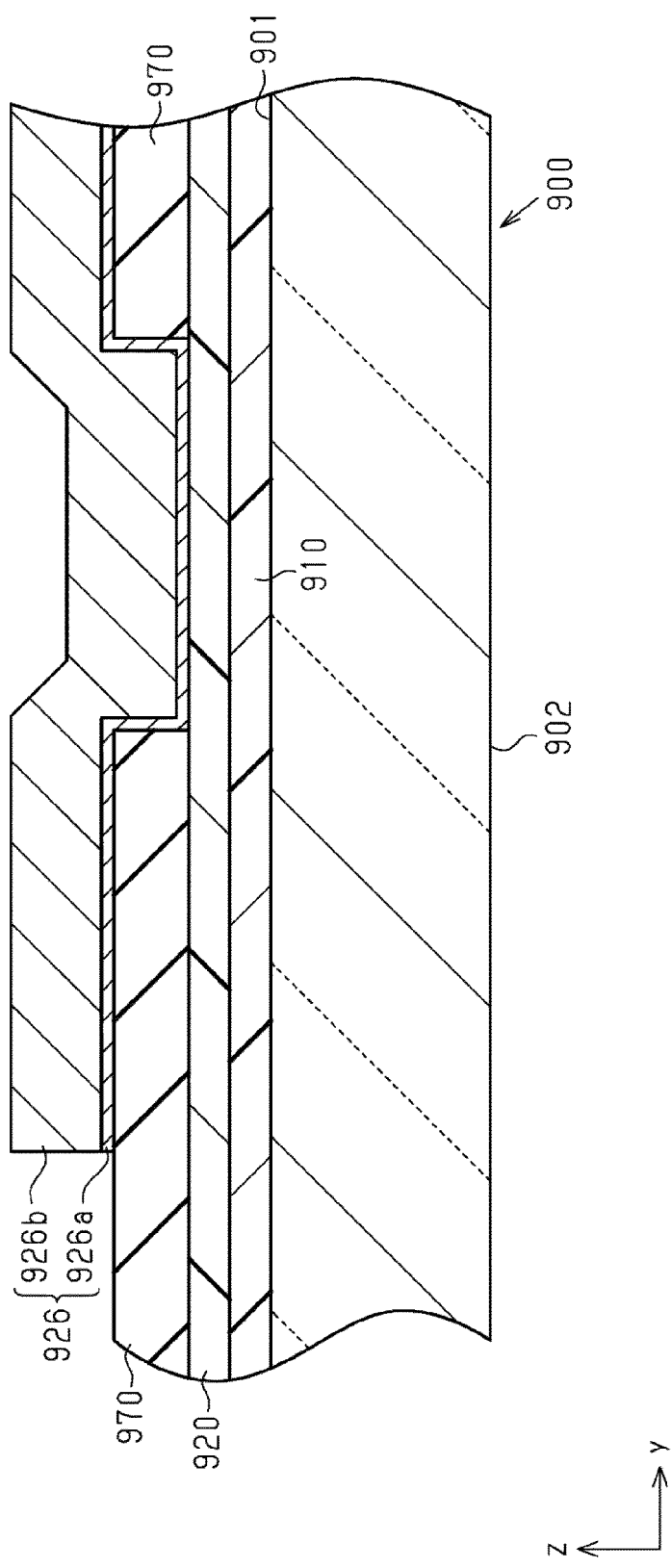
FIG. 37 is an enlarged view of part of a main face wire of FIG. 35 and peripheral portions of the same.

Then, a plating layer 926b is formed as depicted in FIG. 37. FIG. 37 depicts the plating layer 926b formed at part of the seed layer 926a. The wiring layer 926 depicted in FIG. 37 has a stacked structure of the seed layer 926a and the plating layer 926b.

As depicted in FIG. 37, the plating layer 926b corresponds to part of the internal electrode 20 of the semiconductor device 1B (in particular, to the plating layer 26b of the wiring layer 26). The plating layer 926b is formed by pattern formation by photolithography and electrolytic plating. In the step of forming the plating layer 926b, a resist layer (omitted from illustration) for forming the plating layer 926b is formed by photolithography first. In the formation of the resist layer, photosensitive resist is applied so as to cover the overall area of the seed layer 926a, and exposure and development are performed for the photosensitive resist to perform patterning. By this patterning, part of the seed layer 926a (portion at which the plating layer 926b is to be formed) is exposed. Then, a plating layer 926b is formed on the exposed seed layer 926a by electrolytic plating in which the seed layer 926a is used as a conductive path. Thereafter, the resist layer is removed to form the plating layer 926b depicted in FIG. 37.

Then, the unnecessary seed layer 926a that is not covered with the plating layer 926b is removed entirely as depicted in FIG. 37. The removal of the unnecessary seed layer 926a is performed by wet etching. In this wet etching, for example, mixed solution of $H_2SO_4$ and $H_2O_2$ is used. By the step of removing the unnecessary seed layer 926a, the insulating layer 970 is exposed from the portion from which the seed layer 926a is removed. Further, by the removal of the unnecessary seed layer 926a, a wiring layer 926 including the seed layer 926a and the plating layer 926b is formed. The wiring layer 926 corresponds to the wiring layer 26 (refer to FIG. 31) of the internal electrode 20 of the semiconductor device 1B. In this manner, the steps depicted in FIGS. 35 to 37 correspond to a first internal electrode formation step.

Figure 38:
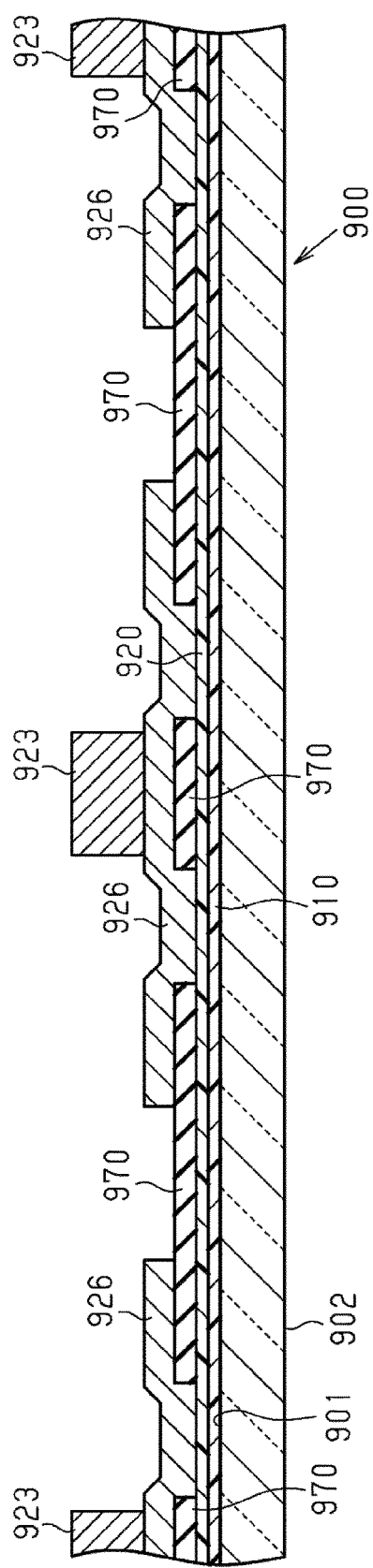
FIG. 38 is a view illustrating an example of a step of the manufacturing process according to the manufacturing method of the semiconductor device.

Then, column conductors 923 are formed as depicted in FIG. 38.

Figure 39:
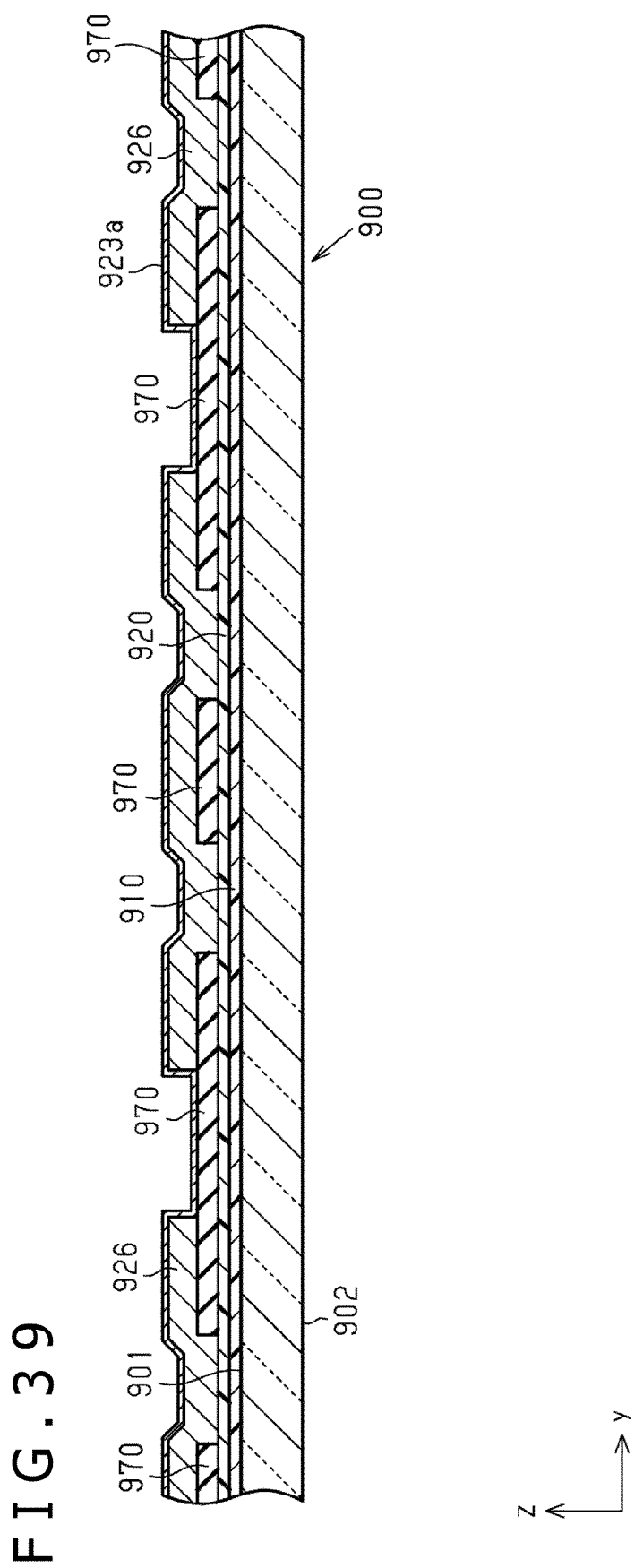
FIG. 39 is a view illustrating an example of a step of the manufacturing process according to the manufacturing method of the semiconductor device.

In particular, a seed layer 923a is formed first as depicted in FIG. 39. Part of the seed layer 923a later corresponds to part of the internal electrode 20 of the semiconductor device 1B (in particular, to the seed layer 23a of the column conductor 23). For the formation of the seed layer 923a, a sputtering method is used. The seed layer 923a is formed over an overall area of the support substrate 900 on the upper face 901 side. In the present embodiment, the seed layer 923a includes a Ti layer and a Cu layer stacked one on the other. In the step of forming the seed layer 923a, a Ti film in contact with one of the insulating layer 970 and the plating layer 926b is formed first, and then, a CU layer in contact with the Ti layer is formed.

Figure 40:
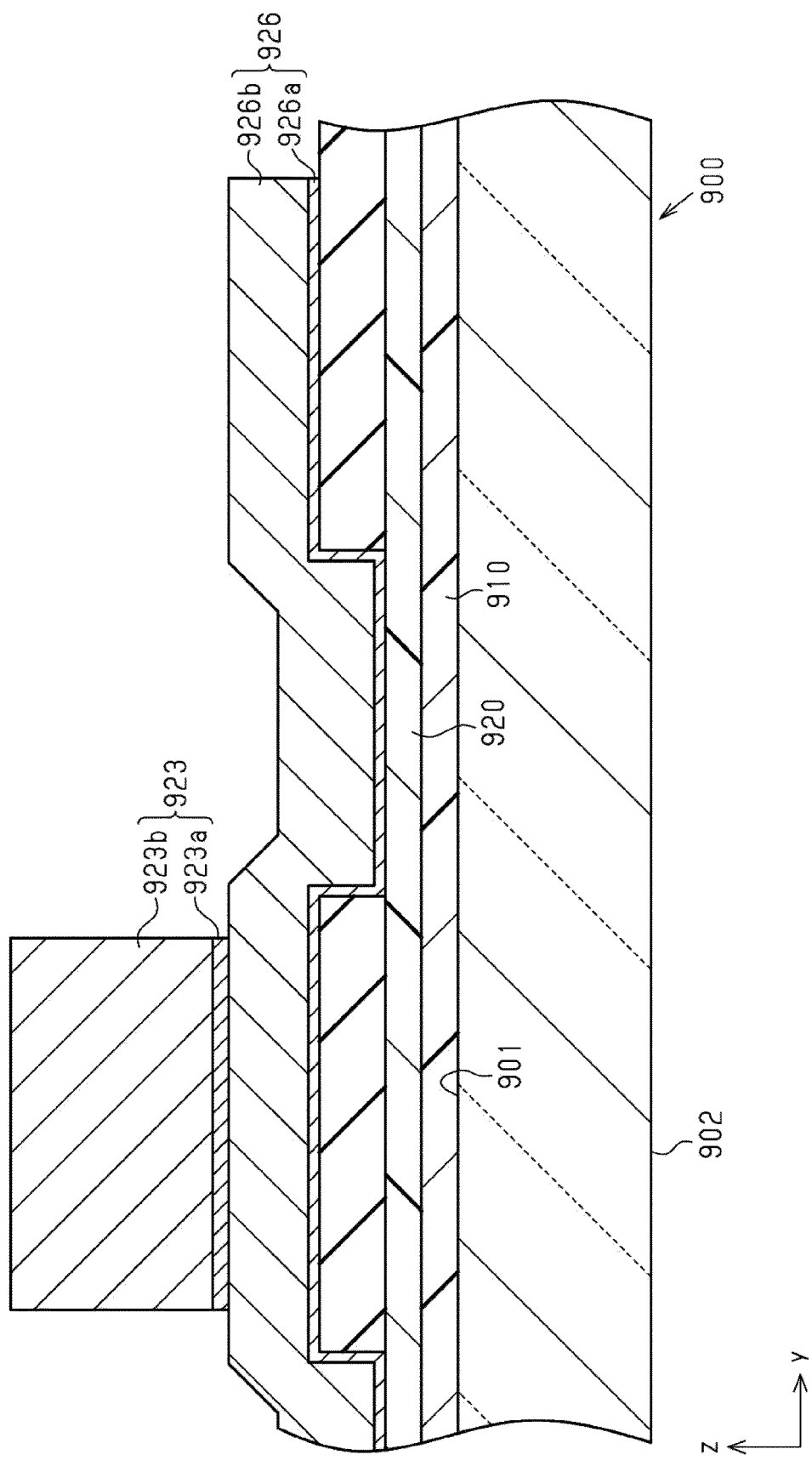
FIG. 40 is an enlarged view of a column conductor of FIG. 38 and peripheral portions of the same.

Then, a plating layer 923b is formed as depicted in FIG. 40. In FIG. 40, the plating layer 923b formed at part of the seed layer 923a is depicted. The column conductor 923 depicted in FIG. 40 has a stacked structure of the seed layer 923a and the plating layer 923b.

As depicted in FIG. 40, the plating layer 923b corresponds to part of the internal electrode 20 of the semiconductor device 1B (in particular, to the plating layer 23b of the column conductor 23). The plating layer 923b is formed by pattern formation by photolithography and electrolytic plating. In the step of forming the plating layer 923b, a resist layer (omitted from illustration) for forming the plating layer 923b is formed first by photolithography. In the formation of the resist layer, a photosensitive resist is applied so as to cover the overall area of the seed layer 923a, and exposure and development are performed for the photosensitive resist to perform patterning. By this patterning, part of the seed layer 923a (portion at which the plating layer 923b is to be formed) is exposed. Then, by electrolytic plating in which the seed layer 923a is used as a conducive path, a plating layer 923b is formed on the exposed seed layer 923a. Thereafter, the resist layer is removed to form the plating layer 923b depicted in FIG. 40. In this manner, the steps depicted in FIGS. 38 to 40 correspond to a second internal electrode formation step.

Figure 41:
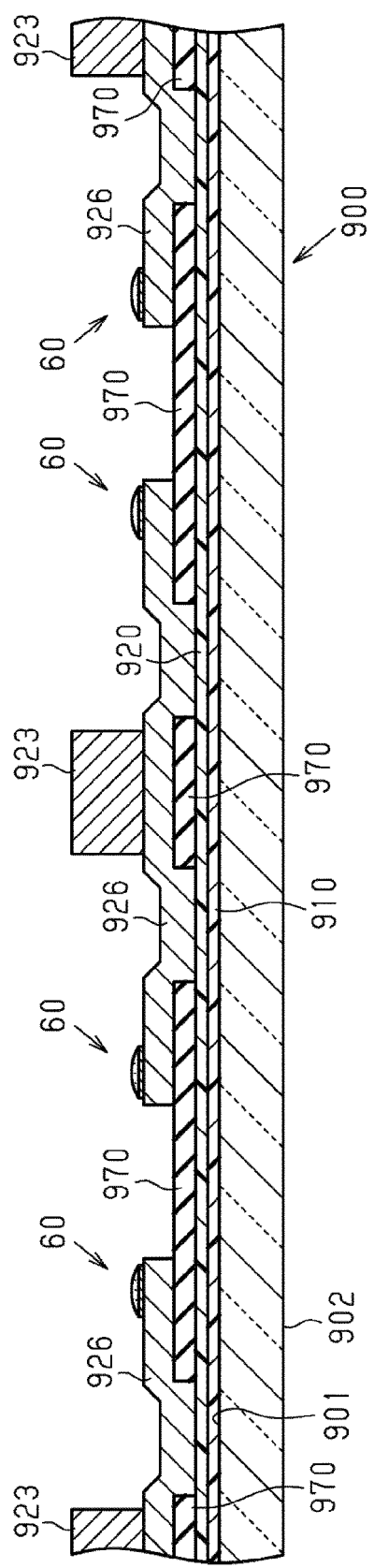
FIG. 41 is a view illustrating an example of a step of the manufacturing process according to the manufacturing method of the semiconductor device.

Then, bonding portions 60 are formed as depicted in FIG. 41. The formation method of the bonding portions 60 of the present embodiment is similar to that of the bonding portions 60 of the first embodiment.

Then, the unnecessary seed layer 923a that is not covered with the plating layer 923b and the bonding portion 60 is removed entirely. The removal of the unnecessary seed layer 923a is performed similarly to the removal of the unnecessary seed layer 926a described hereinabove. In particular, the removal of the unnecessary seed layer 923a is performed, for example, by wet etching in which mixed solution of $H_2SO_4$ and $H_2O_2$ is used. By this, the wiring layer 926, the insulating layer 970, and the sputter film 920 are exposed from the portion from which the seed layer 923a is removed. Further, by the removal of the unnecessary seed layer 923a, column conductors 923 including the seed layer 923a and the plating layer 923b are formed. The column conductors 923 correspond to the column conductors 23 (refer to FIG. 29) of the internal electrode 20 of the semiconductor device 1B.

Figure 42:
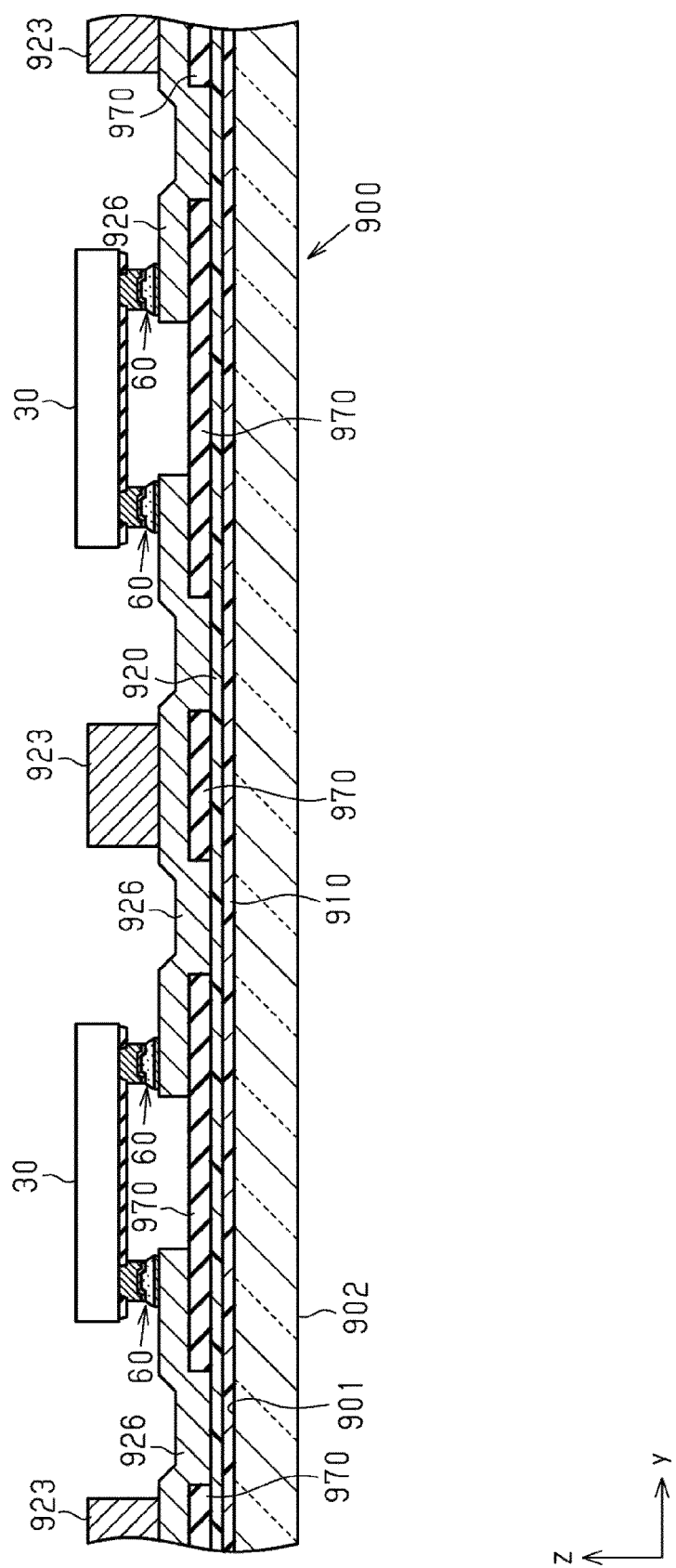
FIG. 42 is a view illustrating an example of a step of the manufacturing process according to the manufacturing method of the semiconductor device.

Then, semiconductor elements 30 are mounted as depicted in FIG. 42. The mounting method of the semiconductor elements 30 in the present embodiment is similar to that of the semiconductor elements 30 of the first embodiment. In this manner, the step depicted in FIG. 42 corresponds to an element mounting step.

Figure 43:
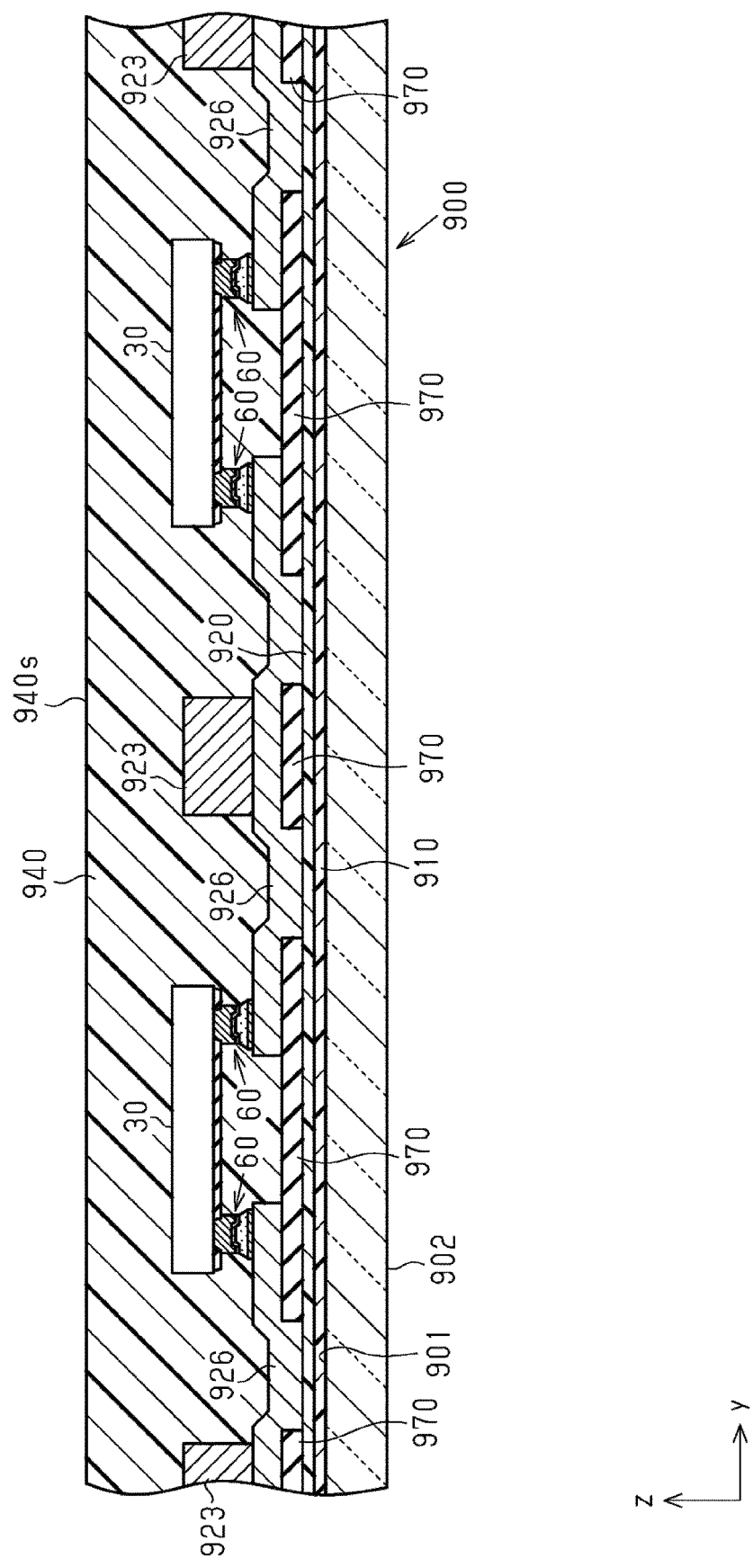
FIG. 43 is a view illustrating an example of a step of the manufacturing process according to the manufacturing method of the semiconductor device.

Then, as depicted in FIG. 43, a resin layer 940 is formed so as to cover the semiconductor elements 30. The resin layer 940 corresponds to the sealing resin 40 (refer to FIG. 31) of the semiconductor device 1B. In the formation method of the resin layer 940 of the present embodiment, a resin layer 940 that collectively seals all semiconductor elements 30 is formed. The resin layer 940 is a synthetic resin containing, for example, epoxy resin as a main ingredient. The resin layer 940 is formed, for example, by transfer molding. In this manner, the step depicted in FIG. 43 corresponds to a resin layer formation step.

Figure 44:
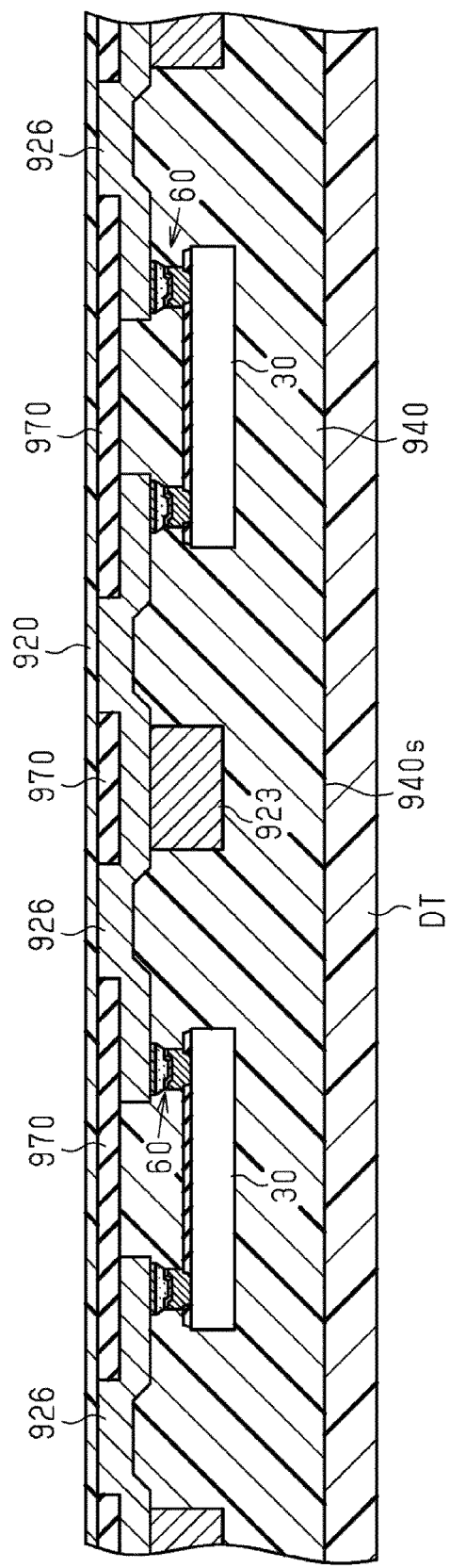
FIG. 44 is a view illustrating an example of a step of the manufacturing process according to the manufacturing method of the semiconductor device.

Then, as depicted in FIG. 44, the support substrate 900 is peeled off from the sputter film 920. In the process of peeling off the support substrate 900, a dicing tape DT is pasted to the resin side face 940s of the resin layer 940 first. Then, a laser beam is applied, for example, from the lower face 902 of the support substrate 900. At this time, the laser beam is applied upon the temporary fixing material 910 through the support substrate 900. Consequently, the adhesive force of the temporary fixing material 910 decreases and the support substrate 900 can be peeled off from the sputter film 920. After the support substrate 900 is peeled off from the sputter film 920, in the case where the temporary fixing material 910 partly remains (for example, remains as soot), the partly remaining temporary fixing material 910 is removed, for example, by plasma. By the processes, the support substrate 900 and the temporary fixing material 910 are removed. It is to be noted that the method of peeling off the support substrate 900 is not limited to the method of laser beam application. For example, air may be blown from a direction orthogonal to the thickness direction z (for example, from the first direction x or the second direction y) to peel off the support substrate 900 and so forth from the sputter film 920, or the support substrate 900 and so forth may be peeled off from the sputter film 920 after heat is applied to soften the temporary fixing material 910. It is to be noted that, in the case of peeling off by laser beam application, it is necessary for the support substrate 900 to be made of a material having suitable translucency in order to allow the laser beam to pass therethrough. On the other hand, in the case of peeling off by air blowing or by heating, it is also possible to use, for example, a Si substrate in place of a glass plate for the support substrate 900.

Figure 45:
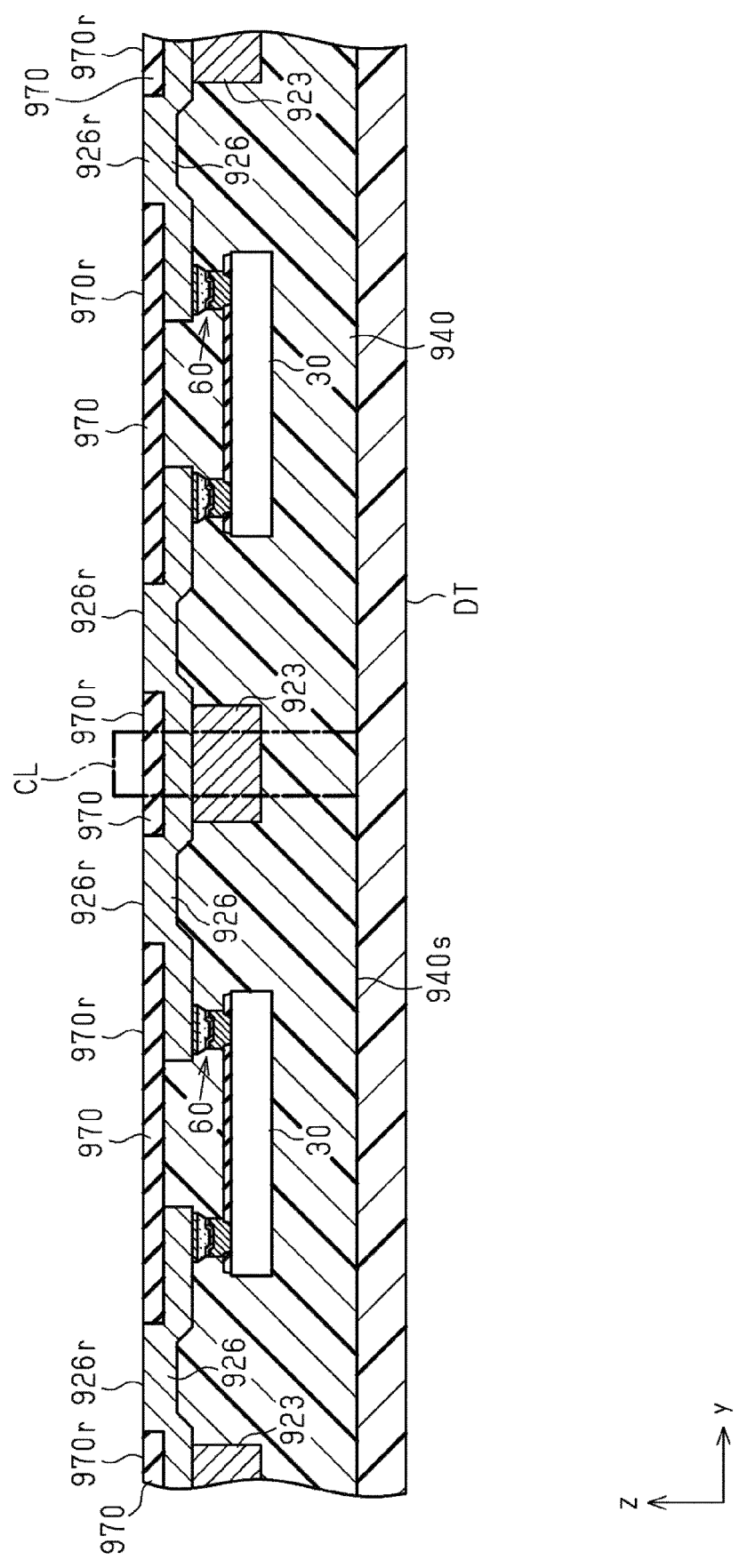
FIG. 45 is a view illustrating an example of a step of the manufacturing process according to the manufacturing method of the semiconductor device.

Then, the sputter film 920 is removed as depicted in FIG. 45. By removing the sputter film 920, a lower face 970r of the insulating layer 970 and a lower face 926r of the wiring layer 926 are exposed.

Figure 46:
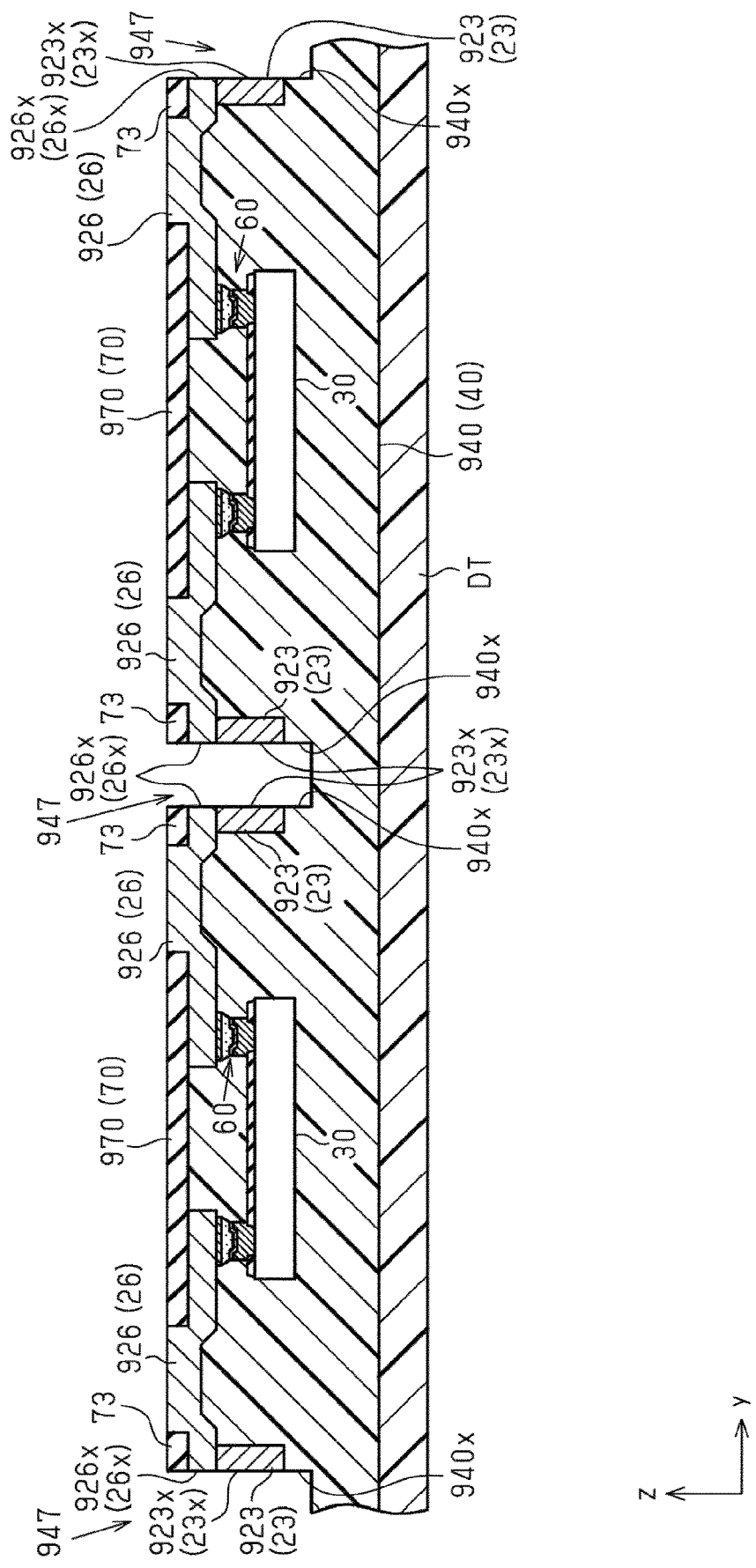
FIG. 46 is a view illustrating an example of a step of the manufacturing process according to the manufacturing method of the semiconductor device.

Thereafter, as depicted in FIG. 46, a dicing tape DT is pasted to the lower face of the resin layer 940, and the insulating layer 970 is cut while part of the resin layer 940 in the thickness direction z is ground (half cut). Upon such cutting of the insulating layer 970 and half cutting of the resin layer 940, for example, a dicing blade is operated to cut in from the insulating layer 970 side toward the dicing tape DT along a cutting line CL (dash-dotted line) depicted in FIG. 45. It is to be noted that, in the cutting line CL depicted in FIG. 45, the width in the short-side direction is the thickness of the dicing blade. By half cutting the resin layer 940 in this manner, separation grooves 947 are formed on the resin layer 940. Further, resin side faces 940x of the resin layer 940 are formed.

As depicted in FIG. 46, by cutting the insulating layer 970 and half cutting the resin layer 940 by the dicing blade, the wiring layer 926 and the column conductors 923 are cut. Consequently, end faces 926x of the wiring layer 926 and exposed side faces 923x of the column conductors 923 are each exposed from resin side faces 940x. As a result, the insulating layer 70 is formed from the insulating layer 970; the wiring layer 26 is formed from the wiring layer 926; and the column conductors 23 are formed from the column conductors 923. More particularly, as the insulating layer 70, four side faces 71 and insulating outer peripheral portions 73 are formed. More particularly, as the wiring layer 26, end faces 26x exposed from the resin side faces 940x of the sealing resin 40 are formed. As the column conductors 23, the exposed side faces 23x exposed from the resin side faces 940x are formed. In this manner, the end faces 26x of the wiring layer 26 and the exposed side faces 23x of the column conductors 23 are each exposed from the separation grooves 947. In this manner, the step depicted in FIG. 46 corresponds to a first cutting step.

Figure 47:
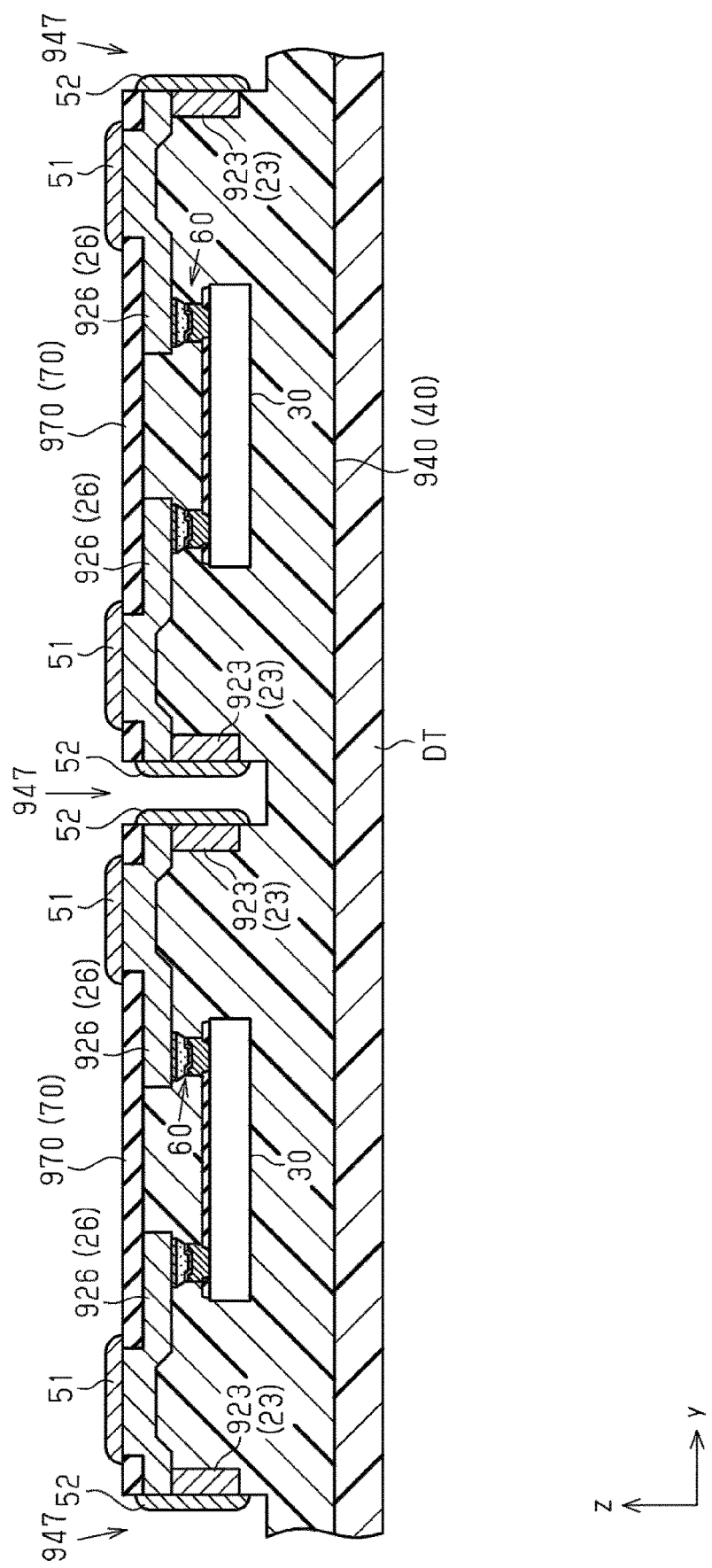
FIG. 47 is a view illustrating an example of a step of the manufacturing process according to the manufacturing method of the semiconductor device.

Then, first external electrodes 51 and second external electrodes 52 are formed as depicted in FIG. 47. The formation of the external electrodes 51 and 52 of the present embodiment is similar to that of the external electrodes 51 and 52 of the first embodiment. In this manner, the step depicted in FIG. 47 corresponds to an external electrode formation step.

Figure 48:
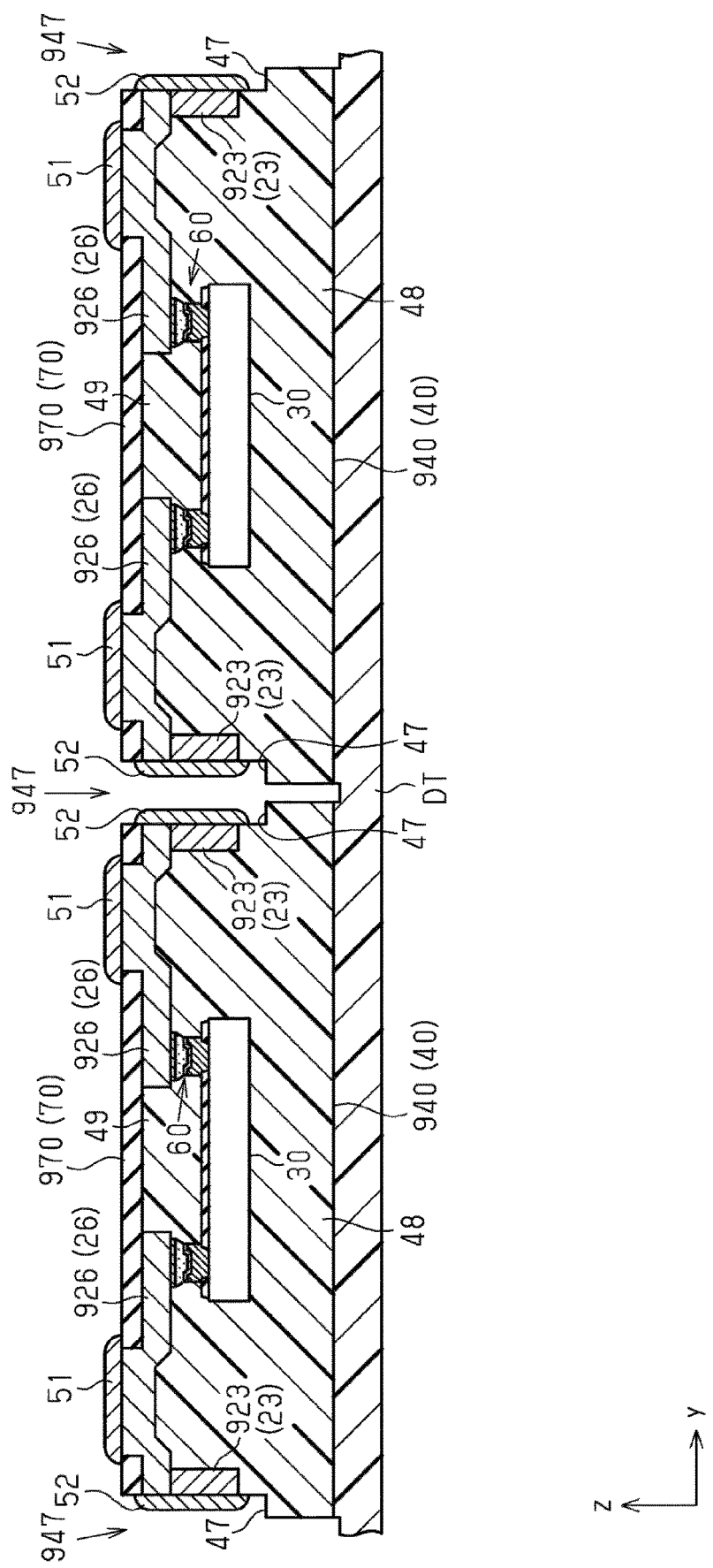
FIG. 48 is a view illustrating an example of a step of the manufacturing process according to the manufacturing method of the semiconductor device.

Then, as depicted in FIG. 48, the resin layer 940 is cut along the first direction x and the second direction y to divide the same into pieces for individual semiconductor elements 30. Upon the division, for example, a dicing blade having a width smaller than that of the dicing blade used for half cutting the resin layer 940 is operated to cut in from the separation groove 947 of the resin layer 940 to the dicing tape DT along a cutting line CL depicted in FIG. 45 and cut the resin layer 940. Accordingly, the resin layer 940 is divided into individual pieces of semiconductor elements 30. As indicated by the cutting line CL of FIG. 45, the dicing tape DT is not fully cut in the thickness direction z (cut a little). Consequently, even if the resin layer 940 is divided into individual pieces of semiconductor elements 30, since the semiconductor elements 30 are connected to each other by the dicing tape DT, they are not separated from each other. By such dividing into individual pieces, the four resin side faces 940x of the resin layer 940 are formed.

In this manner, the resin layer 940 is cut along the cutting line CL by using dicing, to form the sealing resin 40. More particularly, the stepped portion 47 of the sealing resin 40 is formed by the cutting of the resin layer 940. In other words, as the sealing resin 40, conductor cover portions 45, first resin portions 48, and second resin portions 49 are formed. The resin side faces 940x of the resin layer 940 depicted in FIG. 48 correspond to the resin side faces 41 to 44 of the sealing resin 40. In this manner, the step depicted in FIG. 48 corresponds to a second cutting step. Finally, the dicing tape DT is peeled off from the resin layer 940. Through the steps described above, the semiconductor device 1B can be manufactured.

Advantageous Effect

According to the present embodiment, the following advantageous effects are achieved in addition to advantageous effects similar to those of the first embodiment.

(2-1) As the wiring layer 26, the main face wire 21 and the through-wire 22 are formed integrally. According to this configuration, the step of forming the wiring layer 26 can be simplified in comparison with that in an alternative case in which the main face wire 21 and the through-wire 22 are formed separately.

(2-2) Since the through-wire 22 is formed with a thickness equal to that of the main face wire 21, reduction in thickness of the semiconductor device 1B can be realized in comparison with an alternative semiconductor device that has such a configuration that the through-wire 22 is formed from the terminal pillar 822.

[Modifications]

The embodiments described above exemplify forms that can be taken by the semiconductor device and the manufacturing method of the semiconductor device according to an embodiment of the present disclosure, and restriction of the forms is not intended. The semiconductor device and the manufacturing method of the semiconductor device according to an embodiment of the present disclosure can take forms different from the forms exemplified by the embodiments. One example is a form that replaces, changes, or omits part of the configuration of each embodiment or a form to which a new component is added. The modifications described below can be combined with each other unless a technological contradiction occurs. It is to be noted that, although the following modifications are described basically using the first embodiment for the convenience of description, they can be applied also to other embodiments as long as no technical contradiction occurs.

In the first embodiment, the configuration of the main face wire 21 can be changed optionally. As an example, the main face wire 21 may have a stacked structure of such a seed layer 26a and a plating layer 26b as those of the wiring layer 26 of the second embodiment. It is to be noted that the wiring layer 26 of the second embodiment may have a stacked structure of such a metal layer 21a and a conductive layer 21b as those of the main face wire 21 of the first embodiment.

In the second embodiment, the main face wire 21 and the through-wire 22 may be formed individually. In this case, in the manufacturing method of the semiconductor device 1B, a step of forming the main face wire 21 is carried out after the step of forming the through-wire 22 in the first internal electrode formation step.

In the first embodiment, the width dimension of the main face wire 21 (dimension in a direction orthogonal to the direction in which the main face wire 21 extends as viewed from the thickness direction z) and the width dimension of the through-wire 22 (dimension in a direction orthogonal to the direction in which the through-wire 22 extends as viewed from the thickness direction z) can be changed optionally. In an example, the width dimension of the main face wire 21 may be greater than the width dimension of the through-wire 22. In this case, the width dimension of the second external electrode 52 (dimension in a direction orthogonal to the thickness direction z as viewed from a direction perpendicular to the resin side face on which the second external electrode 52 is provided) may be made greater than the width dimension of the first external electrodes 51 (dimension in a direction orthogonal to the direction in which the first external electrodes 51 extends as viewed from the thickness direction z).

In the first embodiment, the material configuring the substrate 10 and the material configuring the sealing resin 40 may be the same as each other. In an example, the substrate 10 and the sealing resin 40 are both made of an epoxy resin.

In the second embodiment, the material configuring the insulating layer 70 and the material configuring the sealing resin 40 may be the same as each other. In an example, the insulating layer 70 and the sealing resin 40 are both made of an epoxy resin.

In the first embodiment, the shape of the lower face 22r of the through-wire 22 exposed from the substrate 10 as viewed from the thickness direction z can be changed optionally. The shape of the lower face 22r of the through-wires 22, which are arrayed spaced from each other in the first direction x, as viewed from the thickness direction z may be a rectangular shape in which the second direction y is the long-side direction and the first direction x is the short-side direction. The shape of the lower face 22r of the through-wires 22, which are arrayed spaced from each other in the second direction y, as viewed from the thickness direction z may be a rectangular shape in which the first direction x is the long-side direction and the second direction y is the short-side direction.

In the second embodiment, the shape of the lower face 28r of the through-wire 28 exposed from the insulating layer 70, as viewed from the thickness direction z, can be changed optionally. The shape of the lower face 28r of the through-wires 28, which are arrayed spaced from each other in the first direction x, as viewed from the thickness direction z may be a rectangular shape in which the second direction y is the long-side direction and the first direction x is the short-side direction. The shape of the lower face 28r of the through-wires 28, which are arrayed spaced from each other in the second direction y, as viewed from the thickness direction z may be a rectangular shape in which the first direction x is the long-side direction and the second direction y is the short-side direction.

In each embodiment, the shape of the first external electrode 51 and the shape of the second external electrode 52 as viewed from the thickness direction z can each be changed optionally. In an example, the shape of the first external electrodes 51, which are arrayed spaced from each other in the first direction x, as viewed from the thickness direction z may be a rectangular shape in which the second direction y is the long-side direction and the first direction x is the short-side direction. Further, the shape of the first external electrodes 51, which are arrayed spaced from each other in the second direction y, as viewed from the thickness direction z may be a rectangular shape in which the first direction x is the long-side direction and the second direction y is the short-side direction. In this case, the length of the first external electrode 51 in the first direction orthogonal to a direction in which the first external electrodes 51 are arrayed may be shorter than the length of the second external electrode 52 in the thickness direction z.

In each embodiment, the end face 21y of the main face wires 21 may not be exposed from the resin side faces 41 to 44. In other words, the end face 21y of the main face wires 21 may be provided in the inside of the sealing resin 40. In this case, the column conductor 23 protrudes from the end face 21y of the main face wire 21 in a direction in which the main face wire 21 extends. Further, the second external electrode 52 covers the overall area of the exposed side face 23x of the column conductor 23. On the other hand, the lower end edge 52x of the second external electrodes 52 may be positioned on the sealing resin 40 side with respect to the substrate main face 10s of the substrate 10 in the thickness direction z.

Figure 49:
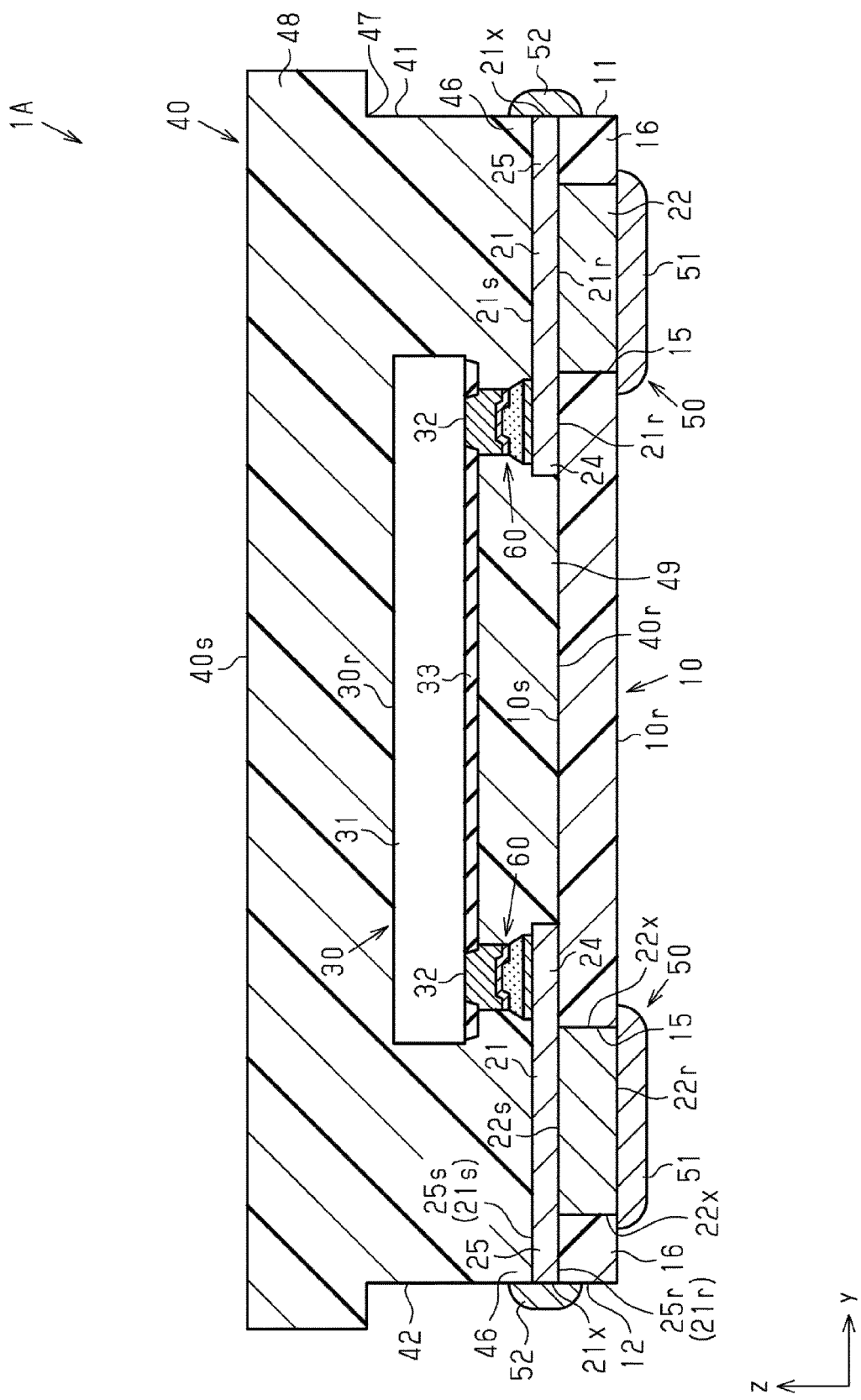
FIG. 49 is a sectional view of a semiconductor device of a modification.

In each of the embodiments, the column conductors 23 may be omitted. In this case, the end face 21y of the main face wires 21 is exposed from the resin side faces 41 to 44 of the sealing resin 40. As an example of such a structure as just described, FIG. 49 depicts a configuration in which the column conductors 23 are omitted from the semiconductor device 1A of the first embodiment. As depicted in FIG. 49, the upper face 25s of the outer side extension 25 of the main face wire 21 (upper face 21s of the main face wire 21) is in contact with the sealing resin 40, and the lower face 25r of the outer side extension 25 (lower face 21r of the main face wire 21) is in contact with the substrate 10. The sealing resin 40 has a wire cover portion 46 that covers the outer side extension 25 of the main face wire 21. In this manner, the main face wire 21 is sandwiched by the sealing resin 40 and the substrate 10. In other words, the main face wire 21 is sandwiched by the wire cover portion 46 of the sealing resin 40 and the substrate outer peripheral portion 16 of the substrate 10. Further, together with the omission of the column conductors 23, the dimension of the second external electrodes 52 in the thickness direction z is made smaller than the dimension of the second external electrodes 52 of each embodiment in the thickness direction z.

According to the configuration described above, since the main face wires 21 exposed from the resin side faces 41 to 44 of the sealing resin 40 are supported by the substrate 10 and the sealing resin 40 in the thickness direction z, when the substrate 10, the sealing resin 40, and the main face wires 21 are cut by dicing, the main face wires 21 can be practically suppressed from being peeled off from the sealing resin 40.

The manufacturing method of the semiconductor device 1A of the modification depicted in FIG. 49 is different from the manufacturing method of the semiconductor device 1A of the first embodiment in the following points. In particular, the step of forming the plating layer 823b of the column conductor 823 is omitted. Therefore, after the seed layer 823a is formed, the bonding portion 60 is formed. Then, any portion of the seed layer 823a other than the portion covered with the bonding portion 60 is removed as the unnecessary seed layer 823a. The step of mounting a semiconductor element 30, the step of forming a resin layer 840, the step for dividing into pieces and so forth after the removal of the unnecessary seed layer 823a are similar to those in the manufacturing method of the semiconductor device 1A of the first embodiment. Further, in the manufacturing method of the semiconductor device 1A of the modification, the steps preceding to the step of forming a seed layer 823a are similar to those of the manufacturing method of the semiconductor device 1A of the first embodiment. In this manner, the manufacturing method of the semiconductor device 1A of the modification includes steps of forming a through-wire 22 (terminal pillar 822), forming a substrate 10 (substrate 810), forming a main face wire 821, mounting a semiconductor element 30 on the main face wire 821, forming a resin layer 840, cutting the substrate 810 and grinding part of the resin layer 840 in a thickness direction z to form a resin side face 840x (resin side faces 41 to 44) of the resin layer 840 and expose an end face 821x of the main face wire 821 from the resin side face 840x, forming a first external electrode 51 and a second external electrode 52, and cutting the resin layer 840.

It is to be noted that the step of forming a through-wire 22 corresponds to the through-wire formation step; the step of forming a substrate 10 corresponds to the insulating member formation step; the step of forming a main face wire 821 corresponds to the main face wire formation step; the step of mounting a semiconductor element 30 corresponds to the semiconductor element mounting step; the step of forming a resin layer 840 corresponds to the resin layer formation step; the step of cutting the substrate 810 and grinding part of the resin layer 840 in a thickness direction z to form a resin side face 840x and expose an end face 821x of the main face wire 821 corresponds to a first cutting step; the step of cutting the resin layer 840 corresponds to the second cutting step; and the step of forming external electrodes 51 and 52 corresponds to the external electrode formation step.

Further, the manufacturing method of the semiconductor device 1B of the modification in which the column conductors 23 in the semiconductor device 1B of the second embodiment are omitted similarly to the semiconductor device 1A of the modification of FIG. 49 and the dimension of the second external electrodes 52 in the thickness direction z is reduced is different in the following point from the manufacturing method of the semiconductor device 1B of the second embodiment. In particular, the step of forming a plating layer 923b of the column conductor 923 is omitted. Therefore, after the seed layer 923a is formed, a bonding portion 60 is formed. Then, a portion of the seed layer 923a other than the portion covered with the bonding portion 60 is removed as the unnecessary seed layer 923a. The step of mounting a semiconductor element 30, the step of forming a resin layer 940, the step for dividing into pieces and so forth after the removal of the unnecessary seed layer 923a are similar to those of the manufacturing method of the semiconductor device 1B of the second embodiment. Further, in the manufacturing method of the semiconductor device 1B of the modification, the steps preceding to the step of forming a seed layer 923a are similar to those of the manufacturing method of the semiconductor device 1B of the second embodiment. In this manner, the manufacturing method of the semiconductor device 1B of the modification includes the steps of forming an insulating layer 970, forming a wiring layer 926 including a through-wire and a main face wire, mounting a semiconductor element 30, forming a resin layer 940, cutting the insulating layer 970 and grinding part of the resin layer 940 in a thickness direction z to form a resin side face 940x (resin side faces 41 to 44) of the resin layer 940 and expose an end face 926x of the wiring layer 926 from the resin side face 940x, forming a first external electrode 51 and a second external electrode 52, and cutting the resin layer 940.

It is to be noted that the step of forming an insulating layer 970 corresponds to the insulating member formation step; the step of forming a wiring layer 926 corresponds to the internal electrode formation step; the step of mounting a semiconductor element 30 corresponds to the element mounting step; the step of forming a resin layer 940 corresponds to the resin layer formation step; the step of cutting the insulating layer 970 and grinding part of the resin layer 940 in a thickness direction z to form a resin side face 940x and expose an end face 926x of the wiring layer 926 corresponds to the first cutting step; the step of cutting the resin layer 940 corresponds to the second cutting step; and the step of forming external electrodes 51 and 52 corresponds to the external electrode formation step.

Third Embodiment

Figure 53:
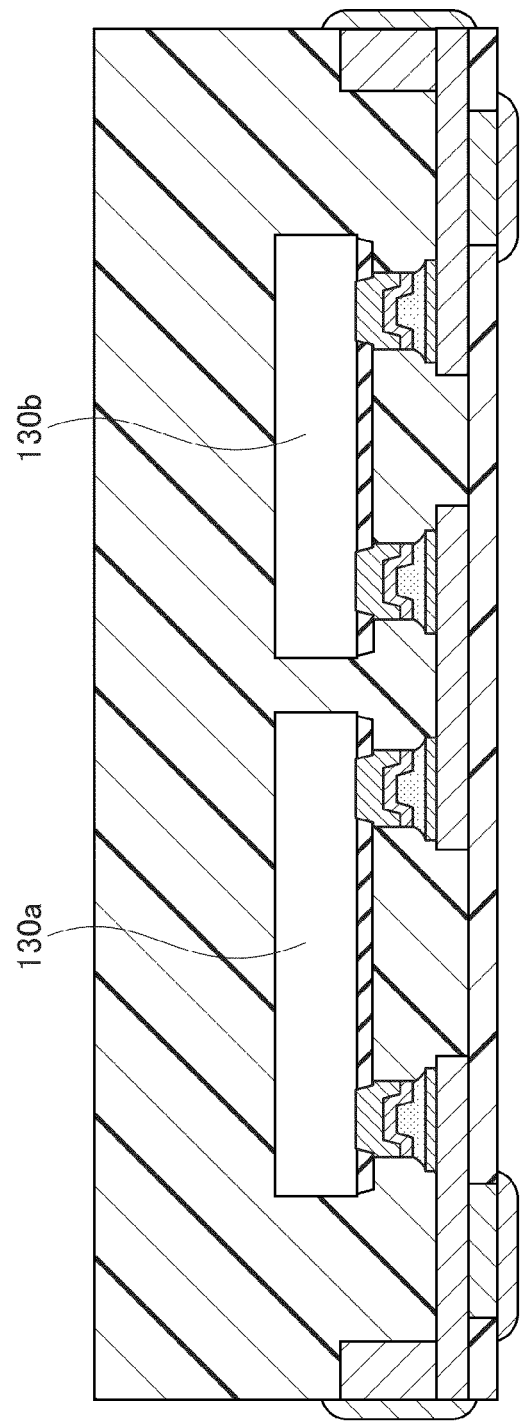
FIG. 53 is a schematic sectional view of a semiconductor device of a third embodiment.

A semiconductor device 1C according to the third embodiment of the present disclosure is described with reference to FIG. 53. The semiconductor device 1C of the present embodiment is different from the semiconductor device 1A of the first embodiment principally in that the semiconductor device 1C includes two semiconductor elements 130a and 130b. Elements similar to those of the semiconductor device 1A of the first embodiment are denoted by the same reference signs, and description of them is suitably omitted.

Fourth Embodiment

Figure 54:
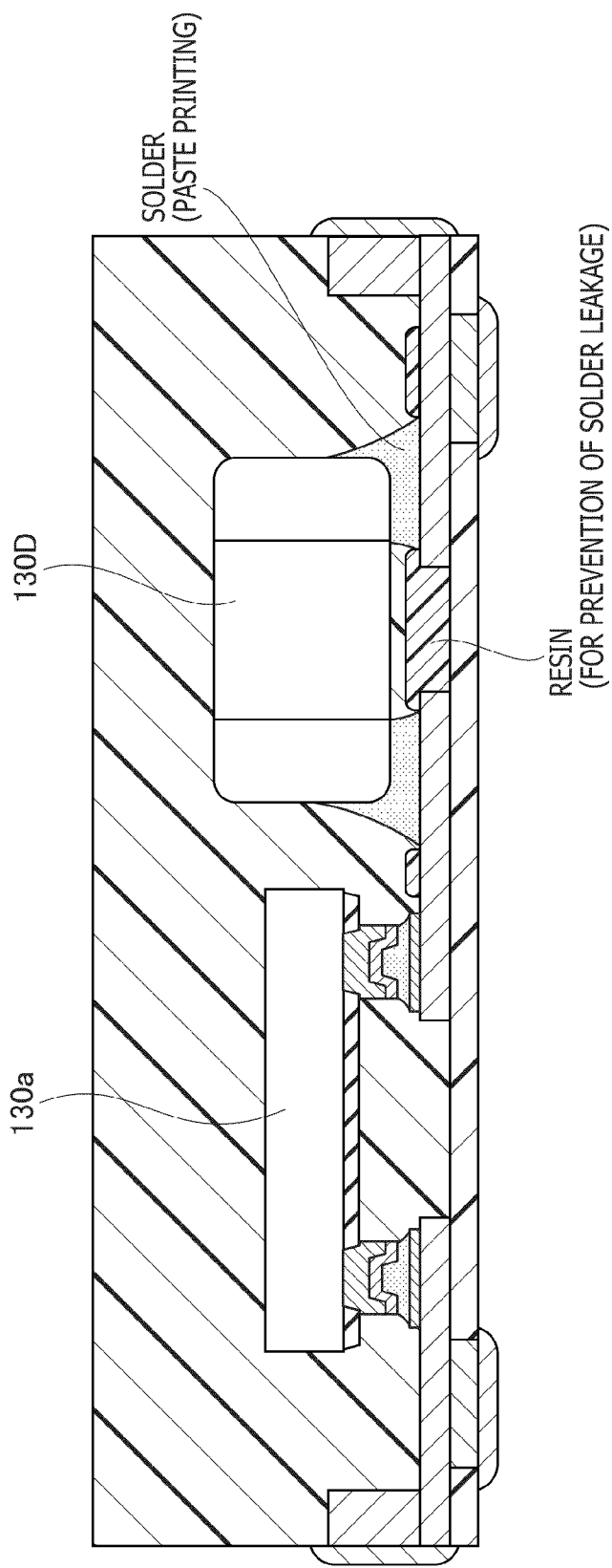
FIG. 54 is a schematic sectional view of a semiconductor device of a fourth embodiment.

A semiconductor device 1C according to the fourth embodiment of the present disclosure is described with reference to FIG. 54. The semiconductor device 1D of the present embodiment is different from the semiconductor device 1A of the first embodiment principally in that the semiconductor device 1C includes semiconductor element 130c and other discrete element 130d. In this embodiment, the discrete element 130d is a resistor. Elements similar to those of the semiconductor device 1A of the first embodiment are denoted by the same reference signs, and description of them is suitably omitted.

Figure 50:
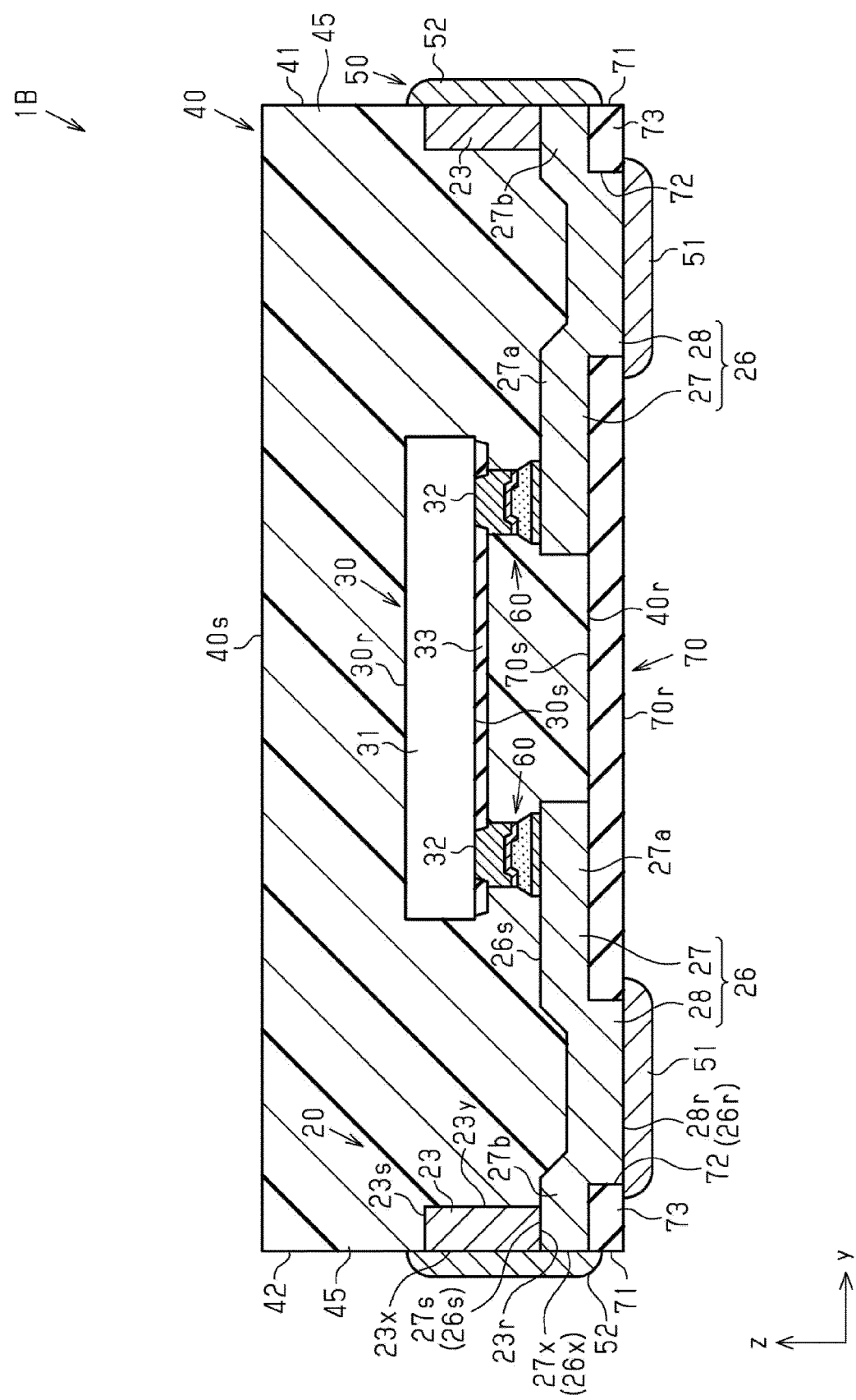
FIG. 50 is a sectional view of the semiconductor device of the modification.
Figure 51:
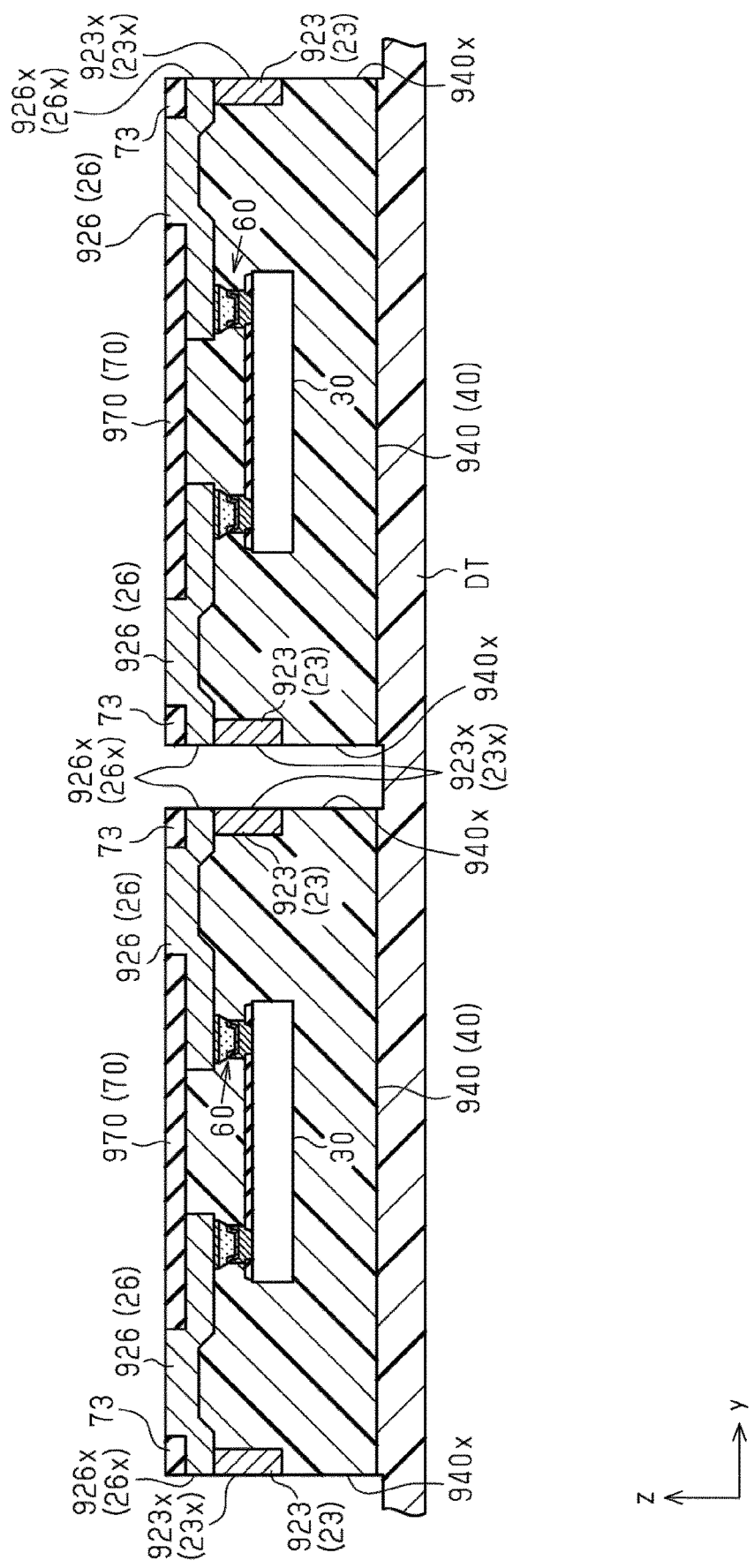
FIG. 51 is a view illustrating an example of a step according to a manufacturing method of the semiconductor device of the modification.
Figure 52:
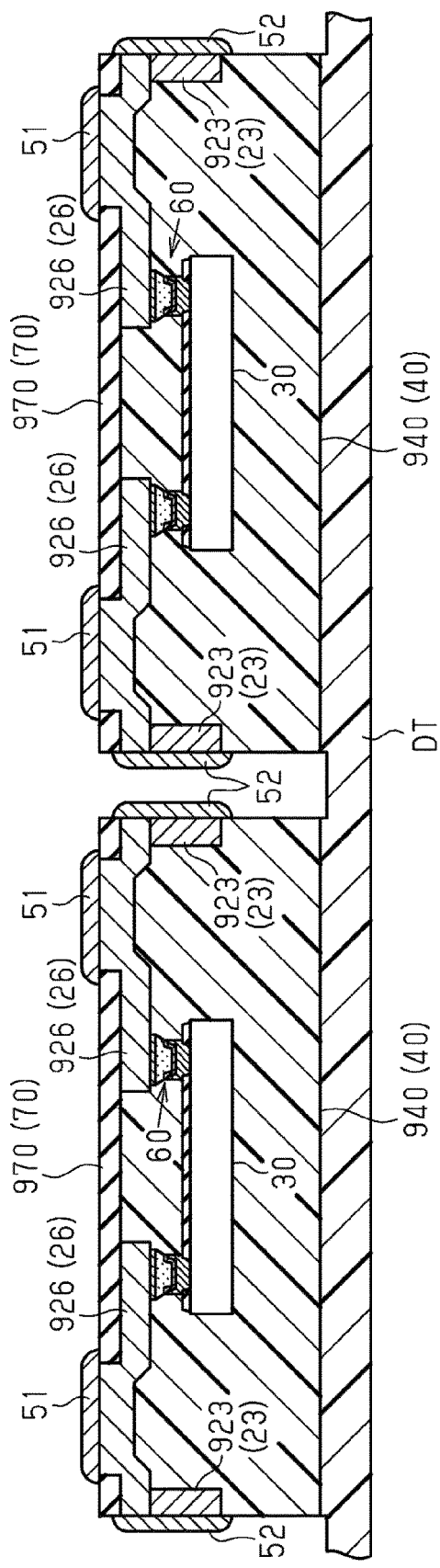
FIG. 52 is a view illustrating an example of a step according to a manufacturing method of the semiconductor device of the modification.

In each embodiment, the shape of the semiconductor device may be changed suitably. For example, in a semiconductor device 1B depicted in FIG. 50, the stepped portion 47 is omitted from the sealing resin 40. In other words, the semiconductor device 1B is configured such that the sealing resin 40 is not partitioned into the first resin portion 48 and the second resin portion 49. In manufacture, the semiconductor device 1B is formed to the state depicted in FIG. 45 similarly to the semiconductor device 1B of the second embodiment. Thereafter, the resin layer 940 is cut as depicted in FIG. 51. Then, a first external electrode 51 and a second external electrode 52 are formed as depicted in FIG. 52. It is to be noted that the stepped portion 47 may be omitted from the semiconductor device 1A of the first embodiment.

In each embodiment, at least one of the first external electrode 51 and the second external electrode 52 may be omitted. In this case, in the manufacturing methods of the semiconductor devices 1A and 1B, at least one of the step of forming a first external electrode 51 and the step of forming a second external electrode 52 is omitted.

Although, in each embodiment, the internal electrode 20 is formed by electrolytic plating, this is not restrictive, and, for example, the main face wire 21 of the internal electrode 20 may be formed by a lead frame, and the column conductor 23 may be formed from a metal column. In this case, the column conductor 23 may be bonded to the upper face 21s of the main face wire 21 by a conductive bonding material or may be bonded to the main face wire 21 by welding such as ultrasonic welding.

In each embodiment, the configuration of the terminals of the semiconductor element 30 can be changed optionally. In an example, an electrode for mounting may be provided on the electrode pad 32. The electrode for mounting is connected to a connection terminal that is an exposed portion of the electrode pad 32. The electrode for mounting includes a metal layer, a conductive layer, and a barrier layer. The metal layer is formed so as to cover the exposed portion of the electrode pad 32 and an end portion of an opening of the insulating film 33 for exposing the electrode pad 32. The metal layer is composed, for example, of Ti/Cu and is formed as a seed layer that covers the conductive layer. The conductive layer is formed so as to cover a lower face of the metal layer. The conductive layer is made of, for example, Cu or a Cu alloy. The barrier layer is formed so as to cover a lower face of the conductive layer. The barrier layer I is formed, for example, from Ni, an alloy containing Ni, or a plurality of metal layers including Ni. For the barrier layer, for example, Ni, Pd, Au, and alloys containing two or more of the metals and so forth can be used. The lower face of the barrier layer is the lower face of the electrode for mounting and is a connection face of the semiconductor element 30.

In each embodiment, although the main face wire 21 and the semiconductor element 30 are electrically connected to each other by flip chip bonding, this is not restrictive, and the main face wire 21 and the semiconductor element 30 may be electrically connected otherwise, for example, by a wire formed by wire bonding.

In each embodiment, each of the semiconductor devices 1A and 1B may include a plurality of semiconductor elements 30. In this case, the plurality of semiconductor elements 30 may be different in type (LSI, IC or the like) from each other.

In each embodiment, each of the semiconductor devices 1A and 1B may include an electronic part other than the semiconductor element 30. This electronic part is sealed by the sealing resin 40. As such an electronic part, a resistor, a capacitor and so forth are available.

It should be understood by those skilled in the art that various modifications, combinations, sub-combinations and alterations may occur depending on design requirements and other factors insofar as they are within the scope of the appended claims or the equivalents thereof.

The semiconductor devices and their manufacturing methods of the present disclosure include implementations according to the following clauses.

[Clause 1]

A semiconductor device comprising:

an insulating member having an electrical insulating property and having an insulating main face and an insulating rear face that are directed to sides opposite to each other in a thickness direction;

a main face wire having a wire main face and a wire rear face that are directed to the sides opposite to each other in the thickness direction, the main face wire being stacked on the insulating main face such that the wire rear face is opposed to the insulating main face;

a semiconductor element that is conductive to the main face wire and arranged on a side opposite to the insulating member with respect to the main face wire in the thickness direction;

a sealing resin having a resin side face directed in a direction crossing the thickness direction, the sealing resin sealing the main face wire and the semiconductor element;

a through-wire that is conductive to the main face wire and extending in the thickness direction from the wire main face, the through-wire having an exposed rear face that is exposed from the insulating rear face; and a column conductor that is conductive to the main face wire and extending to a side opposite to the through-wire in the thickness direction from the wire main face, the column conductor having an exposed side face that is exposed from the resin side face, wherein the column conductor is supported from opposite sides of the column conductor in the thickness direction by the insulating member and the sealing resin.

[Clause 2]

The semiconductor device according to clause 1, wherein the insulating material is formed between the insulating main face and the insulating rear face in the thickness direction and has an insulating side face directed in a direction crossing the insulating main face and the insulating rear face, the through-wire is arranged on an inner side of the insulating side face, the main face wire has a side face side protrusion extending toward the exposed side face side farther than the through-wire, the column conductor is stacked at a portion of the wire main face corresponding to the side face side protrusion, and the column conductor and the side face side protrusion are sandwiched by the sealing resin and the insulating member in the thickness direction.

[Clause 3]

The semiconductor device according to clause 1 or 2, wherein the main face wire has a wire end face that is directed in a direction same as that of the exposed side face and connected to the exposed side face.

[Clause 4]

The semiconductor device according to any one of clauses 1 to 3, further comprising:

a first external electrode exposed from the insulating member and covering the exposed rear face, the first external electrode that is conductive to the through-wire; and a second external electrode exposed from the sealing resin and covering the exposed side face, the second external electrode that is conductive to the column conductor.

[Clause 5]

The semiconductor device according to clause 4, wherein the main face wire has a wire end face directed in a direction same as that of the expose side face and connected to the exposed side face, and the second external electrode covers the wire end face.

[Clause 6]

The semiconductor device according to any one of clauses 1 to 5, wherein the sealing resin has a resin main face and a resin rear face directed to opposite sides in the thickness direction, and a stepped portion depressed to an inner side of the resin side face, the sealing resin is partitioned into a first resin portion that is a portion on the resin main face side with respect to the stepped portion in the thickness direction and a second resin portion that is a portion on the resin rear face side with respect to the stepped portion, and the exposed side face of the column conductor is exposed from a portion of the resin side face corresponding to the second resin portion.

[Clause 7]

The semiconductor device according to clause 6, further comprising:

a first external electrode exposed from the insulating member and covering the exposed rear face, the first external electrode that is conductive to the through-wire; and a second external electrode exposed from the sealing resin and conductive to the main face wire, wherein the second external electrode is provided at the second resin portion.

[Clause 8]

A semiconductor device comprising:

an insulating member having an electrical insulating property and having an insulating main face and an insulating rear face that are directed to sides opposite to each other in a thickness direction;

a main face wire having a wire main face and a wire rear face that are directed to the sides opposite to each other in the thickness direction, the main face wire being stacked on the insulating main face such that the wire rear face is opposed to the insulating main face;

a semiconductor element conductive to the main face wire and arranged on a side opposite of the insulating member with respect to the main face wire in the thickness direction;

a sealing resin having a resin side face directed in a direction crossing the thickness direction, the sealing resin sealing the main face wire and the semiconductor element; and a through-wire conductive to the main face wire and extending in the thickness direction from the wire main face, the through-wire having an exposed rear face that is exposed from the insulating rear face, wherein the main face wire has a side face side protrusion extending to the resin side face side farther than the through-wire, the side face side protrusion having a wire end face exposed from the resin side face, and the main face wire is supported from opposite sides of the main face wire in the thickness direction by the insulating member and the sealing resin.

[Clause 9]

The semiconductor device according to clause 8, further comprising:

a first external electrode exposed from the insulating member and covering the exposed rear face, the first external electrode conductive to the through-wire; and a second external electrode exposed from the sealing resin and conductive to the main face wire.

[Clause 10]

The semiconductor device according to clause 8, wherein
the sealing resin has
a resin main face and a resin rear face directed to opposite sides in the thickness direction; and
a stepped portion depressed to an inner side of the resin side face, the sealing resin is partitioned into a first resin portion that is a portion on the resin main face side with respect to the stepped portion in the thickness direction and a second resin portion that is a portion on the resin rear face side with respect to the stepped portion, and the main face wire is exposed from a portion of the resin side face corresponding to the second resin portion.

[Clause 11]

The semiconductor device according to clause 10, further comprising:

a first external electrode exposed from the insulating member and covering the exposed rear face, the first external electrode conductive to the through-wire; and a second external electrode exposed from the sealing resin and conductive to the main face wire, wherein the second external electrode is provided at the second resin portion.

[Clause 12]

The semiconductor device according to any one of clause 9 or 11, wherein the first external electrode and the second external electrode are arranged spaced from each other.

[Clause 13]

The semiconductor device according to clause 12, wherein the first external electrode and the second external electrode are arranged, as viewed from a direction perpendicular to the resin side face, spaced from each other in the thickness direction in an aligned state in a direction orthogonal to the thickness direction.

[Clause 14]

The semiconductor device according to clause 12 or 13, wherein an end edge of the second external electrode on the insulating rear face side in the thickness direction is positioned on the sealing resin side with respect to the insulating rear face in the thickness direction.

[Clause 15]

The semiconductor device according to any one of clauses 12 to 14, wherein, where a direction orthogonal to a direction in which the first external electrodes are arrayed, as viewed from the thickness direction, is a first direction, an end portion of the first external electrode on the exposed side face side in the first direction is positioned on an inner side than the resin side face on which the exposed side face is formed.

[Clause 16]

The semiconductor device according to any one of clauses 4, 5, and 7, clause 9, or any one of clauses 11 to 15, wherein, where the direction orthogonal to the direction in which the first external electrodes are arrayed, as viewed from the thickness direction, is the first direction, the first external electrode has a length in the first direction greater than that of the second external electrode in the thickness direction.

[Clause 17]

The semiconductor device according to any one of clauses 4, 5, and 7, clause 9, or any one of clauses 11 to 16, wherein the first external electrode has a portion overlapping with the insulating member as viewed from a direction orthogonal to the thickness direction.

[Clause 18]

The semiconductor device according to any one of clauses 1 to 17, wherein the through-wire and the main face wire are provided as wires separate from each other.

[Clause 19]

The semiconductor device according to any one of clauses 1 to 18, wherein the through-wire and the main face wire are formed integrally with each other.

[Clause 20]

The semiconductor device according to any one of clauses 1 to 19, wherein the main face wire includes a plating layer.

[Clause 21]

The semiconductor device according to any one of clauses 1 to 20, wherein the through-wire includes a plating layer.

[Clause 22]

The semiconductor device according to any one of clauses 1 to 7, wherein the column conductor includes a plating layer.

[Clause 23]

The semiconductor device according to any one of clauses 1 to 22, wherein the insulating member is configured from a material same as that configuring the sealing resin.

[Clause 24]

The semiconductor device according to any one of clauses 1 to 23, wherein the insulating member includes a material different from that configuring the sealing resin, and the insulating member includes a polyimide resin.

[Clause 25]

The semiconductor device according to any one of clauses 1 to 24, wherein the semiconductor element is large scale integration.

[Clause 26]

A manufacturing method of a semiconductor device, comprising:

a through-wire formation step of forming a through-wire having a main face and a rear face directed to sides opposite to each other in a thickness direction and side faces provided between the main face and the rear face in the thickness direction and directed to a direction crossing the thickness direction;

an insulating member formation step of forming an insulating member so as to cover all of the side faces of the through-wire and expose the through-wire from both an insulating main face and an insulating rear face of the insulating member that are directed to the sides opposite to each other in the thickness direction;

a main face wire formation step of forming, on the insulating main face, a main face wire so as to have a wire main face and a wire rear face that are directed to the sides opposite to each other in the thickness direction and have the wire rear face conduct with the through-wire;

a conductor formation step of forming a column conductor on the wire main face so as to overlap with the insulating member as viewed from the thickness direction;

an element mounting step of mounting a semiconductor element on the wire main face;

a resin layer formation step of forming a resin layer that covers an overall area of the main face wire, the column electrode, and the semiconductor element; and a cutting step of cutting the resin layer and the column conductor in the thickness direction to form a sealing resin that covers the main face wire, the column conductor, and the semiconductor element and expose the column conductor from a resin side face of the sealing resin.

[Clause 27]

The manufacturing method of a semiconductor device according to clause 26, wherein the conductor formation step forms the column conductor by electrolytic plating.

[Clause 28]

The manufacturing method of a semiconductor device according to clauses 26 or 27, wherein the cutting step includes a first cutting step and a second cutting step, the first cutting step causes a dicing blade to cut in from the insulating member side toward the resin layer to cut the insulating member and grind part of the resin layer in the thickness direction to thereby form a separation groove, and the second cutting step causes the resin layer to be cut from the separation groove to form the sealing resin.

[Clause 29]

The manufacturing method of a semiconductor device according to clause 28, wherein the first cutting step forms an exposed side face that is exposed from the resin side face of the resin layer of the column conductor.

[Clause 30]

The manufacturing method of a semiconductor device according to any one of clauses 26 to 29, further comprising:

an external electrode formation step of forming a first external electrode that covers the through-wire exposed from the insulating rear face and a second external electrode that covers the column conductor exposed from the resin side face.

[Clause 31]

The manufacturing method of a semiconductor device according to clauses 28 or 29, further comprising:

an external electrode formation step of forming a first external electrode that covers the through-wire exposed from the insulating rear face and a second external electrode that covers the column conductor exposed from the resin side face, wherein the external electrode formation step is carried out after the first cutting step but before the second cutting step.

[Clause 32]

A manufacturing method of a semiconductor device, comprising:

a through-wire formation step of forming a through-wire having a main face and a rear face directed to sides opposite to each other in a thickness direction and side faces provided between the main face and the rear face in the thickness direction and directed to a direction crossing the thickness direction;

an insulating member formation step of forming an insulating member so as to cover all of the side faces of the through-wire and expose the through-wire from both an insulating main face and an insulating rear face of the insulating member that are directed to the sides opposite to each other in the thickness direction;

a main face wire formation step of forming, on the insulating main face, a main face wire so as to have a wire main face and a wire rear face that are directed to the sides opposite to each other in the thickness direction and have the wire rear face conduct with the through-wire;

an element mounting step of mounting a semiconductor element on the wire main face;

a resin layer formation step of forming a resin layer that covers an overall area of the main face wire and the semiconductor element; and a cutting step of cutting the resin layer and the main face wire in the thickness direction to form a sealing resin that covers the main face wire and the semiconductor element and expose the main face wire from a resin side face of the sealing resin.

[Clause 33]

The manufacturing method of a semiconductor device according to clause 32, wherein the cutting step includes a first cutting step and a second cutting step, the first cutting step causes a dicing blade to cut in from the insulating member side toward the resin layer to cut the insulating member and grind part of the resin layer in the thickness direction to thereby form a separation groove, and the second cutting step causes the resin layer to be cut from the separation groove to form the sealing resin.

[Clause 34]

The manufacturing method of a semiconductor device according to clause 33, wherein the first cutting step forms an end face of the main face wire exposed from a resin side face of the resin layer.

[Clause 35]

The manufacturing method of a semiconductor device according to any one of clauses 32 to 34, further comprising:

an external electrode formation step of forming a first external electrode that covers the through-wire exposed from the insulating rear face and a second external electrode that covers the main face wire exposed from the resin side face.

[Clause 36]

The manufacturing method of a semiconductor device according to clauses 33 or 34, further comprising:

an external electrode formation step of forming a first external electrode that covers the through-wire exposed from the insulating rear face and a second external electrode that covers the main face wire exposed from the resin side face, wherein the external electrodes formation step is carried out after the first cutting step but before the second cutting step.

[Clause 37]

The manufacturing method of a semiconductor device according to any one of clauses 26 to 36, wherein the through-wire formation step forms the through-wire by electrolytic plating.

[Clause 38]

The manufacturing method of a semiconductor device according to any one of clauses 26 to 37, wherein the main face wire formation step forms the main face wire by electrolytic plating.

[Clause 39]

A manufacturing method of a semiconductor device, comprising:

an insulating member formation step of forming an insulating member having an insulating main face and an insulating rear face that are directed to sides opposite to each other in a thickness direction;

a first internal electrode formation step of forming a through-wire exposed from the insulating rear face and a main face wire having a wire main face and a wire rear face directed to the sides opposite to each other in the thickness direction, the main face wire being stacked on the insulating main face so as to conduct with the through-wire on the wire rear face;

a second internal electrode formation step of forming a column conductor stacked on the wire main face;

an element mounting step of mounting a semiconductor element on the wire main face;

a resin layer formation step of forming a resin layer that covers an overall area of the main face wire, the column conductor, and the semiconductor element; and a cutting step of cutting the resin layer and the column conductor in the thickness direction to form a sealing resin that covers the main face wire, the column conductor, and the semiconductor element and expose the column conductor from a resin side face of the sealing resin.

[Clause 40]

The manufacturing method of a semiconductor device according to clause 39, wherein the first internal electrode formation step forms the through-wire and the main face wire integrally with each other.

[Clause 41]

The manufacturing method of a semiconductor device according to clauses 39 or 40, wherein
the first internal electrode formation step forms the through-wire and the main face wire by electrolytic plating.

[Clause 42]

The manufacturing method of a semiconductor device according to any one of clauses 39 to 41, wherein
the second internal electrode formation step forms the column conductor by electrolytic plating.

[Clause 43]

The manufacturing method of a semiconductor device according to any one of clauses 39 to 42, wherein
the cutting step includes a first cutting step and a second cutting step,
the first cutting step causes a dicing blade to cut in from the insulating member side toward the resin layer to cut the insulating member and grind part of the resin layer in the thickness direction to thereby form a separation groove, and
the second cutting step causes the resin layer to be cut from the separation groove to form the sealing resin.

[Clause 44]

The manufacturing method of a semiconductor device according to clause 43, wherein
the first cutting step forms an exposed side face of the column conductor exposed from a resin side face of the resin layer.

[Clause 45]

The manufacturing method of a semiconductor device according to any one of clauses 39 to 44, further comprising:
an external electrode formation step of forming a first external electrode that covers the through-wire exposed from the insulating rear face and a second external electrode that covers the column conductor exposed from the resin side face.

[Clause 46]

The manufacturing method of a semiconductor device according to clause 43 or 44, further comprising:
an external electrode formation step of forming a first external electrode that covers the through-wire exposed from the insulating rear face and a second external electrode that covers the column conductor exposed from the resin side face, wherein
the external electrode formation step is carried out after the first cutting step but before the second cutting step.

[Clause 47]

A manufacturing method of a semiconductor device, comprising:
an insulating member formation step of forming an insulating member having an insulating main face and an insulating rear face that are directed to sides opposite to each other in a thickness direction;
an internal electrode formation step of forming a through-wire exposed from the insulating rear face and a main face wire having a wire main face and a wire rear face directed to the sides opposite to each other in the thickness direction, the main face wire being stacked on the insulating main face so as to conduct with the through-wire on the wire rear face;
an element mounting step of mounting a semiconductor element on the wire main face;
a resin layer formation step of forming a resin layer that covers an overall area of the main face wire and the semiconductor element; and
a cutting step of cutting the resin layer and the main face wire in the thickness direction to form a sealing resin that covers the main face wire and the semiconductor element and expose the main face wire from a resin side face of the sealing resin.

[Clause 48]

The manufacturing method of a semiconductor device according to clause 47, wherein
the internal electrode formation step forms the through-wire and the main face wire integrally with each other.

[Clause 49]

The manufacturing method of a semiconductor device according to clause 47 or 48, wherein
the internal electrode formation step forms the through-wire and the main face wire by electrolytic plating.

[Clause 50]

The manufacturing method of a semiconductor device according to any one of clauses 47 to 49, wherein
the cutting step includes a first cutting step and a second cutting step,
the first cutting step causes a dicing blade to cut in from the insulating member side toward the resin layer to cut the insulating member and grind part of the resin layer in the thickness direction to thereby form a separation groove, and
the second cutting step causes the resin layer to be cut from the separation groove to form the sealing resin.

[Clause 51]

The manufacturing method of a semiconductor device according to clause 50, wherein
the first cutting step forms an end face of the main face wire exposed from the resin side face of the resin layer.

[Clause 52]

The manufacturing method of a semiconductor device according to any one of clauses 47 to 51, further comprising:
an external electrode formation step of forming a first external electrode that covers the through-wire exposed from the insulating rear face and a second external electrode that covers the main face wire exposed from the resin side face.

[Clause 53]

The manufacturing method of a semiconductor device according to clause 50 or 51, further comprising:
an external electrode formation step of forming a first external electrode that covers the through-wire exposed from the insulating rear face and a second external electrode that covers the main face wire exposed from the resin side face, wherein
the external electrode formation step is carried out after the first cutting step but before the second cutting step.

[Clause 54]

54. The manufacturing method of a semiconductor device according to any one of clauses 30, 31, 35, 36, 45, 46, 52, and 53, wherein
the external electrode formation step forms the first external electrode and the second external electrode by electroless plating.

What is claimed is:

1. A semiconductor device, comprising:
    an insulating member having an electrical insulating property and having an insulating main face and an insulating rear face that are directed to sides opposite to each other in a thickness direction;
    a main face wire having a wire main face and a wire rear face that are directed to the sides opposite to each other in the thickness direction, the main face wire being stacked on the insulating main face such that the wire rear face is opposed to the insulating main face;

a semiconductor element that is conductive to the main face wire and arranged on a side opposite to the insulating member with respect to the main face wire in the thickness direction;

a sealing resin having a resin side face directed in a direction crossing the thickness direction, the sealing resin sealing the main face wire and the semiconductor element;

a through-wire that is conductive to the main face wire and extending in the thickness direction from the wire main face, the through-wire having an exposed rear face that is exposed from the insulating rear face; and a column conductor that is conductive to the main face wire and extending to a side opposite to the through-wire in the thickness direction from the wire main face, the column conductor having an exposed side face that is exposed from the resin side face, wherein the column conductor is supported from opposite sides of the column conductor in the thickness direction by the insulating member and the sealing resin, the sealing resin has a resin main face and a resin rear face directed to opposite sides in the thickness direction, the resin side face is perpendicular to the resin main face and the resin rear face, a stepped portion is depressed to an inner side of the resin side face, the sealing resin is partitioned into a first resin portion that is a portion on a side of the resin main face with respect to the stepped portion in the thickness direction and a second resin portion that is a portion on a side of the resin rear face with respect to the stepped portion, and the exposed side face of the column conductor is exposed from a portion of the resin side face corresponding to the second resin portion.

2. The semiconductor device according to claim 1, wherein the insulating member is formed between the insulating main face and the insulating rear face in the thickness direction and has an insulating side face directed in a direction crossing the insulating main face and the insulating rear face, the through-wire is arranged on an inner side of the insulating side face, the main face wire has a side face side protrusion extending toward a side of the exposed side face farther than the through-wire, the column conductor is stacked at a portion of the wire main face corresponding to the side face side protrusion, and the column conductor and the side face side protrusion are sandwiched by the sealing resin and the insulating member in the thickness direction.

3. The semiconductor device according to claim 1, wherein the main face wire has a wire end face that is directed in a direction same as that of the exposed side face and connected to the exposed side face.

4. The semiconductor device according to claim 1, further comprising:

a first external electrode exposed from the insulating member and covering the exposed rear face, the first external electrode that is conductive to the through-wire; and a second external electrode exposed from the sealing resin and covering the exposed side face, the second external electrode that is conductive to the column conductor.

5. The semiconductor device according to claim 4, wherein the main face wire has a wire end face directed in a direction same as that of the expose side face and connected to the exposed side face, and the second external electrode covers the wire end face.

6. The semiconductor device according to claim 4, wherein the first external electrode and the second external electrode are arranged spaced from each other.

7. The semiconductor device according to claim 6, wherein the first external electrode and the second external electrode are arranged, as viewed from a direction perpendicular to the resin side face, spaced from each other in the thickness direction in an aligned state in a direction orthogonal to the thickness direction.

8. The semiconductor device according to claim 6, wherein an end edge of the second external electrode on a side of the insulating rear face in the thickness direction is positioned on a side of the sealing resin with respect to the insulating rear face in the thickness direction.

9. The semiconductor device according to claim 6, wherein, where a direction orthogonal to a direction in which a plurality of first external electrodes including the first external electrode are arrayed, as viewed from the thickness direction, is a first direction, an end portion of the first external electrode on a side of the exposed side face in the first direction is positioned on an inner side than the resin side face on which the exposed side face is formed.

10. The semiconductor device according to claim 4, wherein, where the direction orthogonal to the direction in which a plurality of first external electrodes including the first external electrode are arrayed, as viewed from the thickness direction, is a first direction, the first external electrode has a length in the first direction greater than that of the second external electrode in the thickness direction.

11. The semiconductor device according to claim 4, wherein the first external electrode has a portion overlapping with the insulating member as viewed from a direction orthogonal to the thickness direction.

12. The semiconductor device according to claim 1, further comprising:

a first external electrode exposed from the insulating member and covering the exposed rear face, the first external electrode that is conductive to the through-wire; and a second external electrode exposed from the sealing resin and conductive to the main face wire, wherein the second external electrode is provided at the second resin portion.

13. The semiconductor device according to claim 1, wherein the through-wire and the main face wire are provided as wires separate from each other.

14. The semiconductor device according to claim 1, wherein the through-wire and the main face wire are formed integrally with each other.

15. The semiconductor device according to claim 1, wherein the main face wire includes a plating layer.

16. A semiconductor device, comprising:

an insulating member having an electrical insulating property and having an insulating main face and an insulating rear face that are directed to sides opposite to each other in a thickness direction;

a main face wire having a wire main face and a wire rear face that are directed to the sides opposite to each other in the thickness direction, the main face wire being stacked on the insulating main face such that the wire rear face is opposed to the insulating main face;

a semiconductor element conductive to the main face wire and arranged on a side opposite to the insulating member with respect to the main face wire in the thickness direction;

a sealing resin having a resin side face directed in a direction crossing the thickness direction, the sealing resin sealing the main face wire and the semiconductor element; and a through-wire conductive to the main face wire and extending in the thickness direction from the wire main face, the through-wire having an exposed rear face that is exposed from the insulating rear face, wherein the main face wire has a side face side protrusion extending to a side of the resin side face farther than the through-wire, the side face side protrusion has a wire end face exposed from the resin side face, and the main face wire is supported from opposite sides of the main face wire in the thickness direction by the insulating member and the sealing resin, the sealing resin has a resin main face and a resin rear face directed to opposite sides in the thickness direction, the resin side face is perpendicular to the resin main face and the resin rear face, a stepped portion is depressed to an inner side of the resin side face, the sealing resin is partitioned into a first resin portion that is a portion on a side of the resin main face with respect to the stepped portion in the thickness direction and a second resin portion that is a portion on a side of the resin rear face with respect to the stepped portion, and the main face wire is exposed from a portion of the resin side face corresponding to the second resin portion.

17. The semiconductor device according to claim 16, further comprising:

a first external electrode exposed from the insulating member and covering the exposed rear face, the first external electrode being conductive to the through-wire; and a second external electrode exposed from the sealing resin and conductive to the main face wire.

18. The semiconductor device according to claim 16, further comprising:

a first external electrode exposed from the insulating member and covering the exposed rear face, the first external electrode being conductive to the through-wire; and a second external electrode exposed from the sealing resin and conductive to the main face wire, wherein the second external electrode is provided at the second resin portion.

* * * * *